(12) United States Patent
Bae et al.

(10) Patent No.: US 10,998,391 B2
(45) Date of Patent: May 4, 2021

(54) DISPLAY APPARATUS WITH A CRACK DETECTION LINE

(71) Applicant: LG Display Co., Ltd., Seoul (KR)

(72) Inventors: Jeong Min Bae, Bucheon-si (KR); JinHwan Kim, Bucheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/168,237

(22) Filed: Oct. 23, 2018

(65) Prior Publication Data

US 2019/0165312 A1  May 30, 2019

(30) Foreign Application Priority Data

Nov. 30, 2017 (KR) .................. 10-2017-0163671

(51) Int. Cl.
| | |
|---|---|
| *H01L 27/32* | (2006.01) |
| *H01L 51/52* | (2006.01) |
| *H01L 51/56* | (2006.01) |
| *H01L 51/50* | (2006.01) |
| *G09G 3/3225* | (2016.01) |

(52) U.S. Cl.
CPC ....... *H01L 27/3258* (2013.01); *G09G 3/3225* (2013.01); *H01L 27/3246* (2013.01); *H01L 27/3276* (2013.01); *H01L 51/5246* (2013.01); *H01L 51/5253* (2013.01); *H01L 51/56* (2013.01); *G09G 2310/0264* (2013.01); *H01L 27/322* (2013.01); *H01L 27/3211* (2013.01); *H01L 51/5056* (2013.01); *H01L 51/5072* (2013.01); *H01L 51/5092* (2013.01)

(58) Field of Classification Search
CPC . H01L 51/5253; H01L 51/5246; H01L 51/56; H01L 27/3246; H01L 27/3276; H01L 51/5056; H01L 51/5072; H01L 51/5092; H01L 27/3211; H01L 27/322; H01L 27/3225; H01L 27/3258; G09G 3/3225; G09G 2310/0264; G09G 2300/0426; G09G 3/20
See application file for complete search history.

(56) References Cited

U.S. PATENT DOCUMENTS

2016/0307971 A1* 10/2016 Jeon ................ H01L 51/5246
2018/0124933 A1*  5/2018 Park ................... H01L 27/32

* cited by examiner

*Primary Examiner* — Laura M Menz
*Assistant Examiner* — Candice Chan
(74) *Attorney, Agent, or Firm* — Birch, Stewart, Kolasch & Birch LLP

(57) ABSTRACT

A display apparatus includes a substrate including a display area where a plurality of pixels are provided and a non-display area surrounding the display area, an encapsulation layer including an inorganic layer and an organic layer and covering the display area, a dam disposed in the non-display area to surround the display area and to block a flow of the organic layer, a pad disposed in one edge of the non-display area and spaced apart from the dam in the non-display area, an auxiliary buffer layer spaced apart from the dam and disposed in the non-display area to overlap an end of the inorganic layer, a power auxiliary line disposed between the dam and the auxiliary buffer layer and electrically connected to the pad to receive a voltage from the pad, and a crack detection line spaced apart from the power auxiliary line and electrically connected to the pad.

14 Claims, 32 Drawing Sheets

DISPLAY APPARATUS WITH A CRACK DETECTION LINE

CROSS-REFERENCE TO RELATED APPLICATIONS

This application claims the priority benefit of the Korean Patent Application No. 10-2017-0163671 filed on Nov. 30, 2017 in the Republic of Korea, which is hereby incorporated by reference for all purposes as if fully set forth herein.

BACKGROUND

Field of the Invention

The present disclosure relates to a display apparatus.

Discussion of the Related Art

With the advancement of information-oriented society, various requirements for display apparatuses for displaying an image are increasing. Therefore, various display apparatuses such as liquid crystal display (LCD) apparatuses, organic light emitting display apparatuses, quantum dot light emitting display apparatuses, and electroluminescence display apparatuses are being used recently.

As a type of display apparatus, organic light emitting display apparatuses and quantum dot light emitting display apparatuses are self-emitting display apparatuses and are better in viewing angle and contrast ratio than LCD apparatuses. Also, since the organic light emitting display apparatuses do not need a separate backlight, it is possible to lighten and thin the organic light emitting display apparatuses, and the organic light emitting display apparatuses are excellent in power consumption. Furthermore, the organic light emitting display apparatuses are driven with a low direct current (DC) voltage, have a fast response time, and are low in manufacturing cost.

Organic light emitting display apparatuses each include a plurality of pixels each including an organic light emitting device and a bank which divides the pixels for defining the pixels. The bank can act as a pixel defining layer. The organic light emitting device includes an anode electrode, a hole transporting layer, an organic light emitting layer, an electron transporting layer, and a cathode electrode. When a high-level voltage is applied to the anode electrode and a low-level voltage is applied to the cathode electrode, a hole and an electron respectively move to the organic light emitting layer through the hole transporting layer and the electron transporting layer and are combined with each other in the organic light emitting layer to emit light.

However, light emitting devices are easily deteriorated by external factors such as external moisture and oxygen. In order to prevent the deterioration, organic light emitting display apparatuses each include an encapsulation layer for preventing external moisture or oxygen from penetrating into the light emitting devices.

Quantum dot light emitting display apparatuses each include a light emitting structure. The light emitting structure includes an anode electrode, a cathode electrode facing the anode electrode, and a light emitting device disposed between the anode electrode and the cathode electrode. The light emitting device includes a hole transporting layer, a light emitting layer, and an electron transporting layer. The light emitting layer includes a quantum dot material.

FIG. 1 is a diagram illustrating a mother substrate on which a plurality of display panels are provided according to a related art. FIG. 2 is a cross-sectional view taken along line I-I' illustrated in FIG. 1 and is a cross-sectional view schematically illustrating a display apparatus. FIG. 3 is a cross-sectional view for describing a method of forming an inorganic layer of a display apparatus according to a related art.

Referring to FIGS. 1 to 3, a mother substrate MS is a substrate for simultaneously manufacturing a plurality of display panels PNL, for convenience of a process. The display panels PNL are individually separated from one another and each act as a display apparatus. A plurality of mother substrates MS are simultaneously formed, and then, are separated from one another through a cutting process or a scribing process.

In the display apparatus, an encapsulation layer 30 is formed on a substrate 10 on which an organic light emitting device 20 is provided. In this case, the encapsulation layer 30 includes a first inorganic layer 30a, an organic layer 30b, and a second inorganic layer 30c and prevents oxygen or water from penetrating into a light emitting layer.

The first inorganic layer 30a and the second inorganic layer 30c are deposited on the substrate 10 through a chemical vapor deposition (CVD) process. The CVD process, as illustrated in FIG. 3, disposes a mask 40 on the substrate 10 and supplies a gas, including a chemical element constituting the first inorganic layer 30a or the second inorganic layer 30c, to the substrate 10. The supplied gas performs a chemical reaction on a surface, disposed in an area where the mask 40 is not provided, of the substrate 10. Therefore, the first inorganic layer 30a or the second inorganic layer 30c is formed on the surface, disposed in the area where the mask 40 is not provided, of the substrate 10.

However, in the CVD process, since the mask 40 is spaced apart from the substrate 10 by a certain interval, the gas penetrates into a space between the mask 40 and the substrate 10 and performs a chemical reaction on a surface, disposed in an area where the mask 40 is provided, of the substrate 10, and for this reason, the first inorganic layer 30a or the second inorganic layer 30c can be formed on the surface, disposed in the area where the mask 40 is provided, of the substrate 10.

As described above, if the first inorganic layer 30a or the second inorganic layer 30c is formed on the surface (for example, a scribing line SL), disposed in the area where the mask 40 is provided, of the substrate 10, a crack can occur in the first inorganic layer 30a or the second inorganic layer 30c when performing a cutting process (i.e., a laser cutting process or a mechanical scribing process) of separating the display panels PNL. The crack can be propagated to the inside along an inorganic layer due to an external impact, and water and oxygen which flow in along the propagated crack cause a black spot and a dark line smear.

In order to overcome a limitation where a step coverage of the CVD process is low, technology for depositing the first inorganic layer 30a and the second inorganic layer 30b on the substrate 10 through an atomic layer deposition (ALD) process is attracting much attention recently. The ALD process is a method which disposes the mask 40 on the substrate 10 and forms a thin layer by alternating a raw material including an ALD metal and a reactant gas. The ALD process is better in adsorbing force than the CVD process, is high in step coverage, and adjusts a thickness of a thin layer. Accordingly, the ALD process is easy to form a very thin layer.

However, since the ALD process has an excellent absorbing force as described above, the first inorganic layer 30a or the second inorganic layer 30c can be long formed up to the inside of a region, where the mask 40 is disposed, of the substrate 10, and for this reason, in comparison with the CVD process, the ALD process has a high possibility that the first inorganic layer 30a or the second inorganic layer 30c is formed up to the scribing line SL.

In order to solve the above-described problem, it can be considered to develop a method which disposes the mask 40 at a position close to the light emitting device 20 to reduce a separation distance to the substrate 10 and prevents the first inorganic layer 30a or the second inorganic layer 30c from penetrating into a region where the mask 40 is disposed. However, the method has a problem where the organic light emitting device 20 is damaged or deformed by disposing the mask 40, causing a black spot.

Moreover, a plurality of metal lines are disposed on the substrate 10, and for example, metal lines disposed in a non-display area are covered by a thin passivation layer in the CVD process. When a high voltage is instantaneously applied in the CVD process, the passivation layer for protecting the metal lines is torn by the high voltage, and static electricity occurs between the metal lines disposed in the non-display area and the mask 40. Due to the static electricity, the metal lines are damaged which causes the display panel not to normally operate, and it is unable to reuse the mask 40.

Moreover, if a crack occurs in an outer region of the display panel of the display apparatus according to the related art, power applied to the display panel is short-circuited or cut off, and due to this, a screen is abnormally displayed, or a driving power is not normally supplied.

SUMMARY

Accordingly, the present disclosure is directed to provide a display apparatus that substantially obviates one or more problems due to limitations and disadvantages of the related art.

An aspect of the present disclosure is directed to provide a display apparatus which detects a crack occurring in an outer region of a display panel to decrease an error rate.

Another aspect of the present disclosure is directed to provide a display apparatus in which an organic layer is provided to overlap a crack detection line provided in an outer region of a display panel, thereby reducing the damage of the crack detection line caused by static electricity which occurs in a process of depositing an encapsulation layer.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided a display apparatus including a substrate including a display area where a plurality of pixels are provided and a non-display area surrounding the display area, an encapsulation layer including an inorganic layer and an organic layer and covering the display area, a dam disposed in the non-display area to surround the display area and to block a flow of the organic layer, a pad disposed in one edge of the non-display area and spaced apart from the dam in the non-display area, an auxiliary buffer layer spaced apart from the dam and disposed in the non-display area to overlap an end of the inorganic layer, a power auxiliary line disposed between the dam and the auxiliary buffer layer and electrically connected to the pad to receive a voltage from the pad, and a crack detection line spaced apart from the power auxiliary line and electrically connected to the pad.

In another aspect of the present disclosure, there is provided a display apparatus including a substrate including a display area where a plurality of pixels are provided and a non-display area adjacent to the display area, a pad disposed in one edge of the non-display area, a dam disposed in the non-display area to surround the display area and disposed between the display area and the pad in the non-display area where the pad is disposed, an auxiliary buffer layer disposed in the non-display area and spaced apart from the dam, a power auxiliary line disposed between the display area and the auxiliary buffer layer and electrically connected to the pad, and a crack detection line provided to overlap a bottom of the auxiliary buffer layer and electrically connected to the pad.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
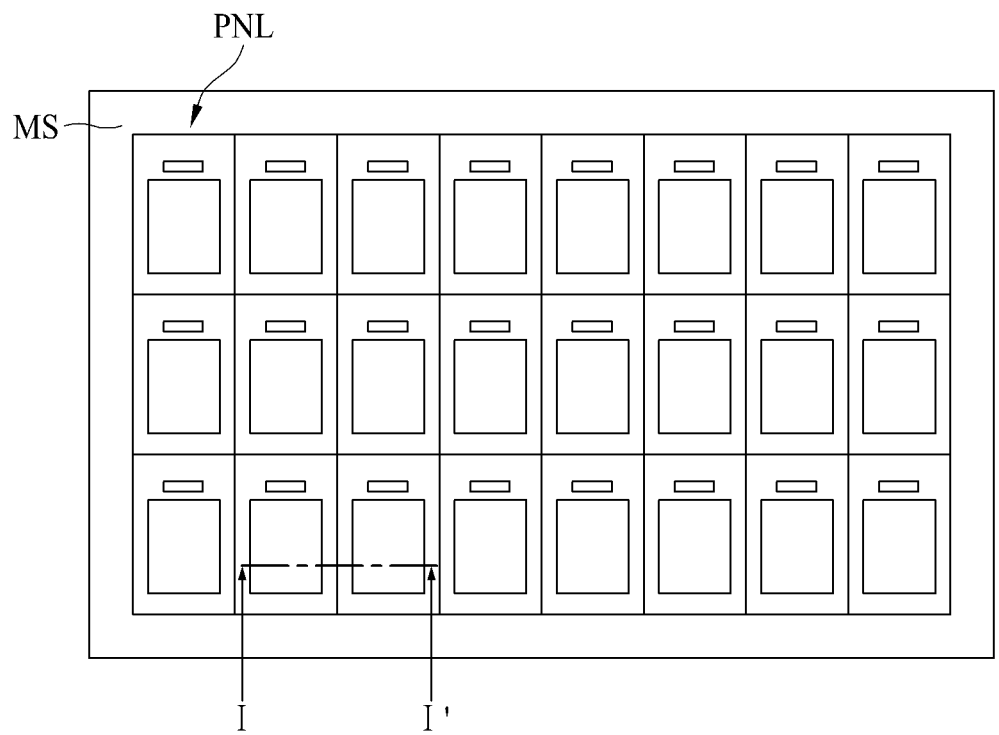
FIG. 1 is a diagram illustrating a mother substrate on which a plurality of display panels are provided according to a related art.
Figure 2:
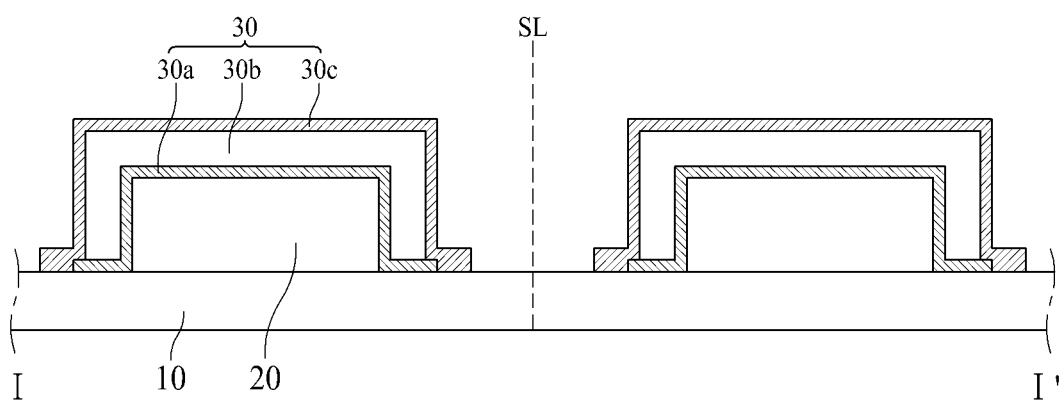
FIG. 2 is a cross-sectional view taken along line I-I' illustrated in FIG. 1.
Figure 3:
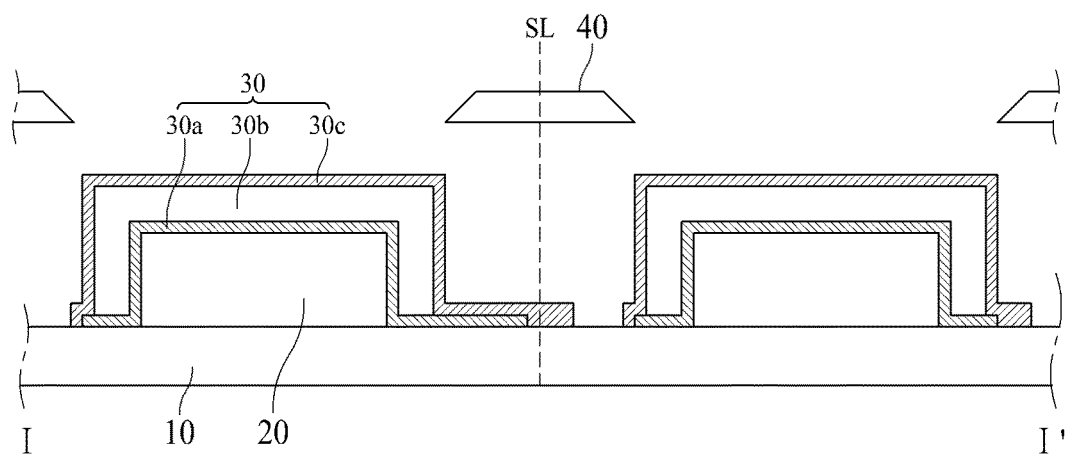
FIG. 3 is a cross-sectional view for describing a method of forming an inorganic layer of a display apparatus according to a related art.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part can be added unless 'only~' is used. The terms of a singular form can include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts can be disposed between the two parts unless 'just' or 'direct' is used.

In describing a time relationship, for example, when the temporal order is described as 'after~', 'subsequent~', 'next~', and 'before~', a case which is not continuous can be included unless 'just' or 'direct' is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is vertical, and can denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, exemplary embodiments of the present disclosure will be described in detail with reference to the accompanying drawings.

Figure 4:
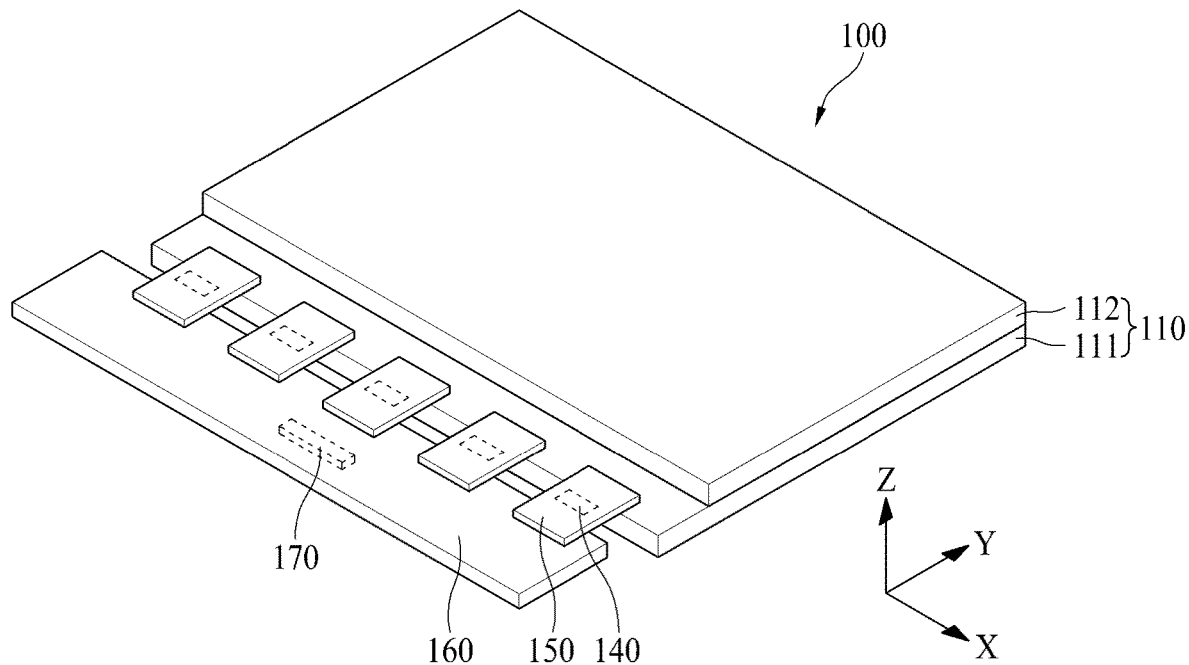
FIG. 4 is a perspective view illustrating a display apparatus according to an embodiment of the present disclosure.
Figure 5:
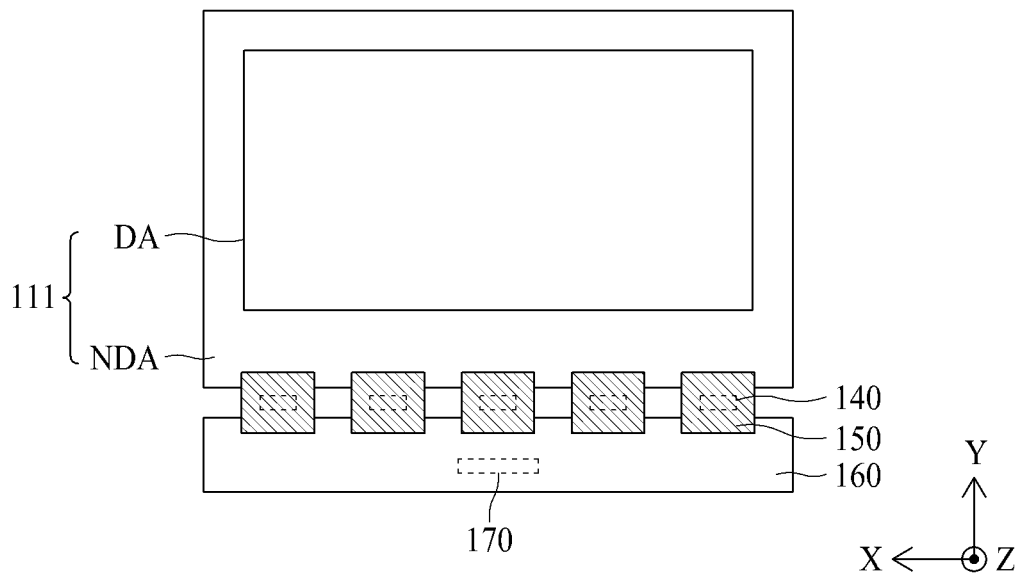
FIG. 5 is a plan view illustrating a first substrate, a source drive integrated circuit (IC), a flexible film, a circuit board, and a timing controller illustrated in FIG. 4.

FIG. 4 is a perspective view illustrating a display apparatus 100 according to an embodiment of the present disclosure. FIG. 5 is a plan view illustrating a first substrate, a source drive integrated circuit (IC), a flexible film, a circuit board, and a timing controller illustrated in FIG. 4. Hereinafter, an example where the display apparatus 100 according to an embodiment of the present disclosure is an organic light emitting display apparatus will be mainly described, but the present disclosure is not limited thereto. For example, the display apparatus according to an embodiment of the present disclosure can be implemented as a liquid crystal display (LCD) apparatus, an electroluminescence display apparatus, a quantum dot lighting emitting diode, and an electrophoresis display apparatus, in addition to an organic light emitting display apparatus. All the components of the display apparatus according to all embodiments of the present disclosure are operatively coupled and configured.

Referring to FIGS. 4 and 5, the display apparatus 100 according to an embodiment of the present disclosure can include a display panel 110, a source drive IC 140, a flexible film 150, a circuit board 160, and a timing controller 170.

The display panel 110 can include a first substrate 111 and a second substrate 112. The second substrate 112 can be an encapsulation substrate. The first substrate 111 can be a plastic film or a glass substrate, but is not limited thereto. The second substrate 112 can be a plastic film, a glass substrate, or an encapsulation film, but is not limited thereto.

A plurality of gate lines, a plurality of data lines, and a plurality of pixels can be provided on one surface of the first substrate 111 facing the second substrate 112. The plurality of pixels can be respectively provided in a plurality of areas defined by an intersection structure of the gate lines and the data lines.

Each of the pixels can include a thin film transistor (TFT) and a light emitting device including a first electrode, a light emitting layer, and a second electrode. When a gate signal is input through a corresponding gate line by using the TFT, each of the pixels can supply a current to the light emitting device with a data voltage of a corresponding data line. Therefore, the light emitting device of each pixel can emit light having certain brightness, based on the current. A structure of each pixel will be described below with reference to FIGS. 6 and 7.

The display panel 110, as in FIG. 5, can be divided into a display area DA where the pixels are provided to display an image and a non-display area NDA which does not display an image. The gate lines, the data lines, and the pixels can be provided in the display area DA. A gate driver and a plurality of pads can be provided in the non-display area NDA.

The gate driver can supply gate signals to the gate lines according to a gate control signal input from the timing controller 170. The gate driver can be provided as a gate driver in panel (GIP) type in the non-display area NDA outside one side or both sides of the display area DA of the display panel 110. Alternatively, the gate driver can be manufactured as a driving chip, mounted on the flexible film, and attached on the non-display area NDA outside the one side or both sides of the display area DA of the display panel 110 in a tape automated bonding (TAB) type.

The source driver IC 140 can receive digital video data and a source control signal from the timing controller 170. The source drive IC 140 can convert the digital video data into analog data voltages according to the source control signal and can supply the analog data voltages to the data lines. When the source drive IC 140 is manufactured as a driving chip, the source drive IC 140 can be mounted on the flexible film 150 in a chip on film (COF) type or a chip on plastic (COP) type.

The plurality of pads such as data pads can be provided in the non-display area NDA of the display panel 110. A plurality of lines for connecting the pads to the source drive IC 140 and a plurality of lines for connecting the pads to lines of the circuit board 160 can be provided on the flexible film 150. The flexible film 150 can be attached on the pads by using an anisotropic conductive film, and thus, the pads can be connected to the lines of the circuit board 330.

The circuit board 160 can be attached on the flexible film 150 which is provided in plurality. A plurality of circuits implemented as driving chips can be mounted on the circuit board 160. For example, the timing controller 170 can be mounted on the circuit board 160. The circuit board 160 can be a printed circuit board (PCB) or a flexible PCB (FPCB).

The timing controller 170 can receive digital video data and a timing signal from an external system through a cable of the circuit board 160. The timing controller 170 can generate the gate control signal for controlling an operation timing of the gate driver and the source control signal for controlling the source drive IC 140 which is provided in plurality, based on the timing signal. The timing controller 170 can supply the gate control signal to the gate driver and can supply the source control signal to the source drive ICs 140.

First Embodiment

Figure 6:
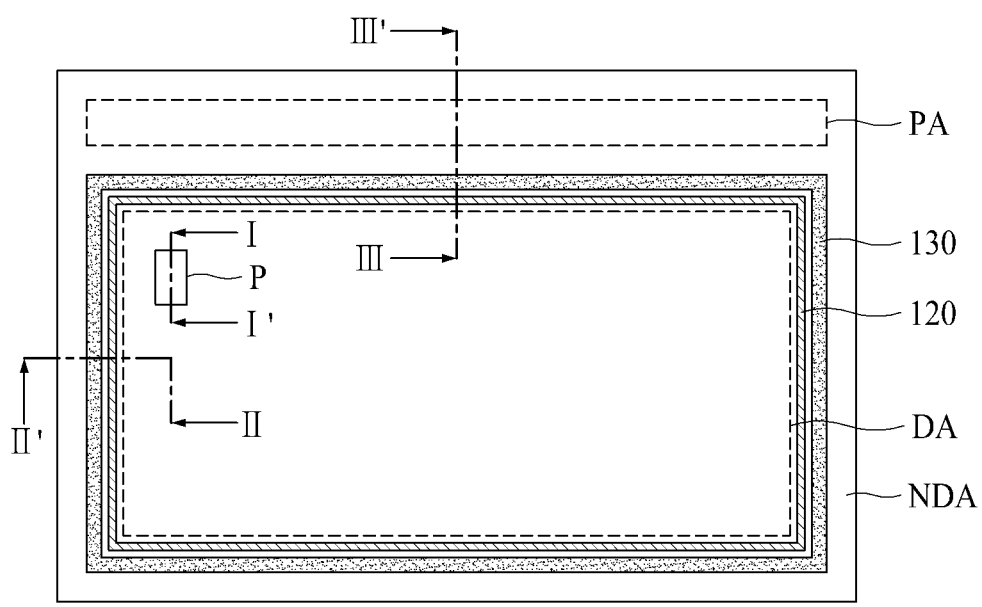
FIG. 6 is a plan view illustrating a first substrate of a display apparatus according to a first embodiment of the present disclosure.

FIG. 6 is a plan view illustrating an example of the first substrate 111 according to a first embodiment of the present disclosure.

Referring to FIG. 6, the first substrate 111 can be divided into a display area DA and a non-display area NDA. A pad area PA where a plurality of pads are provided, a dam 120, and a buffer layer 130 can be provided in the non-display area NDA.

A plurality of pixels P for displaying an image can be provided in the display area DA. Each of the pixels P can include a TFT and a light emitting device including a first electrode, a light emitting layer, and a second electrode. When a gate signal is input through a corresponding gate line by using the TFT, each of the pixels P can supply a current to the light emitting device with a data voltage of a corresponding data line. Therefore, the light emitting device of each pixel P can emit light having certain brightness, based on the current.

Hereinafter, a structure of a pixel P in a display area DA according to embodiments of the present disclosure will be described in detail with reference to FIG. 7.

Figure 7:
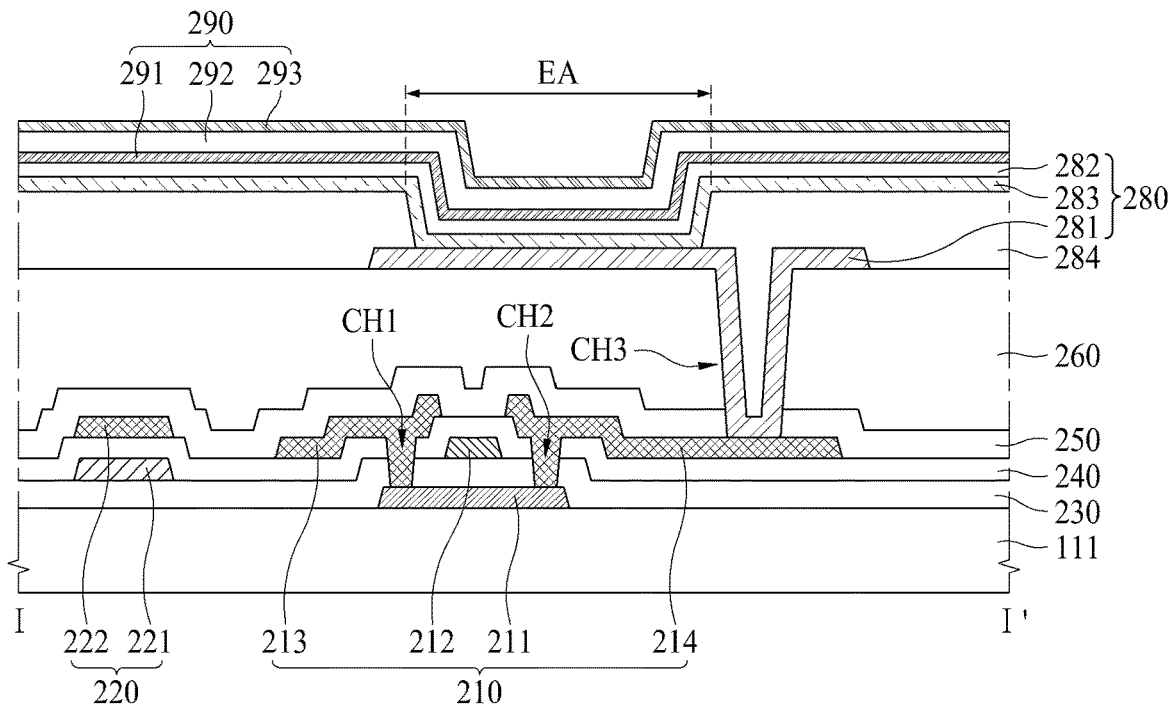
FIG. 7 is a cross-sectional view taken along line I-I' of FIG. 6.

FIG. 7 is a cross-sectional view taken along line I-I' of FIG. 6 and is a cross-sectional view illustrating an example of a pixel P in a display area.

Referring to FIG. 7, a plurality of TFTs 210 and a plurality of capacitors 220 can be provided on one surface of the first substrate 111 facing the second substrate 112.

A buffer layer can be provided on the first substrate 111, for protecting the TFTs 210 from water penetrating through the first substrate 111 vulnerable to penetration of water.

The TFTs 210 can each include an active layer 211, a gate electrode 212, a source electrode 213, and a drain electrode 214. In FIG. 7, the TFTs 210 are exemplarily illustrated as being provided as a top gate type where the gate electrode 212 is disposed on the active layer 211, but is not limited thereto. That is, the TFTs 210 can be provided as a bottom gate type where the gate electrode 212 is disposed under the active layer 211 or a double gate type where the gate electrode 212 is disposed both on and under the active layer 211.

The active layer 211 can be provided on the buffer layer of the first substrate 111. The active layer 211 can be formed of a silicon-based semiconductor material, an oxide-based semiconductor material, and/or the like. A light blocking layer for blocking external light incident on the active layer 211 can be provided on the first substrate 111.

A gate insulation layer 230 can be provided on the active layer 211. The gate insulation layer 230 can be formed of an inorganic layer, and for example, can be formed of silicon oxide (SiOx), silicon nitride (SiNx), or a multilayer thereof. However, the present embodiment is not limited thereto.

The gate electrode 212 can be provided on the gate insulation layer 230. The gate electrode 212 can be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof, but is not limited thereto.

An interlayer insulation layer 240 can be provided on the gate electrode 212. The interlayer insulation layer 240 can be formed of an inorganic layer, and for example, can be formed of SiOx, SiNx, or a multilayer thereof. However, the present embodiment is not limited thereto.

The source electrode 213 and the drain electrode 214 can be provided on the interlayer insulation layer 240. The source electrode 213 can be connected to the active layer 211 through a contact hole CH1 which passes through the gate insulation layer 220 and the interlayer insulation layer 230, and the drain electrode 214 can be connected to the active layer 211 through a contact hole CH2 which passes through the gate insulation layer 220 and the interlayer insulation layer 230. The source electrode 213 and the drain electrode 214 can each be formed of a single layer or a multilayer which includes one of Mo, Al, Cr, Au, Ti, Ni, Nd, and Cu, or an alloy thereof, but are not limited thereto.

The capacitors 220 can each include a bottom electrode 221 and a top electrode 222. The bottom electrode 221 can be provided on the gate insulation layer 230 and can be formed of the same material as that of the gate electrode 212. The top electrode 222 can be provided on the interlayer insulation layer 240 and can be formed of the same material as that of each of the source electrode 223 and the drain electrode 224.

A passivation layer 250 can be provided on the TFTs 210 and the capacitors 220. The passivation layer 250 can act as an insulation layer. The passivation layer 250 can be formed of an inorganic layer, and for example, can be formed of SiOx, SiNx, or a multilayer thereof. However, the present embodiment is not limited thereto.

A planarization layer 260 for planarizing a step height caused by the TFTs 210 and the capacitors 220 can be provided on the passivation layer 250. The planarization layer 260 can be formed of an organic layer such as acryl resin, epoxy resin, phenolic resin, polyamide resin, or polyimide resin, but is not limited thereto.

A light emitting device 280 and a bank 284 can be provided on the planarization layer 260. The light emitting device 280 can include a first electrode 282, a light emitting layer 283, and a second electrode 281. The first electrode 282 can be a cathode electrode, and the second electrode 281 can be an anode electrode. An area where the first electrode 282, the light emitting layer 283, and the second electrode 281 are stacked can be defined as an emissive area EA.

The second electrode 281 can be provided on the planarization layer 260. The second electrode 281 can be connected to the drain electrode 214 of a corresponding TFT 210 through a contact hole CH3 which passes through the passivation layer 250 and the planarization layer 260. The second electrode 281 can be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy can be an alloy of silver (Ag), palladium (Pd), and copper (Cu).

The bank 284 can be provided on the planarization layer 260 to cover an edge of the second electrode 281, for dividing a plurality of emissive areas EA. The bank 284 can be formed of an organic layer such as acryl resin, epoxy resin, phenolic resin, polyamide resin, or polyimide resin, but is not limited thereto.

The light emitting layer 283 can be provided on the second electrode 281 and the bank 284. The light emitting layer 283 can include a hole transporting layer, at least one light emitting layer, and an electron transporting layer. In this case, when a voltage is applied to the second electrode 281 and the first electrode 282, a hole and an electron can move to the light emitting layer through the hole transporting layer and the electron transporting layer and can be combined with each other in the light emitting layer to emit light.

The light emitting layer 283 can be a white light emitting layer which emits white light. In this case, the light emitting layer 283 can be provided to cover the second electrode 281 and the bank 284. In this case, a color filter can be provided on the second substrate 112.

Moreover, the light emitting layer 283 can include a red light emitting layer which emits red light, a green light emitting layer which emits green light, or a blue light emitting layer which emits blue light. In this case, the light emitting layer 283 can be provided in an area corresponding to the second electrode 281, and the color filter can not be provided on the second substrate 112.

The first electrode 282 can be provided on the light emitting layer 283. When an organic light emitting display apparatus is implemented in a top emission structure, the first electrode 282 can be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. A capping layer can be provided on the first electrode 282.

An encapsulation layer 290 can be provided on the light emitting device 280. The encapsulation layer 290 prevents oxygen or water from penetrating into the light emitting layer 283 and the first electrode 282. To this end, the encapsulation layer 290 can include at least one inorganic layer and at least one organic layer.

For example, the encapsulation layer 290 can include a first inorganic layer 291, an organic layer 292, and a second inorganic layer 293. In this case, the first inorganic layer 291 can be provided to cover the first electrode 282. The organic layer 292 can be provided on the first inorganic layer 291. The organic layer 292 can be provided to have a sufficient thickness, for preventing particles from penetrating into the light emitting layer 283 and the first electrode 282 via the first inorganic layer 291. The second inorganic layer 293 can be provided to cover the organic layer 292.

First to third color filters and a black matrix can be provided on the encapsulation layer 290. The first color filter which is a red color filter 323 can be provided in a red light emitting part, the second color filter which is a blue color filter 322 can be provided in a blue light emitting part, and the third color filter which is a green color filter 321 can be provided in a green light emitting part.

The encapsulation layer 290 of the first substrate 111 can be bonded to the color filters of the second substrate 112 by an adhesive layer, and thus, the first substrate 111 can be bonded to the second substrate 112. The adhesive layer can be a transparent adhesive resin, but is not limited thereto.

To provide description with reference to FIG. 6, a pad area PA can be disposed in one edge of the first substrate 111. The pad area PA can include a plurality of pads, and the plurality of pads can be electrically connected to wirings of the flexible film 150 by an anisotropic conductive film.

A dam 120 can be disposed to surround the display area DA and can block a flow of the organic layer 292. Also, the dam 120 can be disposed between the display area DA and the pad area PA and can block a flow of the organic layer 292 so that the organic layer 292 configuring the encapsulation layer 290 of a pixel P does not penetrate into the pad area PA.

The buffer layer 130 can be spaced apart from the display area DA in the non-display area NDA and can contact the first inorganic layer 291 or the second inorganic layer 293 configuring the encapsulation layer 290 of the pixel P.

Hereinafter, a dam and a buffer layer according to the first embodiment of the present disclosure will be described in detail with reference to FIGS. 8 to 10.

Figure 8:
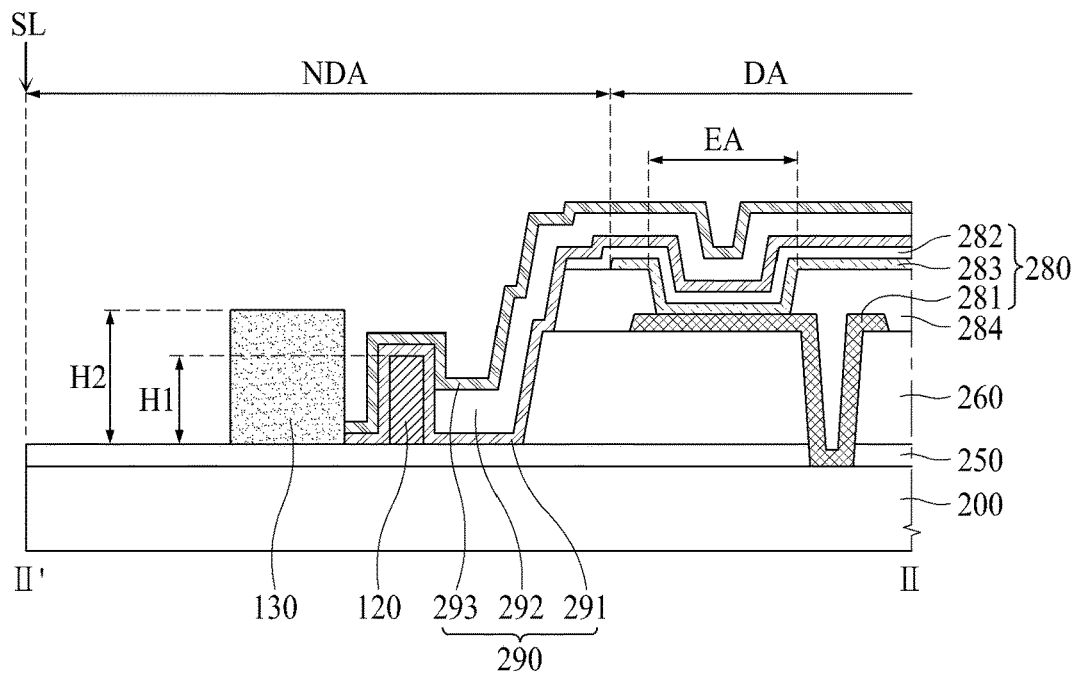
FIG. 8 is a cross-sectional view taken along line II-II' of FIG. 6.
Figure 9:
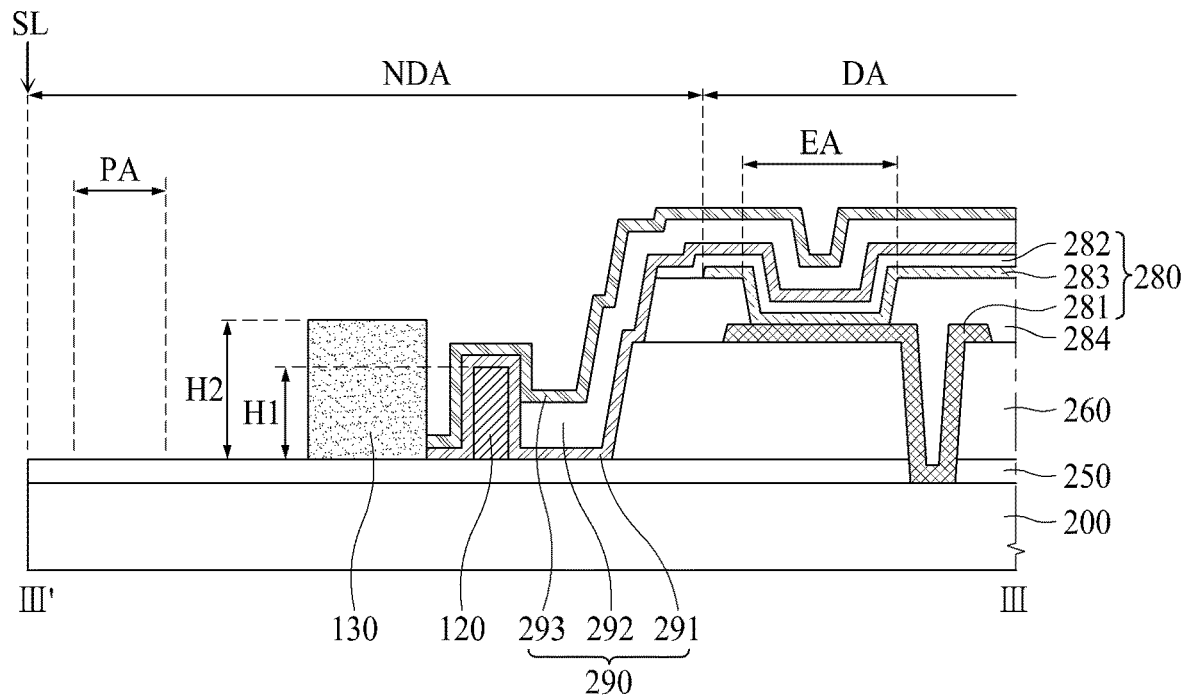
FIG. 9 is a cross-sectional view taken along line III-III' of FIG. 6.

FIG. 8 is a cross-sectional view taken along line II-II' of FIG. 6, and FIG. 9 is a cross-sectional view taken along line III-III' of FIG. 6. FIG. 10 is a cross-sectional view illustrating an example where a mask is disposed on a buffer layer of FIG. 8.

Figure 10:
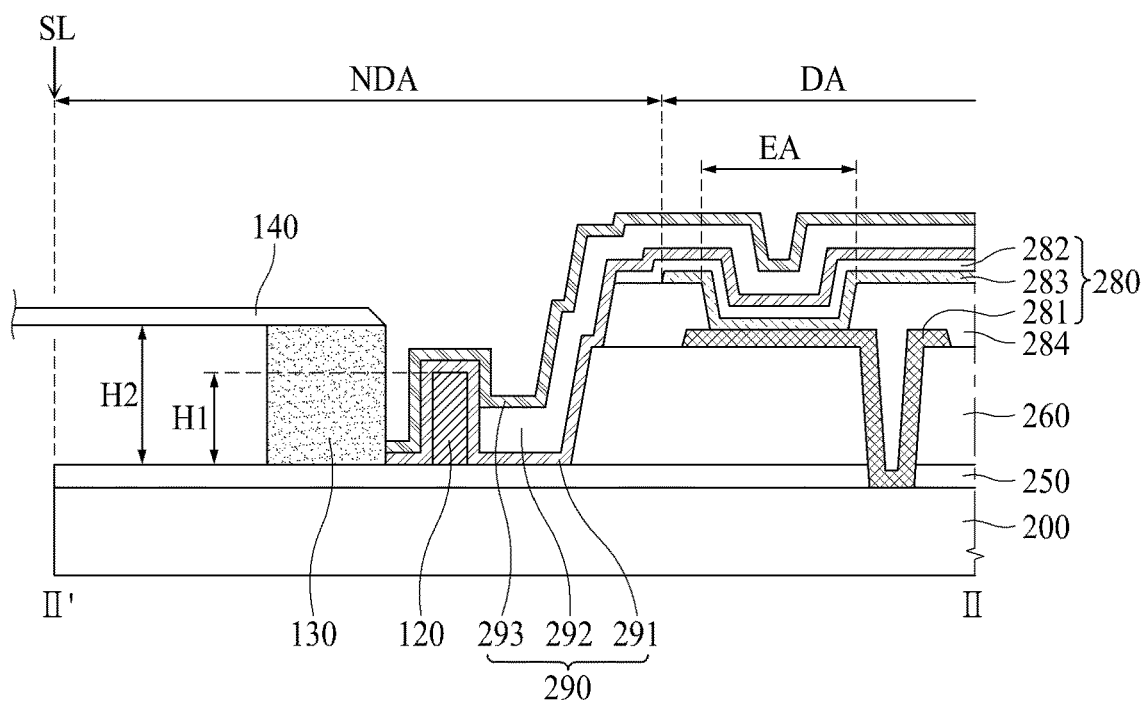
FIG. 10 is a cross-sectional view illustrating an example where a mask is disposed on a buffer layer of FIG. 8.

In FIGS. 8 to 10, for convenience of description, a detailed configuration of each of TFTs 210 and capacitors 220 are omitted, and a TFT substrate 200 including the TFTs 210 and the capacitors 220 is illustrated. The TFT substrate 200 can include a first substrate 111, a gate insulation layer 230, and an interlayer insulation layer 240 illustrated in FIG. 8.

A display apparatus illustrated in FIG. 8 can include an encapsulation layer 290, a dam 120, and a buffer layer 130, which are provided on the TFT substrate 200. Also, the TFT substrate 200 including the first substrate 111 can include a display area DA where a plurality of pixels P are provided and a pad area PA where a plurality of pads are provided.

The encapsulation layer 290 can be provided to cover the light emitting device 280 provided in the display area DA and can prevent oxygen or water from penetrating into the light emitting device 280. The encapsulation layer 290 can include at least one inorganic layer and at least one organic layer. For example, the encapsulation layer 290 can include a first inorganic layer 291, an organic layer 292, and a second inorganic layer 293. In this case, the first inorganic layer 291 can be provided to cover a first electrode 282, the organic layer 292 can be provided on the first inorganic layer 291, and the second inorganic layer 293 can be provided to cover the organic layer 292.

The first and second inorganic layers 291 and 293 can each be formed of silicon nitride, aluminum nitride, zirconium nitride, titanium nitride, hafnium nitride, tantalum nitride, silicon oxide, aluminum oxide, or titanium oxide, but are not limited thereto. The first and second inorganic layers 291 and 293 can be deposited through a chemical vapor deposition (CVD) process or an atomic layer deposition (ALD) process, but are not limited thereto.

The organic layer 292 can be formed of a transparent material, for transmitting light emitted from the light emitting layer 283. The organic layer 292 can be formed of an organic material (for example, acryl resin, epoxy resin, phenolic resin, polyamide resin, or polyimide resin) capable of transmitting 99% or more of the light emitted from the light emitting layer 283. The organic layer 292 can be formed through a vapor deposition process, a printing process, or a slit coating process, which uses an organic material, but is not limited thereto. In other embodiments, the organic layer 292 can be formed through an ink-jet process.

The dam 120 can be provided to surround an outer portion of the display area DA and can block a flow of the organic layer 292 configuring the encapsulation layer 290. The organic layer 292 configuring the encapsulation layer 290 is good in coverage performance, but is low in barrier performance. Therefore, the organic layer 292 can be encapsulated by the second inorganic layer 293. Also, if the organic layer 292 flows into a region where the organic layer 292 is to be formed, water or oxygen penetrates into the inside through the organic layer 292 which is exposed without being encapsulated by the second inorganic layer 293. In order to solve such a problem, the dam 120 can block a flow of the organic layer 292, thereby preventing the organic layer 292 from being exposed at the outside of the display apparatus.

Moreover, the dam 120 can be disposed between the display area DA and the pad area PA and can block a flow of the organic layer 292 so that the organic layer 292 configuring the encapsulation layer 290 does not flow into the pad area PA. When the organic layer 292 configuring the encapsulation layer 290 penetrates into the pad area PA, an electrical contact is not normally made in a pad due to the organic layer 292, and for this reason, a driving error or a lighting test error occurs. In order to solve such a problem, the dam 120 can block a flow of the organic layer 292 configuring the encapsulation layer 290, thereby preventing the organic layer 292 from penetrating into the pad area PA.

In FIGS. 8 to 10, one dam 120 is illustrated, but the present embodiment is not limited thereto. In other embodiments, the dam 120 can include a first dam and a second dam which is disposed in a non-display area and is spaced apart from the first dam. The second dam can block a flow of the organic layer 292 flowing out to an outer portion of the first dam. Also, the dam 120 can be provided as one or more.

Moreover, the dam 120 can be formed at the same time with at least one of a planarization layer 260 and a bank 284 which are provided in a pixel P, and can be formed of the same material as that of at least one of the planarization layer 260 and the bank 284. In this case, the dam 120 can be formed of an organic material such as acryl resin, epoxy resin, phenolic resin, polyamide resin, or polyimide resin, but is not limited thereto.

The buffer layer 130 can be spaced apart from the display area DA in a non-display area NDA and can contact at least one of the first inorganic layer 291 and the second inorganic layer 293. Referring to FIG. 10, for example, the buffer layer 130 can be provided between the dam 120 and a scribing line SL, in the non-display area NDA and can support a mask 140 so as to maintain a certain distance between the mask 140 and the TFT substrate 200 when performing a process of depositing the first inorganic layer 291 or the second inorganic layer 293. To this end, the mask 140 can be disposed on the buffer layer 130 to contact the buffer layer 130.

When the first inorganic layer 291 or the second inorganic layer 293 is deposited after the mask 140 is disposed on the buffer layer 130, the first inorganic layer 291 or the second inorganic layer 293 can be provided in a region other than a region where the mask 140 is disposed. Also, since a space is not formed between the mask 140 and the TFT substrate 200 by the buffer layer 130, the first inorganic layer 291 or the second inorganic layer 293 is prevented from penetrating into the region where the mask 140 is disposed. Therefore, in the present embodiment, since the buffer layer 130 is disposed between the dam 120 and the scribing line SL and the mask 140 is disposed on the buffer layer 130 to contact the buffer layer 130, the first inorganic layer 291 or the second inorganic layer 293 is prevented from being formed in an outer portion (for example, the scribing line SL) of the buffer layer 130.

Moreover, the buffer layer 130 can be provided between the dam 120 and the pad area PA as illustrated in FIG. 9 and can prevent the first inorganic layer 291 or the second inorganic layer 293 from being formed in the pad area PA, thereby solving a problem where a driving error or a lighting test error occurs because an electrical contact is not made in a pad part due to the first inorganic layer 291 or the second inorganic layer 293.

Moreover, as described above, the buffer layer 130 can contact an edge of at least one of the deposited first inorganic layer 291 and second inorganic layer 293. FIG. 8 illustrates an example where the buffer layer 130 contacts an edge of the first inorganic layer 291 and an edge of the second inorganic layer 293, but the present embodiment is not limited thereto.

In another embodiment, the buffer layer 130 can contact only an edge of the second inorganic layer 293. For example, the first inorganic layer 291 and the second inorganic layer 293 can be deposited by using different masks. The first inorganic layer 291 can be deposited by using a first mask, and the second inorganic layer 293 can be deposited by using a second mask. Also, the first mask can be formed greater in area than the second mask, in order for the first inorganic layer 291 to be formed smaller than the second inorganic layer 293 and can be disposed close to the light emitting device 280. Therefore, the first inorganic layer 291 can be formed less in area than the second inorganic layer 293. The second inorganic layer 293 can fully cover the first inorganic layer 291 and the organic layer 292 provided on the first inorganic layer 291.

In another embodiment, the buffer layer 130 can contact only an edge of the first inorganic layer 291. For example, the first inorganic layer 291 and the second inorganic layer 293 can be deposited by using different deposition processes. Since the light emitting device 280 is not flatly formed, the first inorganic layer 291 can be deposited by using an ALD process which is high in step coverage. The mask 140 can be disposed on the buffer layer 130 to contact the buffer layer 130, and then, the first inorganic layer 291 can be deposited by using the ALD process. Therefore, the buffer layer 130 can contact the edge of the first inorganic layer 291. On the other hand, the second inorganic layer 293 can be provided on the organic layer 292 which is relatively flat, and thus, can be deposited by using a CVD process. The mask 140 can be disposed on the buffer layer 130 so as to be spaced apart from the buffer layer 130, and then, the second inorganic layer 293 can be deposited by using the CVD process. Therefore, the second inorganic layer 293 can fully cover the first inorganic layer 291 and the organic layer 292.

A height H2 of the buffer layer 130 can be set equal to or greater than a height H1 of the dam 120. When the height H2 of the buffer layer 130 is less than the height H1 of the dam 120, the dam 120 is damaged by the mask 140 while the mask 140 is being disposed on the buffer layer 130 in a process of depositing the first inorganic layer 291 or the second inorganic layer 293. Also, when the organic layer 292 contacts the damaged dam 120, oxygen or water penetrating into the damaged dam 120 is absorbed by the organic layer 292 and penetrates into the light emitting device 280, causing deterioration of the light emitting device 280.

Moreover, as illustrated in FIG. 8, the height H2 of the buffer layer 130 can be set greater than the height H1 of the dam 120, and thus, the damage of the dam 120 is reduced when disposing the mask 140 on the buffer layer 130. However, the present embodiment is not limited thereto. When control of the mask 140 is precisely performed, a possibility that the dam 120 is damaged by the mask 140 is reduced. In this case, a need where the height H2 of the buffer layer 130 is set greater than the height H1 of the dam 120 is reduced.

Moreover, the buffer layer 130 can be formed at the same time with at least one of a planarization layer 260 and a bank 284 which are provided in a pixel P, and can be formed of the same material as that of at least one of the planarization layer 260 and the bank 284. In this case, the buffer layer 130 can be formed of an organic material such as acryl resin, epoxy resin, phenolic resin, polyamide resin, or polyimide resin, but is not limited thereto.

Second Embodiment

Figure 11:
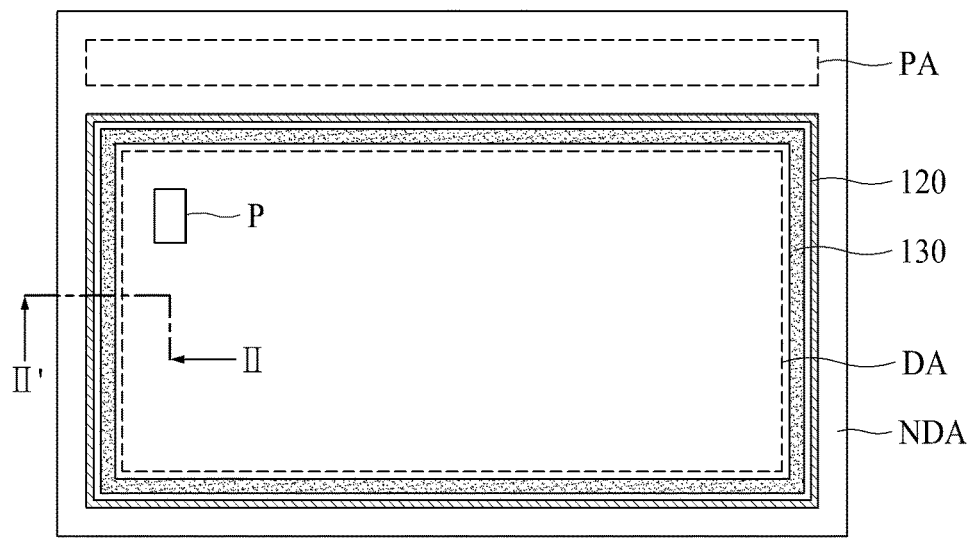
FIG. 11 is a plan view illustrating a first substrate of a display apparatus according to a second embodiment of the present disclosure.
Figure 12:
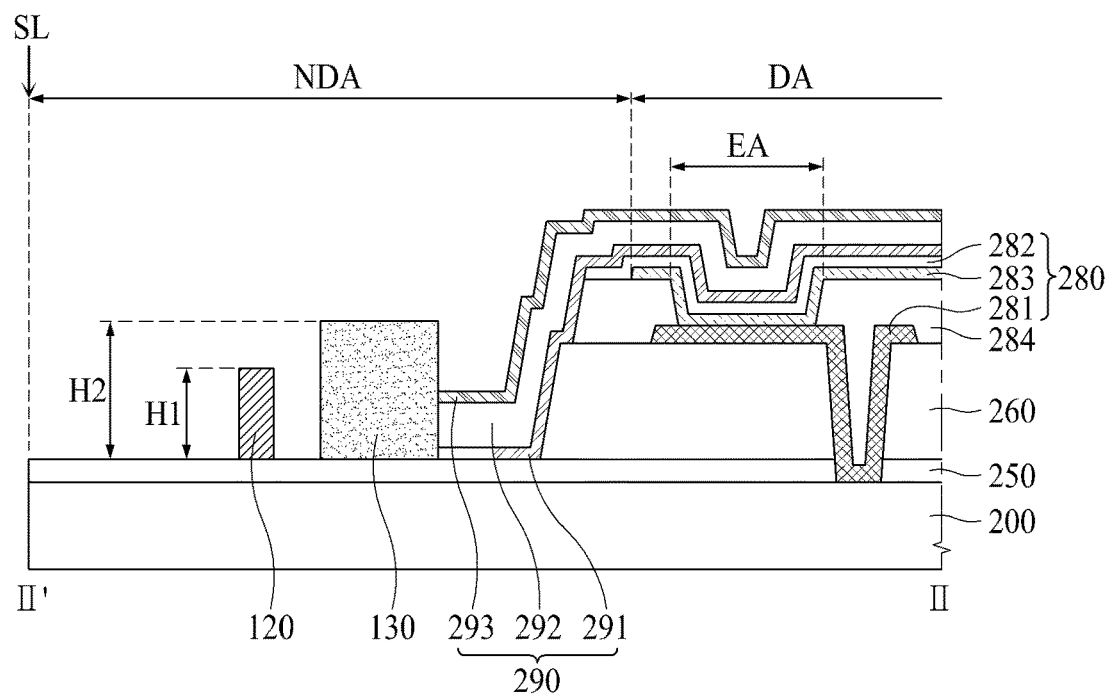
FIG. 12 is a cross-sectional view taken along line II-II' of FIG. 11.

FIG. 11 is a plan view illustrating a first substrate of a display apparatus according to a second embodiment of the present disclosure, and FIG. 12 is a cross-sectional view taken along line II-II' of FIG. 11. Here and in the below embodiments, the first substrate in each embodiment can be another example of the first substrate 111 of FIG. 4.

In FIGS. 11 and 12, for convenience of description, a detailed configuration of each of TFTs 210 and capacitors 220 are omitted, and a TFT substrate 200 including the TFTs 210 and the capacitors 220 is illustrated. The TFT substrate 200 can include a first substrate 111, a gate insulation layer 230, and an interlayer insulation layer 240 illustrated in FIG. 7.

Referring to FIG. 11, the TFT substrate 200 including the first substrate 111 can be divided into a display area DA and a non-display area NDA, and a pad area PA where a plurality of pads are provided, a dam 120, and a buffer layer 130 can be provided in the non-display area NDA. Also, the buffer layer 130 illustrated in FIGS. 11 and 12 can be disposed between the dam 120 and the display area DA. Hereinafter, therefore, the same descriptions as descriptions given above with reference to FIGS. 6 to 10 can be omitted or will be briefly given.

The dam 120 can be disposed to surround an outer portion of the buffer layer 130 in the non-display area NDA and can block a flow of an organic layer 292 flowing out to the outer portion of the buffer layer 130. Also, the dam 120 can be disposed between the buffer layer 130 and the pad area PA and can block a flow of the organic layer 292 so that the organic layer 292 does not penetrate into the pad area PA.

In FIGS. 11 to 12, one dam 120 is illustrated, but the present embodiment is not limited thereto. In other embodiments, the dam 120 can include a first dam and a second dam which is disposed in the non-display area and is spaced apart from the first dam. The second dam can block a flow of the organic layer 292 flowing out to an outer portion of the first dam. Also, the dam 120 can be provided as one or more.

The buffer layer 130 can be provided in the non-display area NDA and can contact at least one of a first inorganic layer 291 and a second inorganic layer 293. For example, the buffer layer 130 can be provided between the dam 120 and the display area DA, in the non-display area NDA and can support a mask 140 (see FIG. 10) so as to maintain a certain distance between the mask 140 and the TFT substrate 200 when performing a process of depositing the first inorganic layer 291 or the second inorganic layer 293. To this end, the mask 140 can be disposed on the buffer layer 130 to contact the buffer layer 130.

When the first inorganic layer 291 or the second inorganic layer 293 is deposited after the mask 140 is disposed on the buffer layer 130, the first inorganic layer 291 or the second inorganic layer 293 can be provided in a region other than a region where the mask 140 is disposed. Also, since a space is not formed between the mask 140 and the TFT substrate 200 by the buffer layer 130, the first inorganic layer 291 or the second inorganic layer 293 is prevented from penetrating into the region where the mask 140 is disposed. Therefore, in the present embodiment, since the buffer layer 130 is disposed between the dam 120 and the display area DA and the mask 140 is disposed on the buffer layer 130 to contact the buffer layer 130, the first inorganic layer 291 or the second inorganic layer 293 is prevented from being formed in an outer portion (for example, a scribing line SL) of the buffer layer 130.

Moreover, as described above, the buffer layer 130 can contact an edge of at least one of the deposited first inorganic layer 291 and second inorganic layer 293. FIG. 12 illustrates an example where the buffer layer 130 contacts an edge of the first inorganic layer 291 and an edge of the second inorganic layer 293, but the present embodiment is not limited thereto.

In another embodiment, the buffer layer 130 can contact only an edge of the first inorganic layer 291. For example, the first inorganic layer 291 and the second inorganic layer 293 can be deposited by using different deposition processes and different masks. Since a light emitting device 280 is not flatly formed, the first inorganic layer 291 can be deposited by using an ALD process which is high in step coverage. A first mask can be disposed on the buffer layer 130 to contact the buffer layer 130, and then, the first inorganic layer 291 can be deposited by using the ALD process. Therefore, the buffer layer 130 can contact the edge of the first inorganic layer 291. On the other hand, the second inorganic layer 293 can be provided on the organic layer 292 which is relatively flat, and thus, can be deposited by using a CVD process. A second mask can be disposed on the TFT substrate 200 so as to be spaced apart from the buffer layer 130 and the dam 120, and then, the second inorganic layer 293 can be deposited by using the CVD process. In this case, the second mask can be less in area than the first mask so that the second inorganic layer 293 is formed wider than the first inorganic layer 291, but can have a large open area. Therefore, the second inorganic layer 293 can fully cover the first inorganic layer 291 and the organic layer 292 provided on the first inorganic layer 291.

A height H2 of the buffer layer 130 can be set greater than a height H1 of the dam 120. When the height H2 of the buffer layer 130 is equal to or less than the height H1 of the dam 120, the dam 120 is damaged by the mask 140 contacting the dam 120 while the mask 140 is being disposed on the buffer layer 130 in a process of depositing the first inorganic layer 291 or the second inorganic layer 293. Also, when the organic layer 292 contacts the damaged dam 120, oxygen or water penetrating into the damaged dam 120 is absorbed by the organic layer 292 and penetrates into the light emitting device 280, causing deterioration of the light emitting device 280.

Moreover, the height H2 of the buffer layer 130 can be set greater than the height H1 of the dam 120, and thus, the damage of the dam 120 is reduced when disposing the mask 140 on the buffer layer 130 in a process of depositing the first inorganic layer 291 or the second inorganic layer 293. However, the present embodiment is not limited thereto.

Moreover, the buffer layer 130 can be provided not to overlap a first electrode 282. In a case where the buffer layer 130 is provided to overlap the first electrode 282, the first electrode 282 is damaged because the mask 140 moves when disposing the mask 140 on the buffer layer 130 in the process of depositing the first inorganic layer 291 or the second inorganic layer 293. Due to a damaged second electrode, a pixel is not normally driven, and a black spot occurs.

According to the present embodiment, the buffer layer 130 can be provided not to overlap the first electrode 282, and thus, the damage of the first electrode 282 is reduced when disposing the mask 140 on the buffer layer 130 in the process of depositing the first inorganic layer 291 or the second inorganic layer 293.

Third Embodiment

Figure 13:
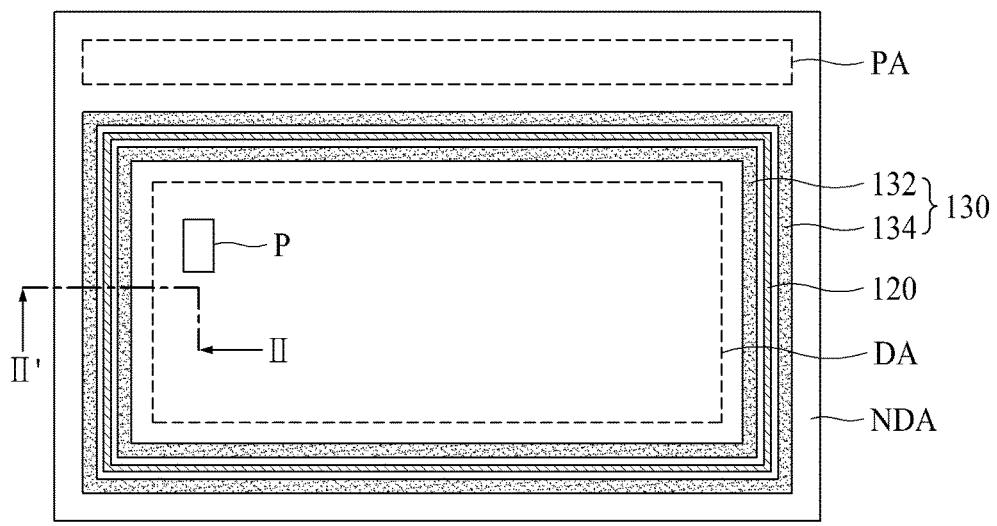
FIG. 13 is a plan view illustrating a first substrate of a display apparatus according to a third embodiment of the present disclosure.
Figure 14:
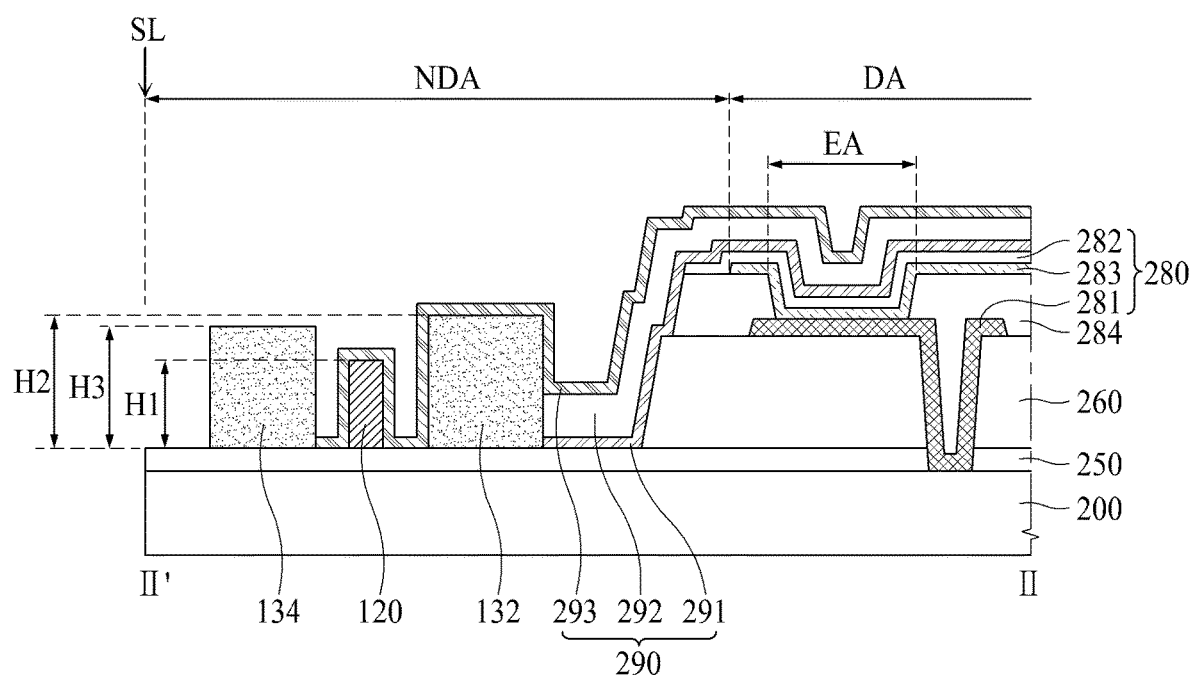
FIG. 14 is a cross-sectional view taken along line II-II' of FIG. 13.

FIG. 13 is a plan view illustrating a first substrate of a display apparatus according to a third embodiment of the present disclosure, and FIG. 14 is a cross-sectional view taken along line II-II' of FIG. 13.

In FIGS. 13 and 14, for convenience of description, a detailed configuration of each of TFTs 210 and capacitors 220 are omitted, and a TFT substrate 200 including the TFTs 210 and the capacitors 220 is illustrated. The TFT substrate 200 can include a first substrate 111, a gate insulation layer 230, and an interlayer insulation layer 240 illustrated in FIG. 8.

Referring to FIGS. 13 and 14, the first substrate 111 can be divided into a display area DA and a non-display area NDA, and a pad area PA where a plurality of pads are provided, a dam 120, a first buffer layer 132, and a second buffer layer 134 can be provided in the non-display area NDA. Also, a buffer layer 130 illustrated in FIGS. 13 and 14 can include the first buffer layer 132 and the second buffer layer 134. Hereinafter, therefore, the same descriptions as descriptions given above with reference to FIGS. 6 to 10 can be omitted or will be briefly given.

The dam 120 can be disposed to surround an outer portion of the first buffer layer 132 in the non-display area NDA and can block a flow of an organic layer 292 flowing out to the outer portion of the first buffer layer 132. Also, the dam 120 can be disposed between the first buffer layer 132 and the pad area PA and can block a flow of the organic layer 292 so that the organic layer 292 does not penetrate into the pad area PA.

In FIGS. 13 to 14, one dam 120 is illustrated, but the present embodiment is not limited thereto. In other embodiments, the dam 120 can include a first dam and a second dam which is disposed in the non-display area and is spaced apart from the first dam. The second dam can block a flow of the organic layer 292 flowing out to an outer portion of the first dam. Also, the dam 120 can be provided as one or more.

The first buffer layer 132 can be provided in the non-display area NDA and can contact an edge of a first inorganic layer 291. For example, the first buffer layer 132 can be provided between the dam 120 and the display area DA, in the non-display area NDA and can support a first mask so as to maintain a certain distance between the first mask and the TFT substrate 200 when performing a process of depositing the first inorganic layer 291. To this end, the first mask can be disposed on the first buffer layer 132 to contact the first buffer layer 132.

When the first inorganic layer 291 is deposited after the first mask is disposed on the first buffer layer 132, the first inorganic layer 291 can be provided in a region other than a region where the first mask is disposed. Also, since a space is not formed between the first mask and the TFT substrate 200 by the first buffer layer 132, the first inorganic layer 291 is prevented from penetrating into the region where the first mask is disposed. Therefore, in the present embodiment, since the first buffer layer 132 is disposed between the dam 120 and the display area DA and the first mask is disposed on the first buffer layer 132 to contact the first buffer layer 132, the first inorganic layer 291 is prevented from being formed in an outer portion (for example, a scribing line SL) of the first buffer layer 132.

Moreover, the first buffer layer 132 can be provided not to overlap a first electrode 282. In a case where the first buffer layer 132 is provided to overlap the first electrode 282, the first electrode 282 is damaged because the first mask moves when disposing the first mask on the first buffer layer 132 in the process of depositing the first inorganic layer 291. Due to a damaged second electrode, a pixel is not normally driven, and a black spot occurs.

According to the present embodiment, the first buffer layer 132 can be provided not to overlap the first electrode 282, and thus, the damage of the first electrode 282 is reduced when disposing the first mask on the first buffer layer 132 in the process of depositing the first inorganic layer 291.

The second buffer layer 134 can be provided in the non-display area NDA and can contact an edge of a second inorganic layer 293. For example, the second buffer layer 134 can be provided between the dam 120 and the scribing line SL, in the non-display area NDA and can support a second mask so as to maintain a certain distance between the second mask and the TFT substrate 200 when performing a process of depositing the second inorganic layer 293. To this end, the second mask can be disposed on the second buffer layer 134 to contact the second buffer layer 134.

When the second inorganic layer 293 is deposited after the second mask is disposed on the second buffer layer 134, the second inorganic layer 293 can be provided in a region other than a region where the second mask is disposed. Also, since a space is not formed between the second mask and the TFT substrate 200 by the second buffer layer 134, the second inorganic layer 293 is prevented from penetrating into the region where the second mask is disposed. As a result, in the present embodiment, since the second buffer layer 134 is disposed between the dam 120 and the scribing line SL and the second mask is disposed on the second buffer layer 134 to contact the second buffer layer 134, the second inorganic layer 293 is prevented from being formed in an outer portion (for example, the scribing line SL) of the second buffer layer 134.

Moreover, according to the present embodiment, since the first buffer layer 132 and the second buffer layer 134 are provided, the first inorganic layer 291 and the second inorganic layer 293 can be provided to have different areas. For example, the first buffer layer 132 can be provided between the dam 120 and the display area DA, and the second buffer layer 134 can be provided in an outer portion of the dam 120, whereby the second inorganic layer 293 can fully cover the organic layer 292, of which flow is blocked by the first inorganic layer 291 and the dam 120, to prevent penetration of oxygen and water. In this case, the first inorganic layer 291 and the second inorganic layer 292 can be formed by using the same deposition process or different deposition processes.

A height H2 of the first buffer layer 132 can be set greater than a height H1 of the dam 120. When the height H2 of the first buffer layer 132 is equal to or less than the height H1 of the dam 120, the dam 120 is damaged by the first mask while the first mask is being disposed on the first buffer layer 132 in a process of depositing the first inorganic layer 291. Also, a height H3 of the second buffer layer 134 can be set equal to or greater than the height H1 of the dam 120. When the height H3 of the second buffer layer 134 is less than the height H1 of the dam 120, the dam 120 is damaged by the second mask while the second mask is being disposed on the second buffer layer 134 in a process of depositing the second inorganic layer 293. Also, when the organic layer 292 contacts the damaged dam 120, oxygen or water penetrating into the damaged dam 120 is absorbed by the organic layer 292 and penetrates into a light emitting device 280, causing deterioration of the light emitting device 280.

The first buffer layer 132 and the second buffer layer 134 can be formed at the same time with at least one of a planarization layer 260 and a bank 284 which are provided in a pixel P, and can be formed of the same material as that of at least one of the planarization layer 260 and the bank 284. In this case, the first buffer layer 132 and the second buffer layer 134 can each be formed of an organic material such as acryl resin, epoxy resin, phenolic resin, polyamide resin, or polyimide resin, but is not limited thereto.

Fourth Embodiment

Figure 15:
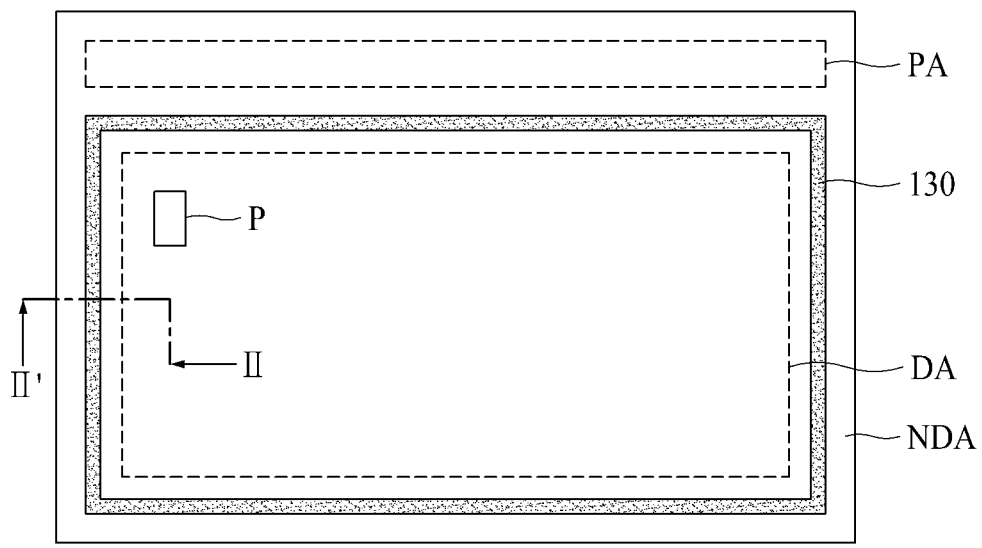
FIG. 15 is a plan view illustrating a first substrate of a display apparatus according to a fourth embodiment of the present disclosure.
Figure 16:
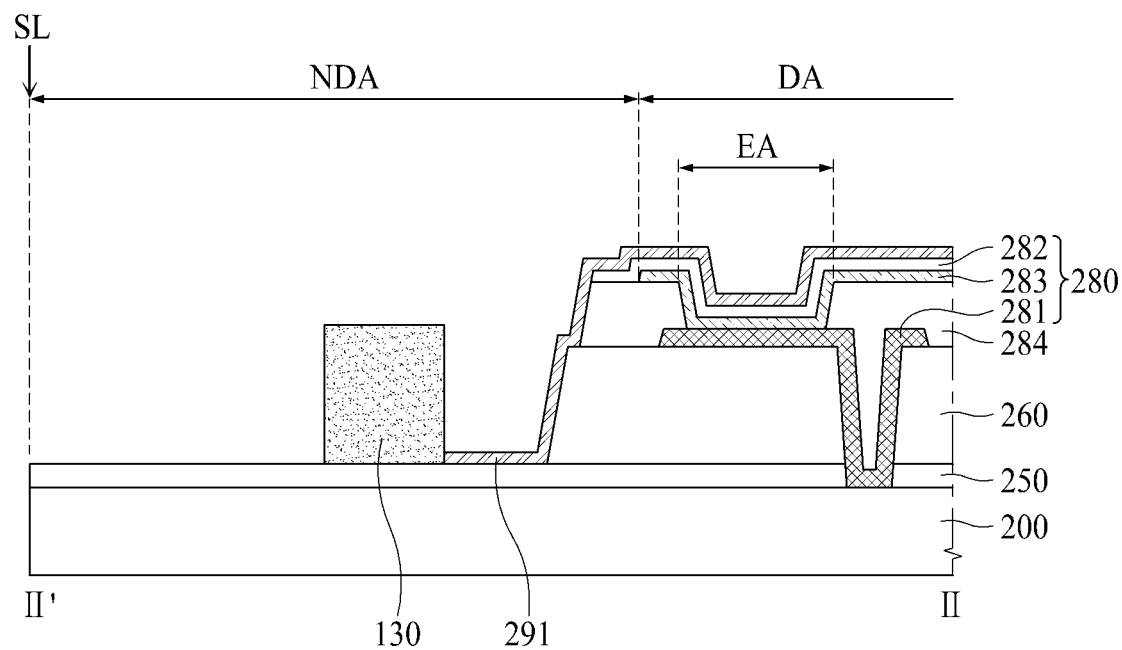
FIG. 16 is a cross-sectional view taken along line II-II' of FIG. 15.

FIG. 15 is a plan view illustrating a first substrate of a display apparatus according to a fourth embodiment of the present disclosure, and FIG. 16 is a cross-sectional view taken along line II-II' of FIG. 15.

In FIGS. 15 and 16, for convenience of description, a detailed configuration of each of TFTs 210 and capacitors 220 are omitted, and a TFT substrate 200 including the TFTs 210 and the capacitors 220 is illustrated. The TFT substrate 200 can include a first substrate 111, a gate insulation layer 230, and an interlayer insulation layer 240 illustrated in FIG. 8.

Referring to FIGS. 15 and 16, the first substrate 111 can be divided into a display area DA and a non-display area NDA, and a pad area PA where a plurality of pads are provided and a buffer layer 130 can be provided in the non-display area NDA. Also, the first substrate 111 illustrated in FIGS. 15 and 16 does not include a dam, and an encapsulation layer does not include an organic layer. Hereinafter, therefore, the same descriptions as descriptions given above with reference to FIGS. 6 to 10 can be omitted or will be briefly given.

The encapsulation layer 290 can be provided to cover a light emitting device 280 provided in the display area DA and can prevent oxygen or water from penetrating into the light emitting device 280. Also, the encapsulation layer 290 can include at least one inorganic layer. For example, the encapsulation layer 290 can include one first inorganic layer 291. In this case, the first inorganic layer 291 can be provided to cover a first electrode 282.

The first inorganic layer 291 can be formed of silicon nitride, aluminum nitride, zirconium nitride, titanium nitride, hafnium nitride, tantalum nitride, silicon oxide, aluminum oxide, or titanium oxide, but are not limited thereto. The first inorganic layer 291 can be deposited through a CVD process or an ALD process, but is not limited thereto.

In FIGS. 15 and 16, one first inorganic layer 291 is illustrated, but the present embodiment is not limited thereto. In other embodiments, an inorganic layer can include a first inorganic layer 291 and a second inorganic layer 292.

The buffer layer 130 can be provided in the non-display area NDA and can contact an edge of the first inorganic layer 291. For example, the buffer layer 130 can be provided in the non-display area NDA, can be spaced apart from a scribing line SL, and can support a mask 140 so as to maintain a certain distance between the mask 140 and the TFT substrate 200 when performing a process of depositing the first inorganic layer 291. To this end, the mask 140 can be disposed on the buffer layer 130 to contact the buffer layer 130.

When the first inorganic layer 291 is deposited after the mask 140 is disposed on the buffer layer 130, the first inorganic layer 291 can be provided in a region other than a region where the mask 140 is disposed. Also, since a space is not formed between the mask 140 and the TFT substrate 200 by the buffer layer 130, the first inorganic layer 291 is prevented from penetrating into the region where the mask 140 is disposed. Therefore, in the present embodiment, since the buffer layer 130 is disposed in the non-display area NDA so as to be spaced apart from the scribing line SL and the mask 140 is disposed on the buffer layer 130 to contact the buffer layer 130, the first inorganic layer 291 is prevented from being formed in an outer portion (for example, the scribing line SL) of the buffer layer 130.

Moreover, the buffer layer 130 can be formed at the same time with at least one of a planarization layer 260 and a bank 284 which are provided in a pixel P, and can be formed of the same material as that of at least one of the planarization layer 260 and the bank 284. In this case, the buffer layer 130 can be formed of an organic material such as acryl resin, epoxy resin, phenolic resin, polyamide resin, or polyimide resin, but is not limited thereto.

Fifth Embodiment

Figure 17:
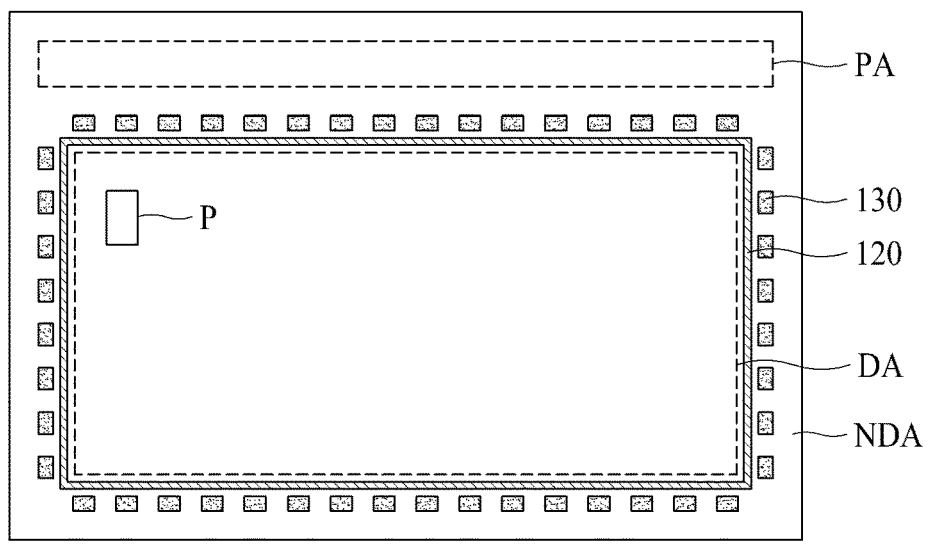
FIG. 17 is a plan view illustrating a first substrate of a display apparatus according to a fifth embodiment of the present disclosure.

FIG. 17 is a plan view illustrating a first substrate of a display apparatus according to a fifth embodiment of the present disclosure.

Referring to FIG. 17, the first substrate 111 can be divided into a display area DA and a non-display area NDA. A pad area PA where a plurality of pads are provided, a dam 120, and a buffer layer 130 can be provided in the non-display area NDA. Also, the buffer layer 130 illustrated in FIG. 18 can be provided in a plurality of island type patterns. The buffer layer 130 provided in the plurality of island type patterns can be applied to other embodiments.

The buffer layer 130 can be provided in the plurality of island type patterns along an outer portion of the dam 120. According to the fifth embodiment of the present disclosure, since the buffer layer 130 is provided in the plurality of island type patterns instead of a line pattern, an increase in stress caused by forming of the buffer layer 130 is reduced in the non-display area NDA.

Sixth Embodiment

Figure 18:
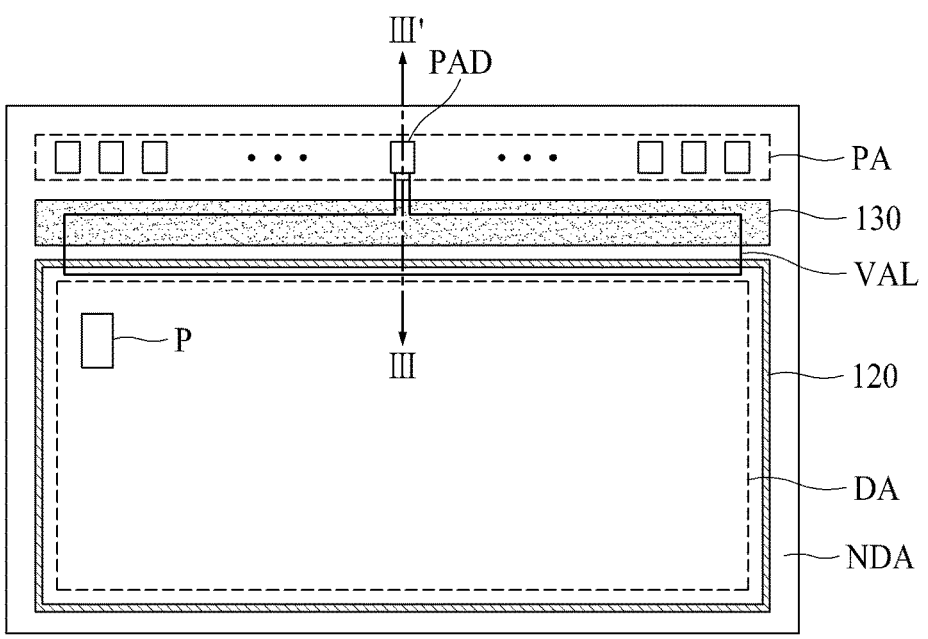
FIG. 18 is a plan view illustrating a first substrate of a display apparatus according to a sixth embodiment of the present disclosure.

FIG. 18 is a plan view illustrating a first substrate of a display apparatus according to a sixth embodiment of the present disclosure.

Referring to FIG. 18, a plurality of data lines and a plurality of gate lines intersecting the data lines can be provided in a display area DA. Also, a plurality of pixels P for displaying an image can be provided in a matrix type in a plurality of areas defined by intersections of the data lines and the gate lines in the display area DA. When a gate signal is input through a corresponding gate line, each of the pixels P can supply a current to a light emitting device 260 with a data voltage of a corresponding data line. Therefore, the light emitting device of each pixel P can emit light having certain brightness, based on the current. Also, a source voltage can be supplied to a power line. The power line can supply the source voltage to each of the pixels P.

A dam 120, a power auxiliary line VAL connected to power lines, a plurality of pads PAD connected to the power auxiliary line VAL, and a buffer layer 130 can be provided in the non-display area NDA. Also, a plurality of data link lines DLL connected to the data lines can be further provided in the non-display area NDA.

A pad area PA can be disposed in one edge of the first substrate 111. The pad area PA can include a plurality of pads, and the plurality of pads can be electrically connected to wirings of a flexible film 150 by an anisotropic conductive film.

The dam 120 can be disposed to surround the display area DA and can block a flow of an organic layer 292. Also, the dam 120 can be disposed between the display area DA and the pad area PA and can block a flow of the organic layer 292 so that the organic layer 292 configuring an encapsulation layer 290 of a pixel P does not penetrate into the pad area PA.

The data link lines DLL can be respectively connected to the pads PAD disposed in the pad area PA and can be respectively connected to the data lines disposed in the display area DA. For example, one end of each of the data link lines DLL can be connected to a corresponding data line through a first contact hole, and the other end can be connected to a corresponding pad PAD through a second contact hole. Each of the plurality of pads PAD can be electrically connected to the wirings of the flexible film 150 through a third contact hole by using an anisotropic conductive film.

Each of the data link lines DLL can be arranged in parallel with a corresponding data line at one end connected to the corresponding data line, and then, can be arranged obliquely with respect to the corresponding data line by a certain length. Also, each of the data link lines DLL can be arranged in parallel with a corresponding pad PAD from an end of the certain length to the other end connected to the corresponding to pad PAD.

The data link lines DLL can be provided in a gate metal pattern including the same material as that of a gate electrode 212. The data lines and the pads PAD can each be provided in a source/drain metal pattern including the same material as that of a source/drain electrode 213/214.

The power auxiliary line VAL can be arranged in parallel with the gate lines and can be connected to the pad PAD disposed in the pad area PA and the power lines disposed in the display area DA. When the source voltage is applied from the pad PAD, the power auxiliary line VAL can supply the applied source voltage to the power line. In this case, the power auxiliary line VAL can not directly be connected to the power lines but can be connected to the power lines by using connection lines respectively connected to the power lines.

The connection lines can be provided in a gate metal pattern including the same material as that of the gate electrode 212. The power auxiliary line VAL and the power line can each be provided in a source/drain metal pattern including the same material as that of the source/drain electrode 213/214.

The buffer layer 130 can be disposed on a metal pattern (for example, the power auxiliary line VAL to which the source voltage is applied from the pad PAD) in the non-display area NDA and can contact a first inorganic layer 291 or a second inorganic layer 293 configuring an encapsulation layer 290 of a pixel P. In the sixth embodiment of the present disclosure, the first inorganic layer 291 or the second inorganic layer 293 can cover a portion of a top of the buffer layer 130.

Hereinafter, a buffer layer according to the sixth embodiment of the present disclosure will be described in detail with reference to FIG. 19.

Figure 19:
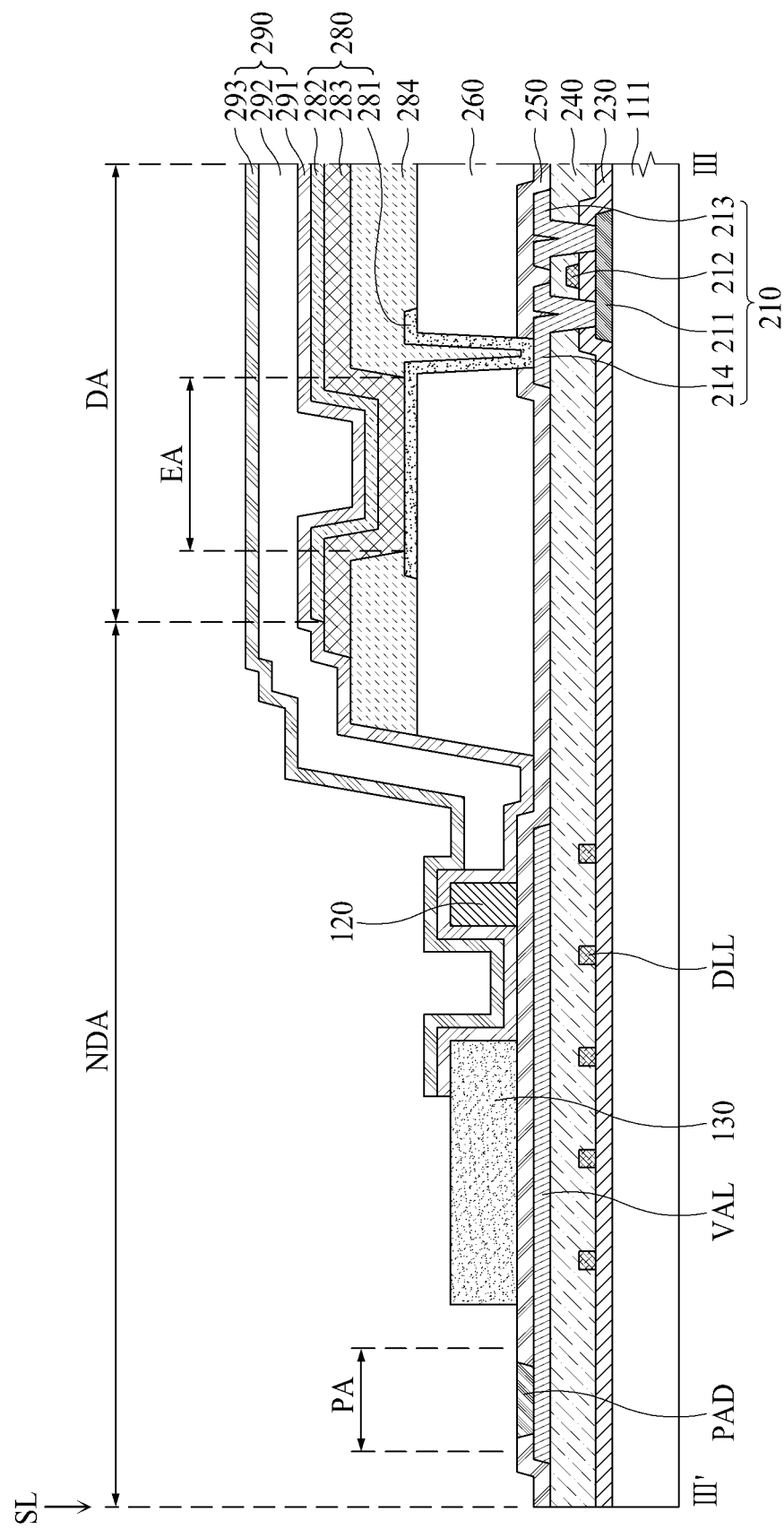
FIG. 19 is a cross-sectional view taken along line III-III' of FIG. 18.
Figure 20:
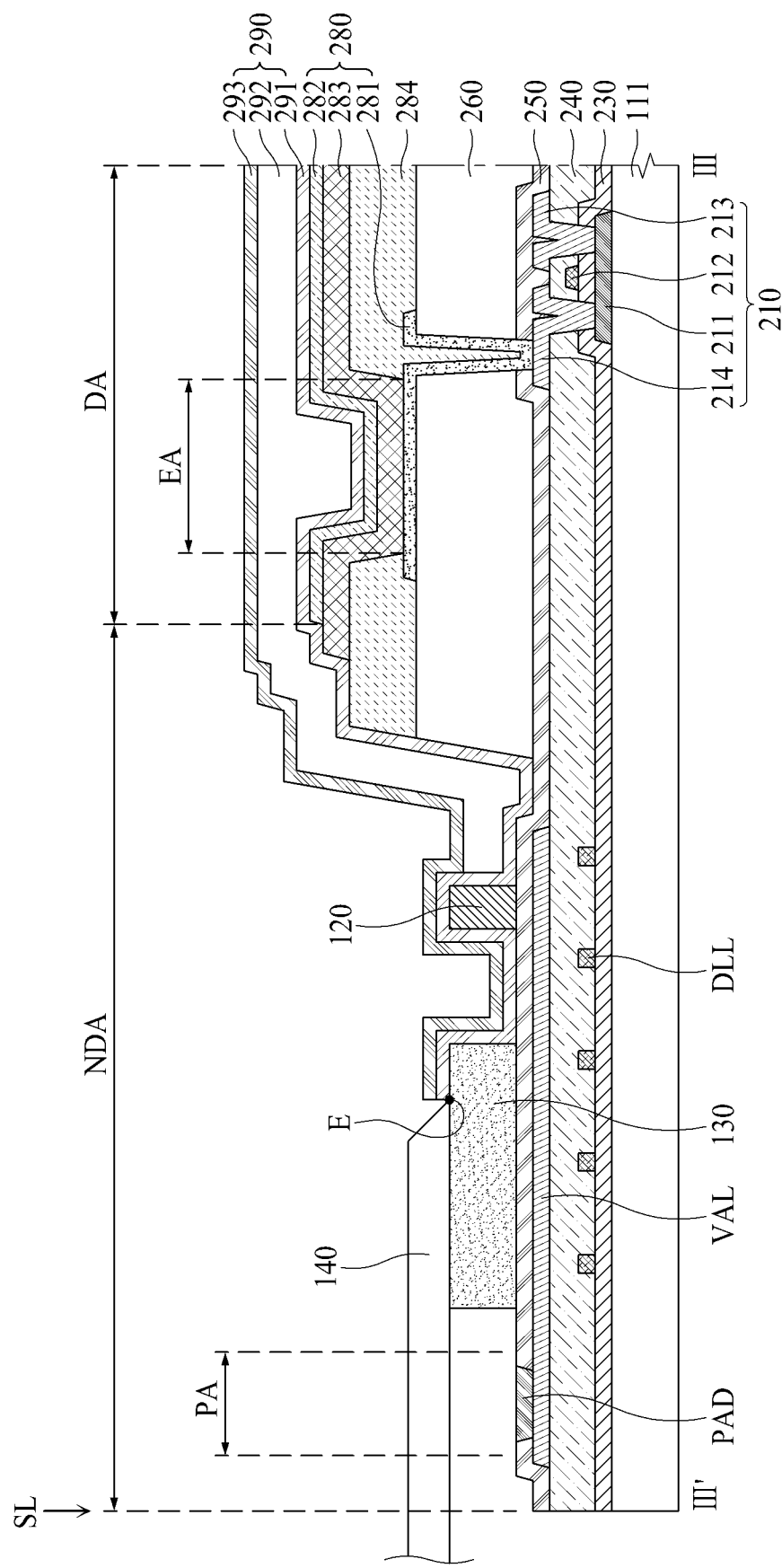
FIG. 20 is a cross-sectional view illustrating an example where a mask is disposed on a buffer layer of FIG. 19.
Figure 21:
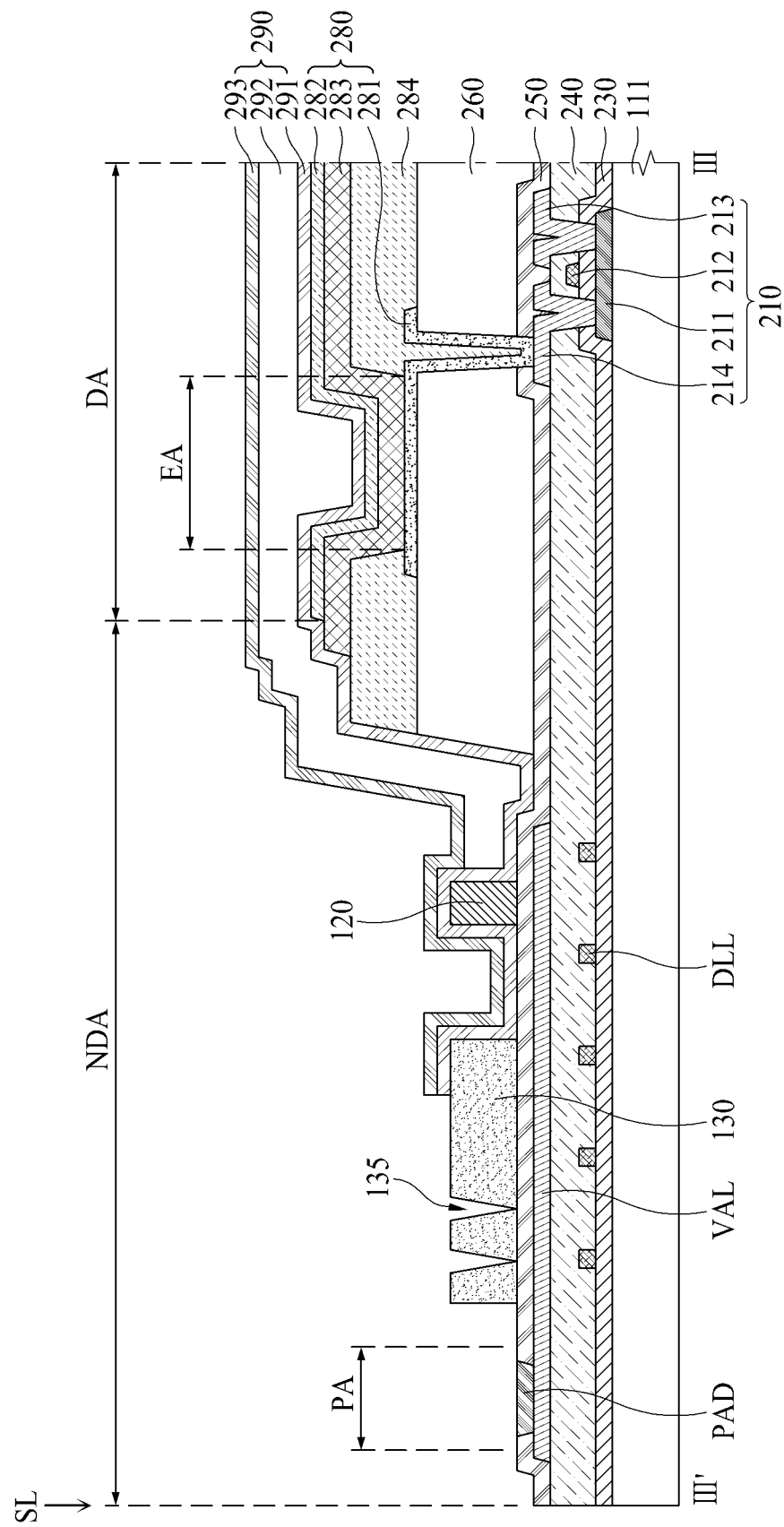
FIG. 21 is a cross-sectional view illustrating a modification embodiment of FIG. 19.

FIG. 19 is a cross-sectional view taken along line III-III' of FIG. 18, and FIG. 20 is a cross-sectional view illustrating an example where a mask is disposed on a buffer layer of FIG. 19. FIG. 21 is a cross-sectional view illustrating a modification embodiment of FIG. 19. Hereinafter, a difference with the first embodiment will be mainly described, and the same description as the first embodiment is omitted or may be brief.

A display apparatus illustrated in FIG. 19 can include an encapsulation layer 290, a dam 120, and a buffer layer 130, which are provided on a first substrate 111. Also, the first substrate 111 can include a display area DA where a plurality of pixels P are provided and a non-display area NDA, and the non-display area NDA can include a pad area PA where a plurality of pads PAD are provided.

The encapsulation layer 290 can be provided to cover a light emitting device 280 provided in the display area DA and can prevent oxygen or water from penetrating into the light emitting device 280. In this case, the encapsulation layer 290 can include at least one inorganic layer and at least one organic layer. For example, the encapsulation layer 290 can include a first inorganic layer 291, an organic layer 292, and a second inorganic layer 293. In this case, the first inorganic layer 291 can be provided to cover a first electrode 282, the organic layer 292 can be provided on the first inorganic layer 291, and the second inorganic layer 293 can be provided to cover the organic layer 292.

The dam 120 can be provided to surround an outer portion of the display area DA and can block a flow of the organic layer 292 configuring the encapsulation layer 290. The organic layer 292 configuring the encapsulation layer 290 is good in coverage performance, but is low in barrier performance. Therefore, the organic layer 292 can be encapsulated by the second inorganic layer 293. Also, if the organic layer 292 flows into a region where the organic layer 292 is to be formed, water or oxygen penetrates into the inside through the organic layer 292 which is exposed without being encapsulated by the second inorganic layer 293. In order to solve such a problem, the dam 120 can block a flow of the organic layer 292, thereby preventing the organic layer 292 from being exposed at the outside of the display apparatus.

Moreover, the dam 120 can be disposed between the display area DA and the pad area PA and can block a flow of the organic layer 292 so that the organic layer 292 configuring the encapsulation layer 290 does not flow into the pad area PA. When the organic layer 292 configuring the encapsulation layer 290 penetrates into the pad area PA, an electrical contact is not normally made in a pad due to the organic layer 292, and for this reason, a driving error or a lighting test error occurs. In order to solve such a problem, the dam 120 can block a flow of the organic layer 292 configuring the encapsulation layer 290, thereby preventing the organic layer 292 from penetrating into the pad area PA.

In FIGS. 19 and 20, one dam 120 is illustrated, but the present embodiment is not limited thereto. In other embodiments, the dam 120 can include a first dam and a second dam which is disposed in the non-display area and is spaced apart from the first dam. The second dam can block a flow of the organic layer 292 flowing out to an outer portion of the first dam. Also, the dam 120 can be provided as one or more.

Moreover, the dam 120 can be formed at the same time with at least one of a planarization layer 260 and a bank 284 which are provided in a pixel P, and can be formed of the same material as that of at least one of the planarization layer 260 and the bank 284. In this case, the dam 120 can be formed of an organic material such as acryl resin, epoxy resin, phenolic resin, polyamide resin, or polyimide resin, but is not limited thereto.

The buffer layer 130 can be provided in a non-display area NDA and can contact an edge of at least one of the first inorganic layer 291 and the second inorganic layer 293. For example, the buffer layer 130 can be provided between the dam 120 and a scribing line SL, in the non-display area NDA and can support a mask 140 so as to maintain a certain distance between the mask 140 and the first substrate 111 when performing a process of depositing the first inorganic layer 291 or the second inorganic layer 293. To this end, as illustrated in FIG. 20, the mask 140 can be disposed on the buffer layer 130 to contact the buffer layer 130.

When the first inorganic layer 291 or the second inorganic layer 293 is deposited after the mask 140 is disposed on the buffer layer 130, the first inorganic layer 291 or the second inorganic layer 293 can be provided in a region other than a region where the mask 140 is disposed. Also, since a space is not formed between the mask 140 and a TFT substrate 200 by the buffer layer 130, the first inorganic layer 291 or the second inorganic layer 293 is prevented from penetrating into the region where the mask 140 is disposed. Therefore, in the present embodiment, since the buffer layer 130 is disposed between the dam 120 and the scribing line SL and the mask 140 is disposed on the buffer layer 130 to contact the buffer layer 130, the first inorganic layer 291 or the second inorganic layer 293 is prevented from being formed in an outer portion (for example, the scribing line SL) of the buffer layer 130.

Moreover, the buffer layer 130 can be provided between the dam 120 and the pad area PA and can prevent the first inorganic layer 291 or the second inorganic layer 293 from being formed in the pad area PA, thereby solving a problem where a driving error or a lighting test error occurs because an electrical contact is not made in a pad part due to the first inorganic layer 291 or the second inorganic layer 293.

In a case where the first inorganic layer 291 or the second inorganic layer 293 is deposited through a CVD process, a high voltage occurs instantaneously in a process of depositing the first inorganic layer 291 or the second inorganic layer 293. For example, since many electric charges instantaneously concentrate on an edge E of the mask 140, static electricity occurs between the mask 140 and a power auxiliary line VAL disposed in a region corresponding to the edge E, and for this reason, a defect occurs in both the mask 140 and the power auxiliary line VAL. Although a passivation layer 250 is provided on the power auxiliary line VAL, the passivation layer 250 is very thinly provided, and for this reason, the passivation layer 250 can be torn by the high voltage in the process of depositing the first inorganic layer 291 or the second inorganic layer 293.

In order to solve the above-described problem, in the sixth embodiment of the present disclosure, the buffer layer 130 can be provided on a metal pattern (for example, the power auxiliary line VAL) provided in the non-display area NDA. Also, as illustrated in FIG. 21, the mask 140 can be disposed to cover a portion of a top of the buffer layer 130 in the process of depositing the first inorganic layer 291 or the second inorganic layer 293. The buffer layer 130 can contact an edge of the first inorganic layer 291 or the second inorganic layer 293, and a portion of the top of the buffer layer 130 can be covered by the first inorganic layer 291 or the second inorganic layer 293.

Therefore, the buffer layer 130 can be provided between the edge E of the mask 140 and the power auxiliary line VAL, and thus, even when many electric charges instantaneously concentrate on the edge E of the mask 140 in the process of depositing the first inorganic layer 291 or the second inorganic layer 293, the buffer layer 130 prevents static electricity from occurring between the mask 140 and the power auxiliary line VAL.

A portion of the top of the buffer layer 130, as described above, can be covered by at least one of the deposited first inorganic layer 291 and second inorganic layer 293. FIG. 20 illustrates an example where a portion of the top of the buffer layer 130 is covered by the first inorganic layer 291 and the second inorganic layer 293, but the present embodiment is not limited thereto.

In another embodiment, only the second inorganic layer 293 can be provided in only a portion of the top of the buffer layer 130, and the buffer layer 130 can contact only an edge of the second inorganic layer 293. In detail, the first inorganic layer 291 and the second inorganic layer 293 can be deposited by using different deposition processes. Since the light emitting device 280 is not flatly formed, the first inorganic layer 291 can be deposited by using an ALD process which is high in step coverage. In a case where the first inorganic layer 291 is manufactured through the ALD process, a high voltage does not occur unlike a CVD process, and thus, static electricity does not occur between the mask 140 and the power auxiliary line VAL. Therefore, the mask 140 can be disposed so as to be spaced apart from the first substrate 111, and then, the first organic layer 291 can be deposited through the ALD process. In this case, the mask 140 can be disposed to contact the buffer layer 130, or can be disposed so as to be spaced apart from the buffer layer 130. Also, the mask 140 can be disposed to cover the whole top of the buffer layer 130.

The second inorganic layer 293 can be provided on the organic layer 292 which is relatively flat, and thus, can be deposited by using a CVD process. The mask 140 can be disposed on the buffer layer 130 to contact the buffer layer 130, and then, the second inorganic layer 293 can be deposited by using the CVD process. In this case, the mask 140 can be disposed to cover a portion of the top of the buffer layer 130. Therefore, the second inorganic layer 293 can fully cover the first inorganic layer 291 and the organic layer 292.

Figure 22:
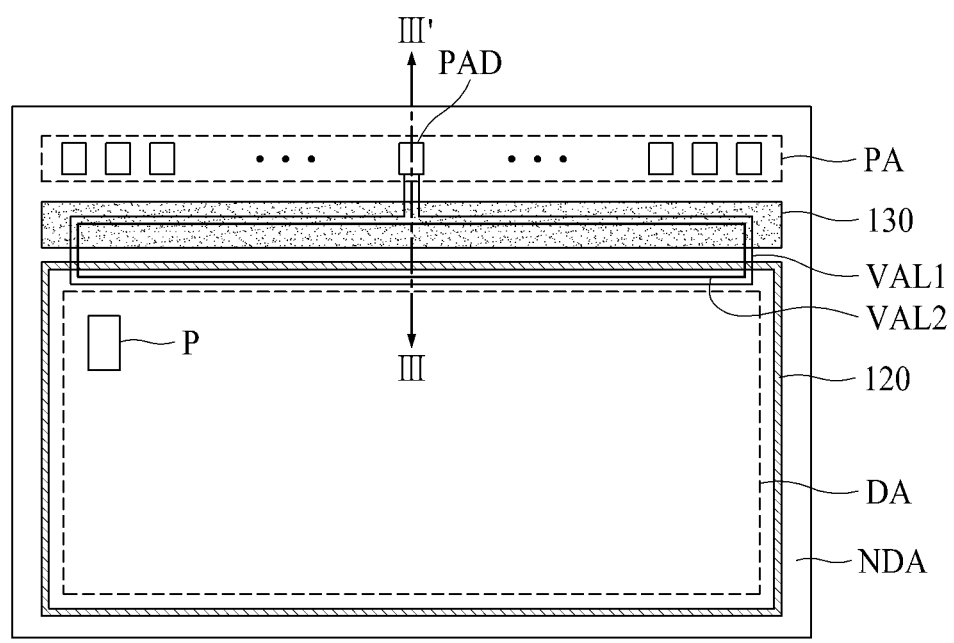
FIG. 22 is a plan view illustrating a first substrate of a display apparatus according to a seventh embodiment of the present disclosure.

Moreover, as illustrated in FIG. 22, at least one groove 135 which exposes the passivation layer 250 can be provided in the buffer layer 130, thereby preventing propagation of a crack. The at least one groove 135 can be referred to as a crack prevention groove.

Moreover, the buffer layer 130 can be formed at the same time with at least one of a planarization layer 260 and a bank 284 which are provided in a pixel P, and can be formed of the same material as that of at least one of the planarization layer 260 and the bank 284. In this case, the buffer layer 130 can be formed of an organic material such as acryl resin, epoxy resin, phenolic resin, polyamide resin, or polyimide resin, but is not limited thereto.

Seventh Embodiment

FIG. 22 is a plan view illustrating a first substrate of a display apparatus according to a seventh embodiment of the present disclosure. In FIG. 22, a power auxiliary line can include a first power auxiliary line VAL1 and a second power auxiliary line VAL2. Hereinafter, therefore, description overlapping the description of FIG. 19 is omitted or will be briefly given.

Referring to FIG. 22, a dam 120, a first power auxiliary line VAL1 connected to a plurality of power lines, a second power auxiliary line VAL2 disposed on the first power auxiliary line VAL1, a plurality of pads PAD connected to the first power auxiliary line VAL1, and a buffer layer 130 can be provided in a non-display area NDA. Also, a plurality of data link lines DLL connected to a plurality of data lines can be further provided in the non-display area NDA.

A power auxiliary line VAL can be arranged in parallel with a plurality of gate lines and can be connected to the pad PAD disposed in the pad area PA and the power lines disposed in the display area DA. When a source voltage is applied from the pad PAD, the power auxiliary line VAL can supply the applied source voltage to the power line. In this case, the power auxiliary line VAL can not directly be connected to the power lines but can be connected to the power lines by using connection lines respectively connected to the power lines.

The power auxiliary line VAL can include the first power auxiliary line VAL1 and the second power auxiliary line VAL2. The second power auxiliary line VAL2 can be provided on the first power auxiliary line VAL1 and can be connected to the first power auxiliary line VAL1 through a contact hole. For example, the second power auxiliary line VAL2 can be connected to the first power auxiliary line VAL1 through a contact hole passing through a third buffer layer 136. In this manner, since the second power auxiliary line VAL2 is additionally provided on the first power auxiliary line VAL1, a cross-sectional area of the power auxiliary line VAL increases, and thus, a resistance is reduced, thereby enabling the source voltage to be stably supplied.

The connection lines can be provided in a gate metal pattern including the same material as that of a gate electrode 212. The first power auxiliary line VAL1 and the power line can each be provided in a source/drain metal pattern including the same material as that of a source/drain electrode 213/214.

The buffer layer 130 can be disposed on a metal pattern (for example, the power auxiliary line VAL to which the source voltage is applied from the pad PAD) in the non-display area NDA and can contact a first inorganic layer 291 or a second inorganic layer 293 configuring an encapsulation layer 290 of a pixel P. In the seventh embodiment of the present disclosure, the buffer layer 130 can include the third buffer layer 136 and a fourth buffer layer 138, and the first inorganic layer 291 or the second inorganic layer 293 can cover a portion of a top of the fourth buffer layer 138.

Hereinafter, the buffer layer according to the seventh embodiment of the present disclosure will be described in detail with reference to FIGS. 23 and 24.

Figure 23:
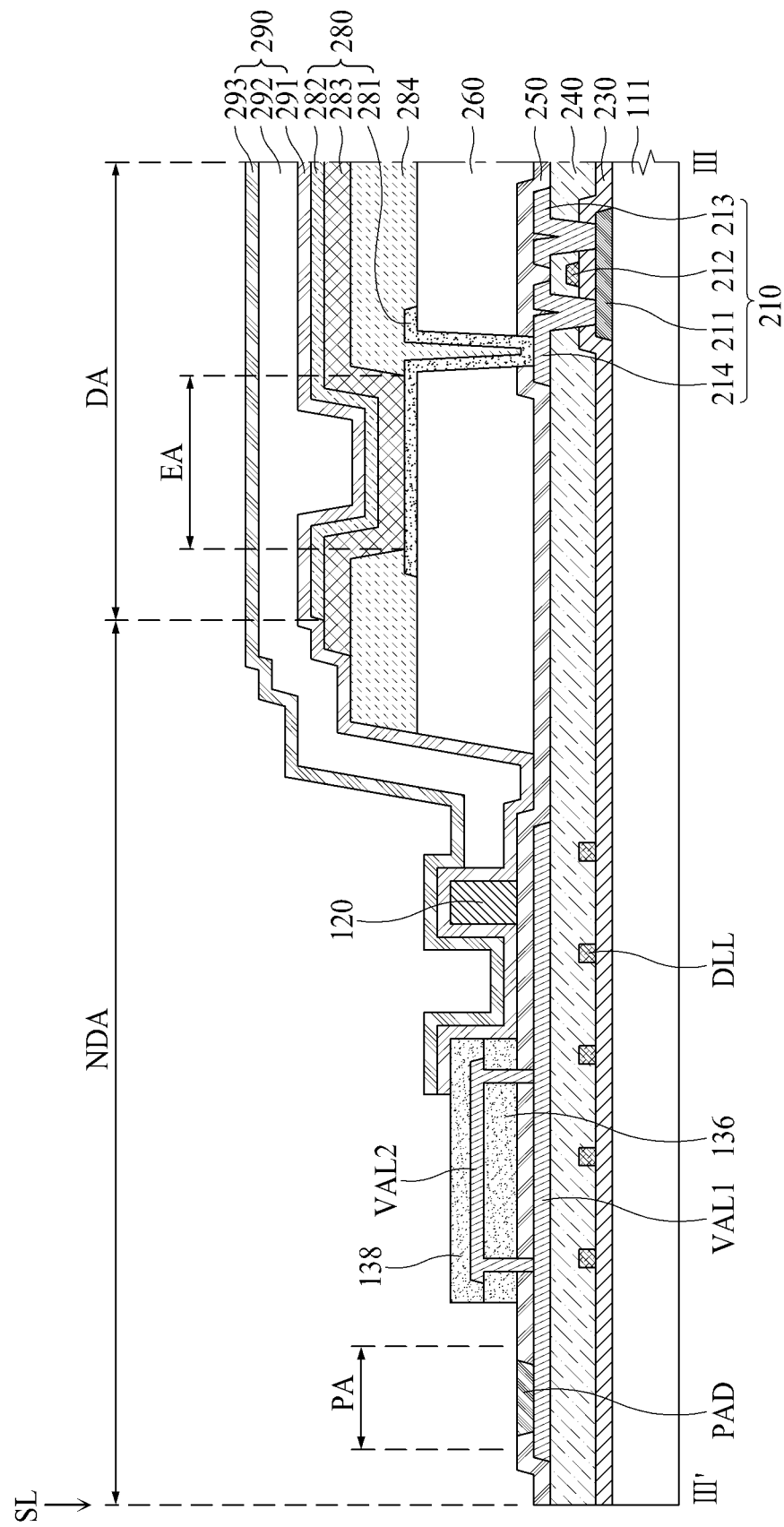
FIG. 23 is a cross-sectional view taken along line III-III' of FIG. 22.
Figure 24:
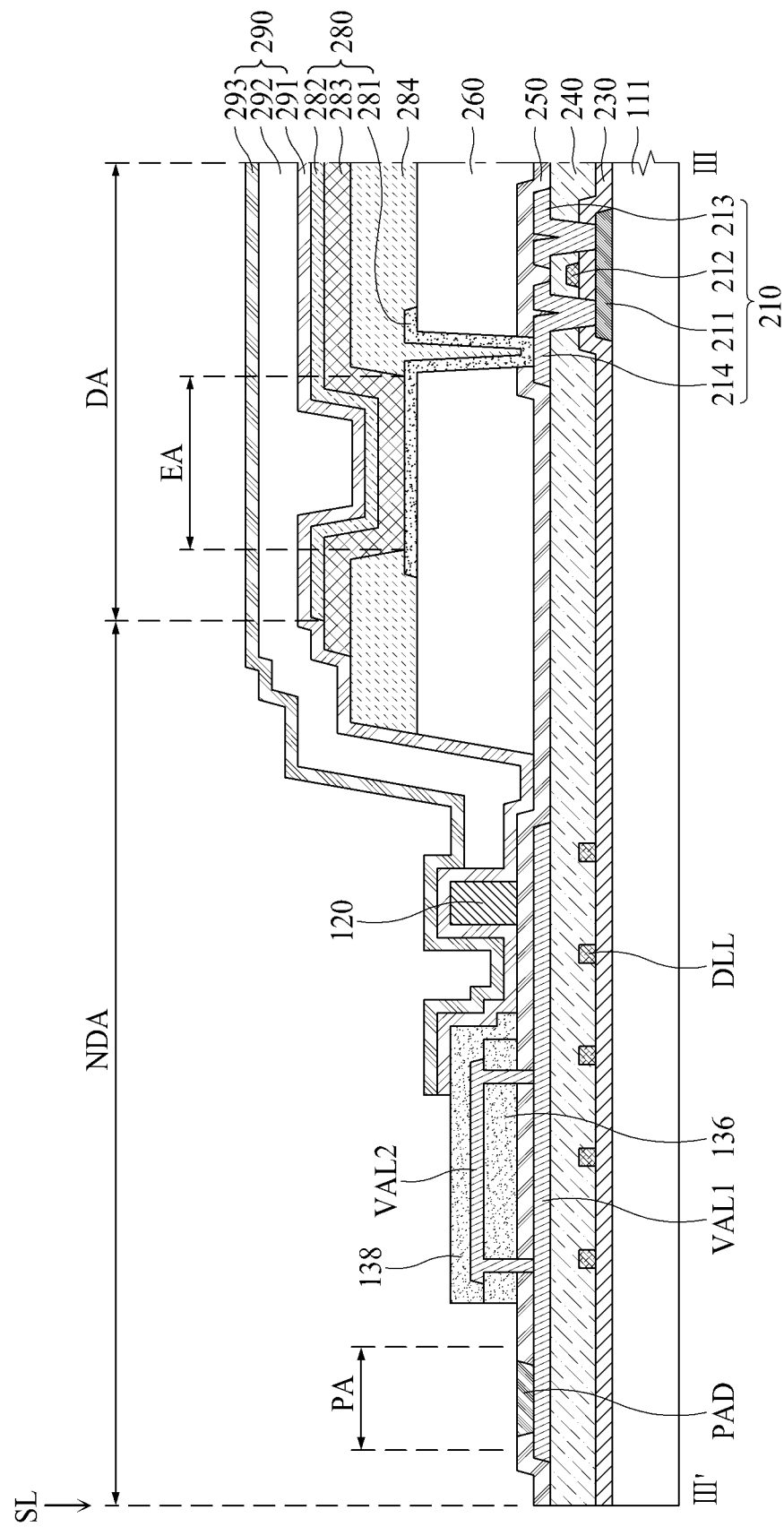
FIG. 24 is a cross-sectional view illustrating a modification embodiment of FIG. 23.

FIG. 23 is a cross-sectional view taken along line III-III' of FIG. 22, and FIG. 24 is a cross-sectional view illustrating a modification embodiment of FIG. 23. A buffer layer 130 can be provided on a first substrate illustrated in FIGS. 23 and 24 and can include a third buffer layer 136 and a fourth buffer layer 138, and a second power auxiliary line VAL2 can be provided between the third buffer layer 136 and the fourth buffer layer 138. Hereinafter, therefore, descriptions overlapping the descriptions of FIGS. 18 to 20 are omitted or will be briefly given.

A display apparatus illustrated in FIG. 22 can include an encapsulation layer 290, a dam 120, and a buffer layer 130, which are provided on a first substrate 111. Also, the first substrate 111 can include a display area DA where a plurality of pixels P are provided and a non-display area NDA, and the non-display area NDA can include a pad area PA where a plurality of pads PAD are provided.

The buffer layer 130 can include a third buffer layer 136 and a fourth buffer layer 138. The third buffer layer 136 can be provided on a first power auxiliary line VAL1 in the non-display area NDA. A second power auxiliary line VAL2 can be provided on the third buffer layer 136 and can be connected to the first power auxiliary line VAL1 through a contact hole which passes through the third buffer layer 136 and a passivation layer 150. Also, the fourth buffer layer 138 can be provided on the second power auxiliary line VAL2.

The fourth buffer layer 138 can contact an edge of at least one of a first inorganic layer 291 and a second inorganic layer 293. A mask 140 can be disposed to cover only a portion of a top of the fourth buffer layer 138 in a process of depositing the first inorganic layer 291 or the second inorganic layer 293. Therefore, the fourth buffer layer 138 can contact an edge of the first inorganic layer 291 or the second inorganic layer 293, and a portion of the top of the fourth buffer layer 138 can be covered by the first inorganic layer 291 or the second inorganic layer 293.

The fourth buffer layer 138 can be provided between an edge E of the mask 140 and the second power auxiliary line VAL2, and thus, even when many electric charges instantaneously concentrate on the edge E of the mask 140 in the process of depositing the first inorganic layer 291 or the second inorganic layer 293, the fourth buffer layer 138 prevents static electricity from occurring between the mask 140 and the second power auxiliary line VAL2. Also, the third buffer layer 136 and the fourth buffer layer 138 can be provided between the edge E of the mask 140 and the first power auxiliary line VAL1, and thus, even when many electric charges instantaneously concentrate on the edge E of the mask 140 in the process of depositing the first inorganic layer 291 or the second inorganic layer 293, the third buffer layer 130 and the fourth buffer layer 138 prevent static electricity from occurring between the mask 140 and the first power auxiliary line VAL1.

A portion of the top of the fourth buffer layer 138, as described above, can be covered by at least one of the deposited first inorganic layer 291 and second inorganic layer 293. FIG. 23 illustrates an example where a portion of the top of the fourth buffer layer 138 is covered by the first inorganic layer 291 and the second inorganic layer 293, but the present embodiment is not limited thereto.

In another embodiment, only the second inorganic layer 293 can be provided in only a portion of the top of the fourth buffer layer 138, and the fourth buffer layer 138 can contact only an edge of the second inorganic layer 293. For example, the first inorganic layer 291 and the second inorganic layer 293 can be deposited by using different deposition processes. Since a light emitting device 280 is not flatly formed, the first inorganic layer 291 can be deposited by using an ALD process which is high in step coverage. In a case where the first inorganic layer 291 is manufactured through the ALD process, a high voltage does not occur unlike a CVD process, and thus, a possibility that static electricity occurs between the mask 140 and the power auxiliary line VAL is reduced. Therefore, the mask 140 can be disposed so as to be spaced apart from the first substrate 111, and then, the first organic layer 291 can be deposited through the ALD process. In this case, the mask 140 can be disposed to contact the fourth buffer layer 138, or can be disposed so as to be spaced apart from the fourth buffer layer 138. Also, the mask 140 can be disposed to cover the whole top of the fourth buffer layer 138.

The second inorganic layer 293 can be provided on the organic layer 292 which is relatively flat, and thus, can be deposited by using a CVD process. The mask 140 can be disposed on the fourth buffer layer 138 to contact the fourth buffer layer 138, and then, the second inorganic layer 293 can be deposited by using the CVD process. In this case, the mask 140 can be disposed to cover a portion of the top of the fourth buffer layer 138. Therefore, the second inorganic layer 293 can fully cover the first inorganic layer 291 and the organic layer 292.

The third buffer layer 136 and the fourth buffer layer 138 can have the same area as illustrated in FIG. 23, but are not limited thereto. In other embodiments, as illustrated in FIG. 24, the fourth buffer layer 138 can have an area which is wider than that of the third buffer layer 136.

The buffer layer 130 can be formed at the same time with at least one of a planarization layer 260 and a bank 284 which are provided in a pixel P, and can be formed of the same material as that of at least one of the planarization layer 260 and the bank 284. For example, the third buffer layer 136 can be formed at the same time with the planarization layer 260 and can be formed of the same material as that of the planarization layer 260. The fourth buffer layer 138 can be formed at the same time with the bank 284 and can be formed of the same material as that of the bank 284.

FIGS. 18 to 28 illustrate an example where the buffer layer 130 is disposed only between the dam 120 and the pad area PA, but the present disclosure is not limited thereto. In other embodiments, the buffer layer 130 can be disposed to surround the dam 20. Also, the buffer layer 120 can be provided in a plurality of island type patterns. Depending on the case, addition to the power auxiliary line VAL, a plurality of metal lines can be disposed in the non-display area NDA. Based on a panel design, the plurality of metal lines can be disposed between the display area DA and the non-display area NDA, or can be disposed in a region, where the pad area PA is not disposed, of the non-display area NDA. Since the buffer layer 130 is provided on the plurality of metal lines, static electricity is prevented from occurring between the edge E of the mask 140 and the metal lines when depositing the first inorganic layer 291 or the second inorganic layer 293 configuring the encapsulation layer.

Figure 25:
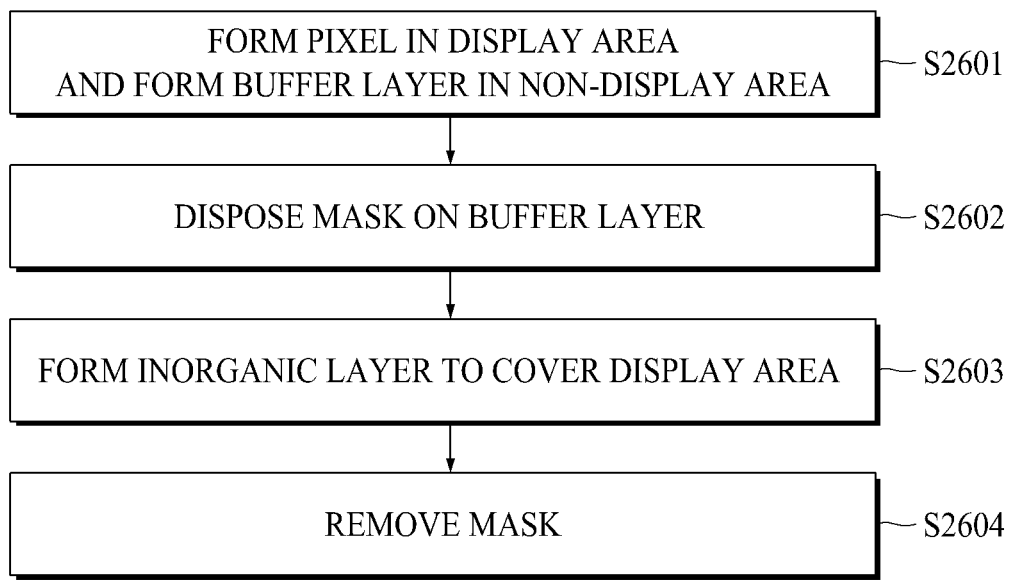
FIG. 25 is a flowchart for describing a method of manufacturing a display apparatus according to a first embodiment of the present disclosure.

FIG. 25 is a flowchart for describing a method of manufacturing a display apparatus according to a first embodiment of the present disclosure, and FIGS. 26A to 26H are cross-sectional views for describing the method of manufacturing the display apparatus according to the first embodiment of the present disclosure. The manufacturing method will be described below with reference to FIGS. 25 and 26A to 26H along with FIGS. 7 to 10.

First, a pixel P can be formed in a display area DA, and a buffer layer 130 can be formed in a non-display area NDA in operation 52601.

Figure 26A:
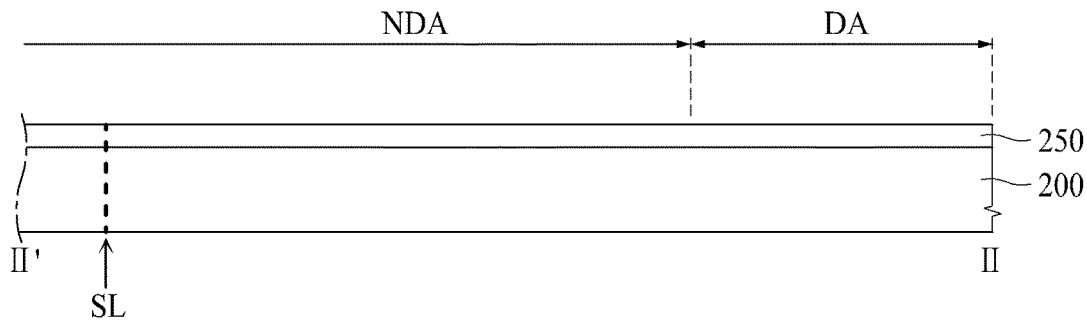
FIGS. 26A to 26H are cross-sectional views for describing the method of manufacturing the display apparatus according to the first embodiment of the present disclosure.

For example, as in FIG. 26A, a passivation layer 250 can be formed on a TFT substrate 200. The passivation layer 250 can act as an insulation layer. The passivation layer 250 can be formed of an inorganic layer, and for example, can be formed of SiOx, SiNx, or a multilayer thereof. However, the present embodiment is not limited thereto.

Figure 26B:
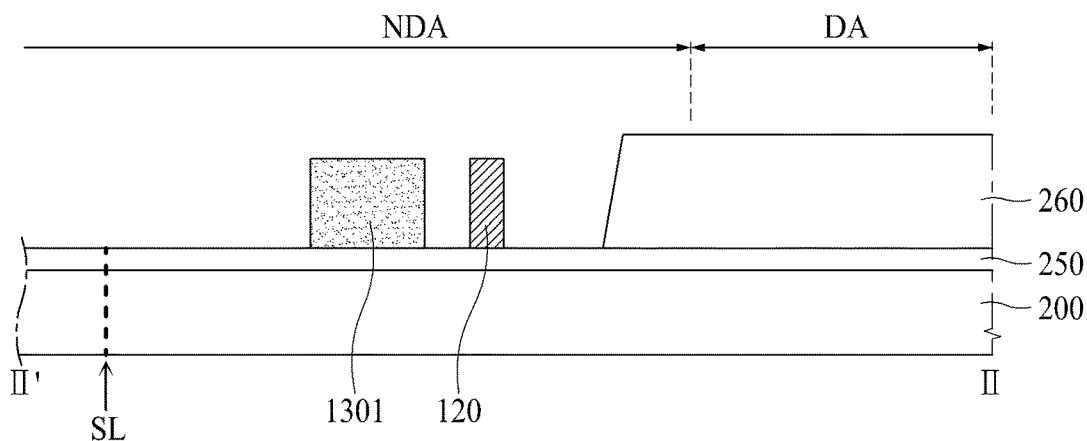

Moreover, as in FIG. 26B, a planarization layer 260, a dam 120, and a bottom buffer layer 1301 can be formed. For example, the planarization layer 260, the dam 120, and the bottom buffer layer 1301 can be formed on the passivation layer 250. Also, the dam 120 can be formed in the non-display area NDA, and the bottom buffer layer 1301 can be formed outside the dam 120. The planarization layer 260, the dam 120, and the bottom buffer layer 1301 can each be formed of an organic layer such as acryl resin, epoxy resin, phenolic resin, polyamide resin, or polyimide resin, but is not limited thereto. The planarization layer 250 is described as being formed of a single layer, but can be formed of two or more layers without being limited thereto. In a case where the planarization layer 260 is formed of two layers such as a top planarization layer and a bottom planarization layer, the buffer layer 1301 and the dam 120 can be selectively formed when forming the top planarization layer and the bottom planarization layer. For example, when forming the bottom planarization layer, all of the buffer layer 1301 and the dam 120 can be formed, or only the buffer layer 1301 can be formed. Also, when forming the top planarization layer, all of the buffer layer 1301 and the dam 120 can be formed, or only the buffer layer 1301 can be formed.

In FIG. 26B, the dam 120 is illustrated as being formed between the bottom buffer layer 1301 and the planarization layer 260, but is not limited thereto. In other embodiments, the dam 120 can not be formed.

Moreover, in FIG. 26B, the bottom buffer layer 1301 is illustrated as being formed outside the dam 120, but is not limited thereto. In other embodiments, the bottom buffer layer 1301 can be formed between the dam 120 and the planarization layer 260.

In FIG. 26B, the dam 120 is illustrated as being formed simultaneously with the planarization layer 260, but is not limited thereto. In other embodiments, the dam 120 can be formed simultaneously with the passivation layer 250 or a bank 284 which is to be formed later.

Figure 26C:
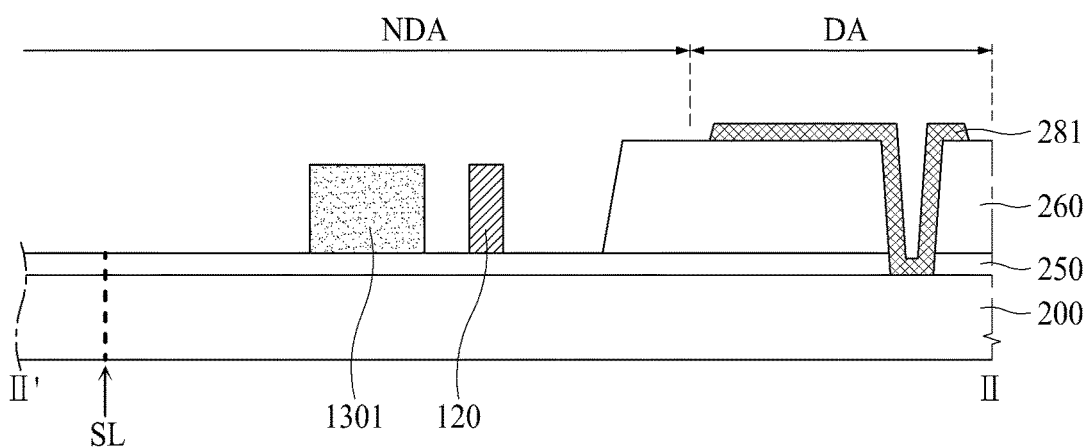

As in FIG. 26C, a contact hole CH3 which passes through the passivation layer 250 and the planarization layer 260 to expose a source or drain electrode 224 of a TFT 210 can be formed, and a second electrode 281 can be formed. The second electrode 281 can be connected to the drain electrode 214 of a corresponding TFT 210 through. The second electrode 281 can be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy can be an alloy of Ag, Pd, and Cu.

Figure 26D:
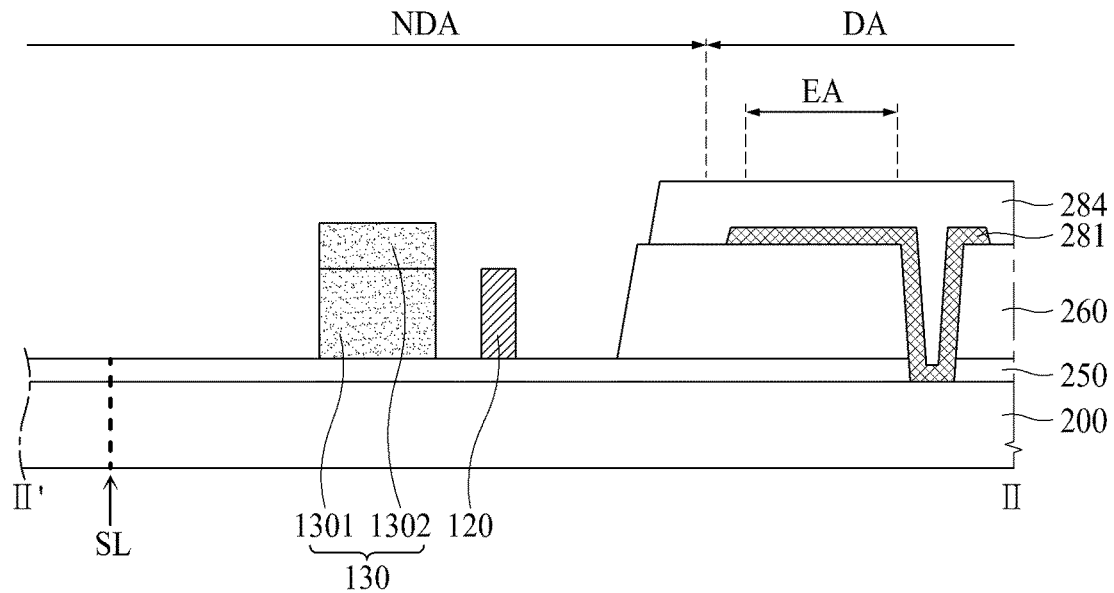

As in FIG. 26D, the bank 284 and the top buffer layer 1302 can be formed. For example, the bank 284 can be formed on the planarization layer 260 to cover an edge of the second electrode 281, for dividing a plurality of emissive areas EA. The bank 284 and the top buffer layer 1302 can each be formed of an organic layer such as acryl resin, epoxy resin, phenolic resin, polyamide resin, or polyimide resin, but are not limited thereto.

Figure 26E:
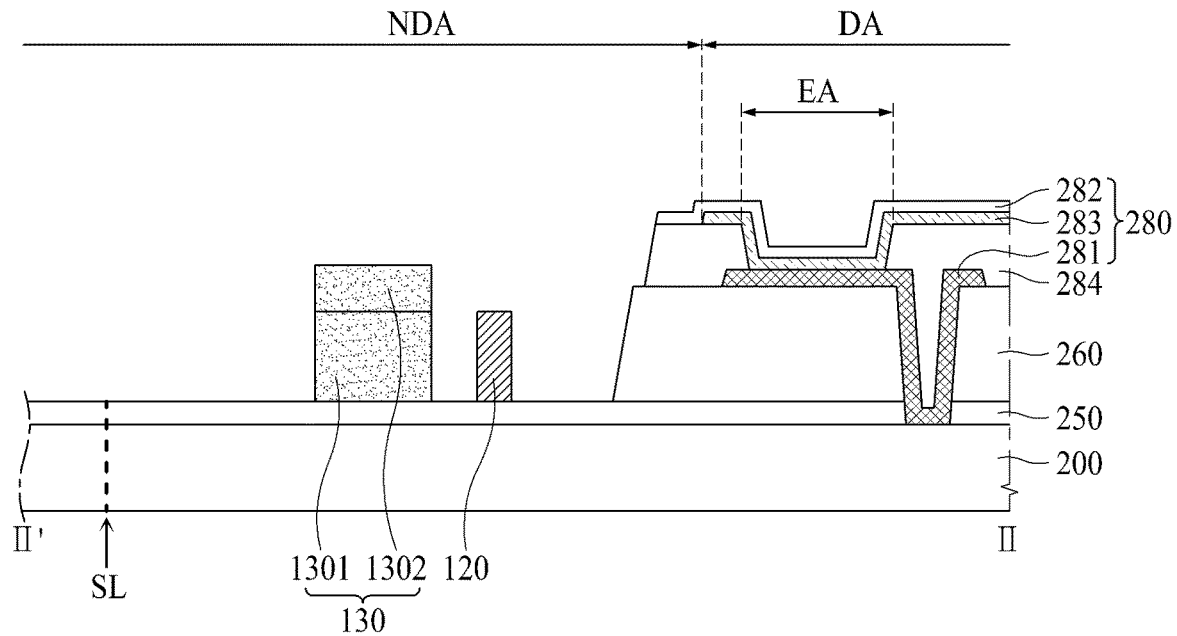
Figure 26F:
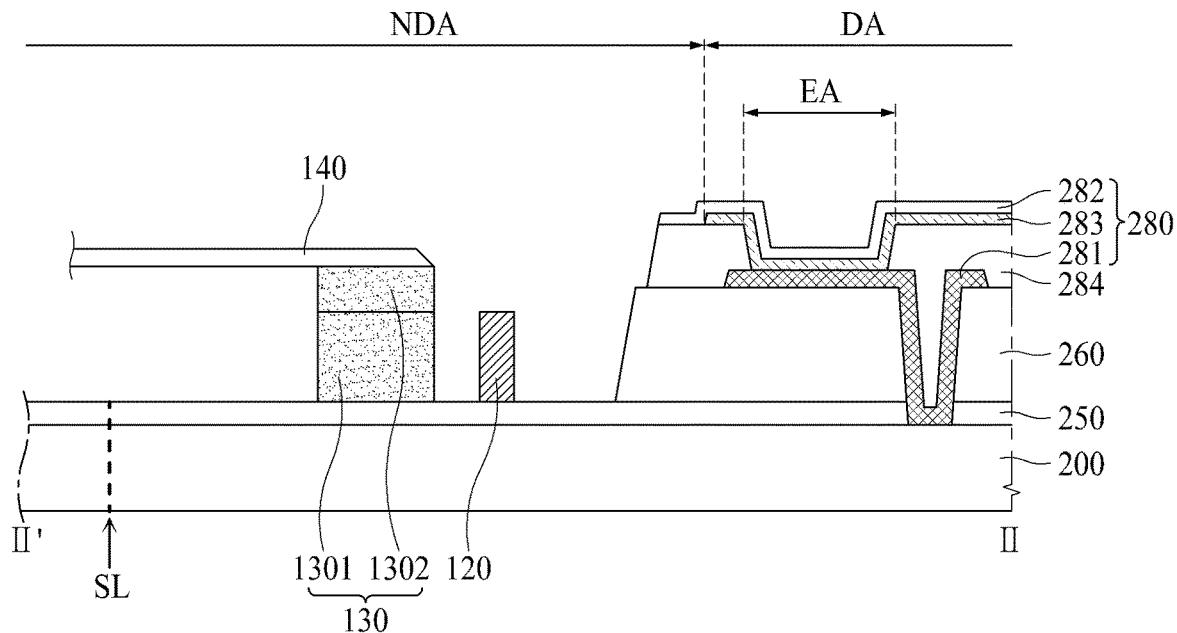

As in FIG. 26E, a light emitting layer 283 and a first electrode 282 can be formed. For example, the light emitting layer 283 can be formed on the second electrode 281 and the bank 284. Also, the first electrode 282 can be formed on the light emitting layer 283. The first electrode 282 can be formed of a transparent conductive material (or TCO), such as ITO or IZO capable of transmitting light, or a semi-transmissive conductive material such as Mg, Ag, or an alloy of Mg and Ag. A capping layer can be formed on the first electrode 282.

Subsequently, a mask 140 can be disposed on the buffer layer 130 in operation S2602. For example, as in FIG. 26F, the mask 140 can be disposed on the top buffer layer 1302 to contact the top buffer layer 1302.

Subsequently, an inorganic layer can be formed to cover the display area DA in operation 52603.

Figure 26G:
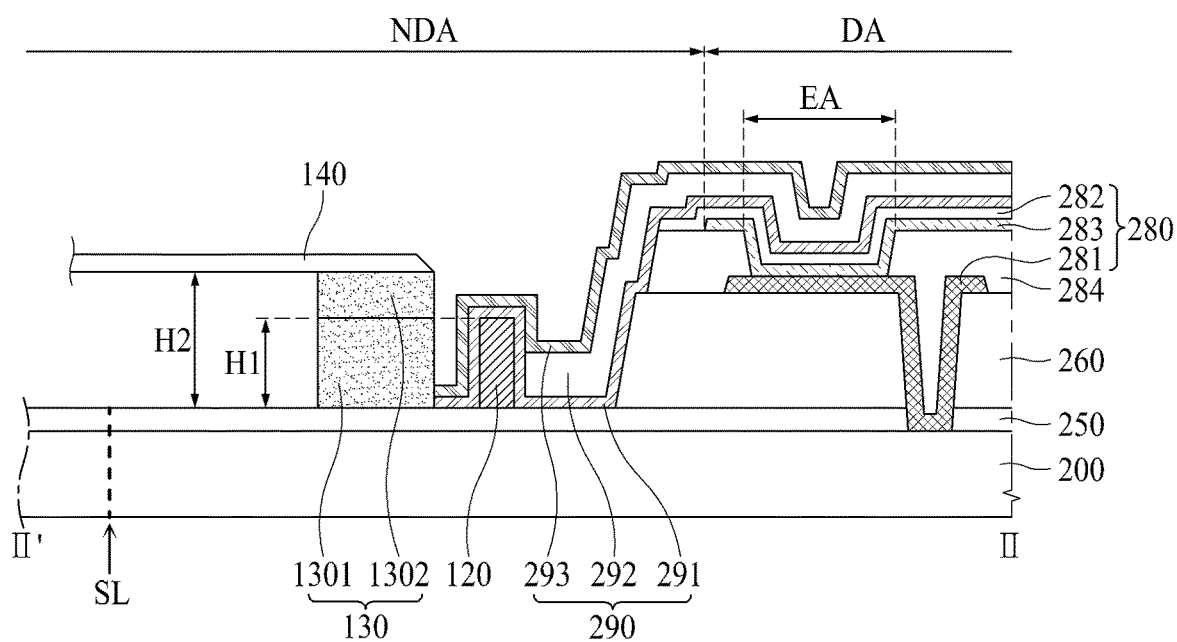

As in FIG. 26G, a first inorganic layer 291, an organic layer 292, and a second inorganic layer 293 can be formed.

For example, the first inorganic layer 291 can be formed to cover the display area DA. Also, by using a CVD process or an ALD process, the first inorganic layer 291 can be formed in a region other than a region where the mask 140 is disposed. The first inorganic layer 291 can be formed of silicon nitride, aluminum nitride, zirconium nitride, titanium nitride, hafnium nitride, tantalum nitride, silicon oxide, aluminum oxide, or titanium oxide, but are not limited thereto.

Subsequently, the organic layer 292 can be formed to cover the first inorganic layer 291 without covering the dam 120. The organic layer 292 can be formed of an organic material (for example, acryl resin, epoxy resin, phenolic resin, polyamide resin, or polyimide resin) capable of transmitting 99% or more of light emitted from the light emitting layer 283, but is not limited thereto.

Subsequently, the second inorganic layer 293 can be formed to cover the organic layer 292. In this case, by using a CVD process or an ALD process, the second inorganic layer 293 can be formed in a region other than the region where the mask 140 is disposed. The second inorganic layer 293 can be formed of silicon nitride, aluminum nitride, zirconium nitride, titanium nitride, hafnium nitride, tantalum nitride, silicon oxide, aluminum oxide, or titanium oxide, but are not limited thereto.

As in FIG. 26G, the organic layer 292 and the second inorganic layer 293 are illustrated as being formed on the first inorganic layer 291, but are not limited thereto. In other embodiments, the organic layer 292 and the second inorganic layer 293 can not be formed. Also, the organic layer 292 can be formed of a double layer. A third inorganic layer can be formed between two layers of the organic layer 292 formed of a double layer.

Figure 26H:
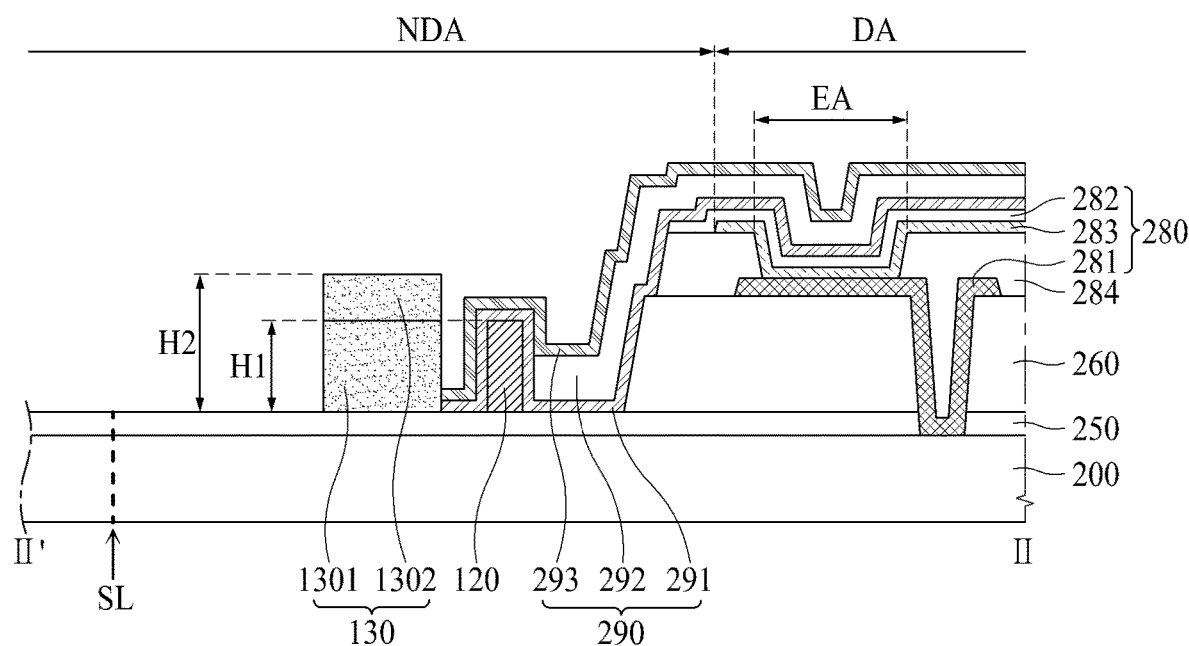

Subsequently, the mask 140 can be removed in operation 52604. In FIG. 26H, a process after the mask 140 is removed is illustrated. For example, the mask 140 disposed on the top buffer layer 1302 can be removed, and then, a first substrate 111 can be bonded to a second substrate 112. In a case where a plurality of display apparatuses are manufactured by using one mother substrate, a scribing process can be performed for isolating a plurality of display panels formed on the mother substrate into a plurality of display apparatuses. A scribing line SL can be formed between adjacent display panels, and by cutting the display panels along the scribing line SL, each of the display panels can be isolated into one display apparatus.

In the present disclosure, since the first inorganic layer 291 and the second inorganic layer 293 are not formed on the scribing line SL by the buffer layer 130, a crack is prevented from occurring in the first inorganic layer 291 and the second inorganic layer 293 in the scribing process. Accordingly, the light emitting device 280 is prevented from being deteriorated.

Figure 27:
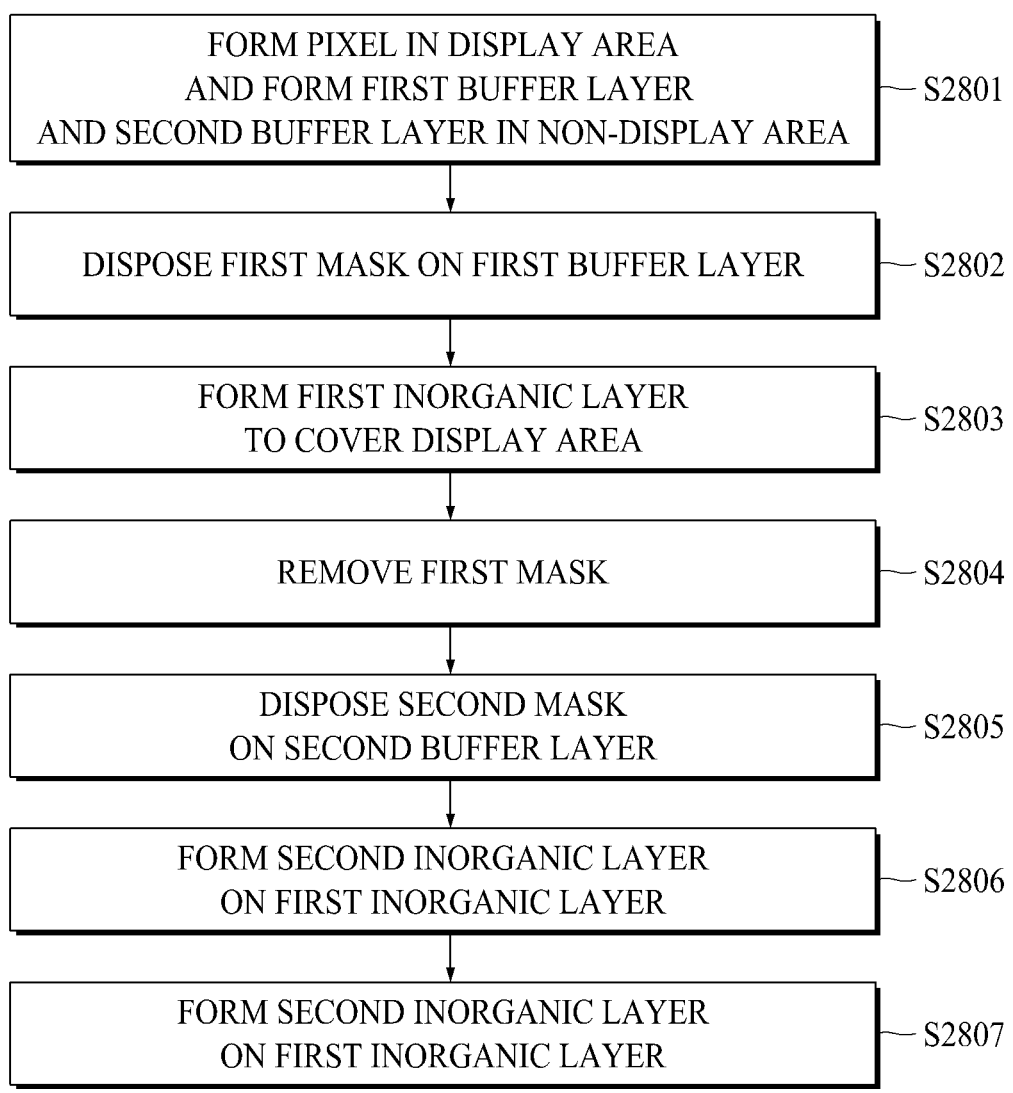
FIG. 27 is a flowchart for describing a method of manufacturing a display apparatus according to a second embodiment of the present disclosure.

FIG. 27 is a flowchart for describing a method of manufacturing a display apparatus according to a second embodiment of the present disclosure, and FIGS. 28A to 28L are cross-sectional views for describing the method of manufacturing the display apparatus according to the second embodiment of the present disclosure.

First, a pixel P can be formed in a display area DA, and a first buffer layer 132 and a second buffer layer 134 can be formed in a non-display area NDA in operation 52801.

Figure 28A:
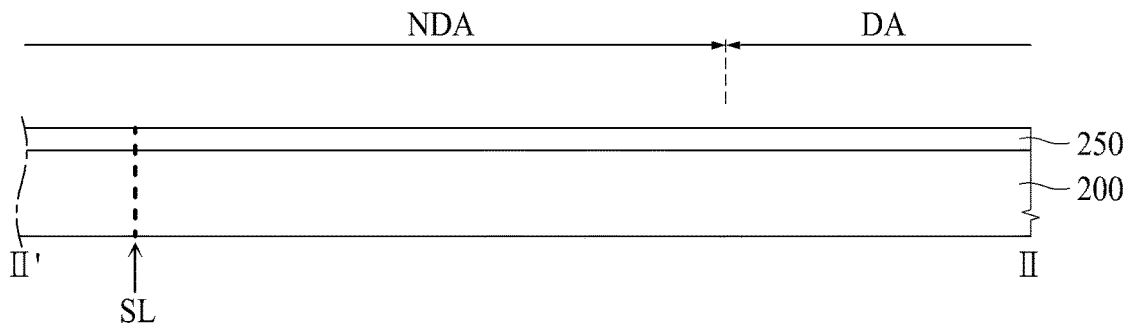
FIGS. 28A to 28L are cross-sectional views for describing the method of manufacturing the display apparatus according to the second embodiment of the present disclosure.

For example, as in FIG. 28A, a passivation layer 250 can be formed on a TFT substrate 200. The passivation layer 250 can act as an insulation layer. The passivation layer 250 can be formed of an inorganic layer, and for example, can be formed of SiOx, SiNx, or a multilayer thereof. However, the present embodiment is not limited thereto.

Figure 28B:
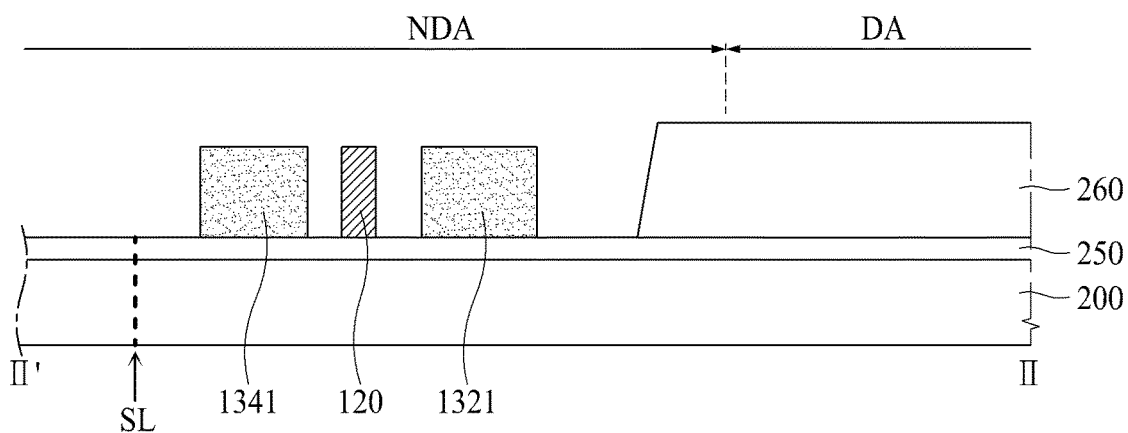

Moreover, as in FIG. 28B, a planarization layer 260, a dam 120, a first bottom buffer layer 1321, and a second bottom buffer layer 1341 can be formed. For example, the planarization layer 260, the dam 120, the first bottom buffer layer 1321, and the second bottom buffer layer 1341 can be formed on the passivation layer 250. Also, the dam 120 can be formed between the first bottom buffer layer 1321 and the second bottom buffer layer 1341 in the non-display area NDA. The first bottom buffer layer 1321 can be formed between the dam 120 and the planarization layer 260 in the non-display area NDA. The second bottom buffer layer 1341 can be formed outside the dam 120 in the non-display area NDA.

The planarization layer 260, the dam 120, the first bottom buffer layer 1321, and the second bottom buffer layer 1341 can each be formed of an organic layer such as acryl resin, epoxy resin, phenolic resin, polyamide resin, or polyimide resin, but is not limited thereto.

In FIG. 28B, the dam 120 is illustrated as being formed, but is not limited thereto. In other embodiments, the dam 120 can not be formed.

In FIG. 28B, the dam 120 is illustrated as being formed simultaneously with the planarization layer 260, but is not limited thereto. In other embodiments, the dam 120 can be formed simultaneously with the passivation layer 250 or a bank 284 which is to be formed later.

Figure 28C:
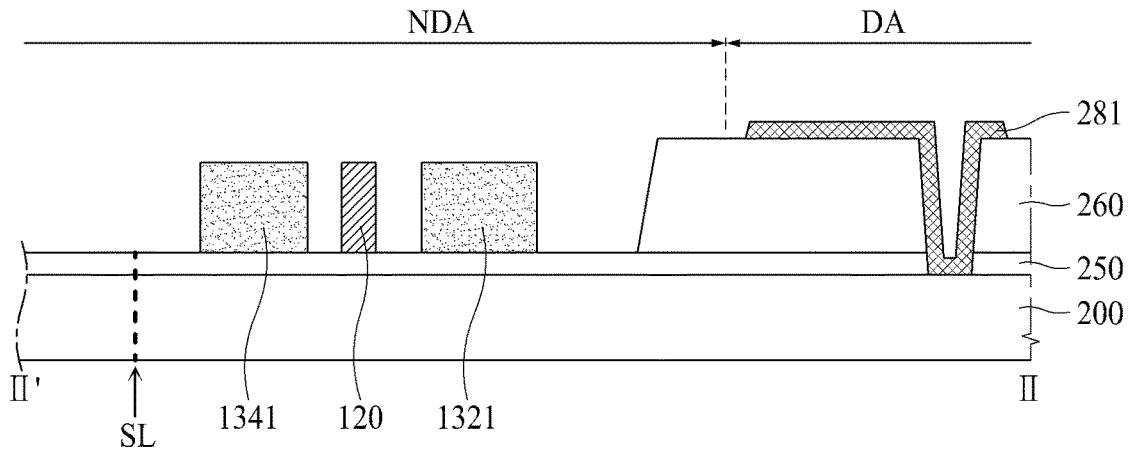

As in FIG. 28C, a contact hole CH3 which passes through the passivation layer 250 and the planarization layer 260 to expose a source or drain electrode 224 of a TFT 210 can be formed, and a second electrode 281 can be formed. The second electrode 281 can be connected to the drain electrode 214 of a corresponding TFT 210 through. The second electrode 281 can be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy can be an alloy of Ag, Pd, and Cu.

Figure 28D:
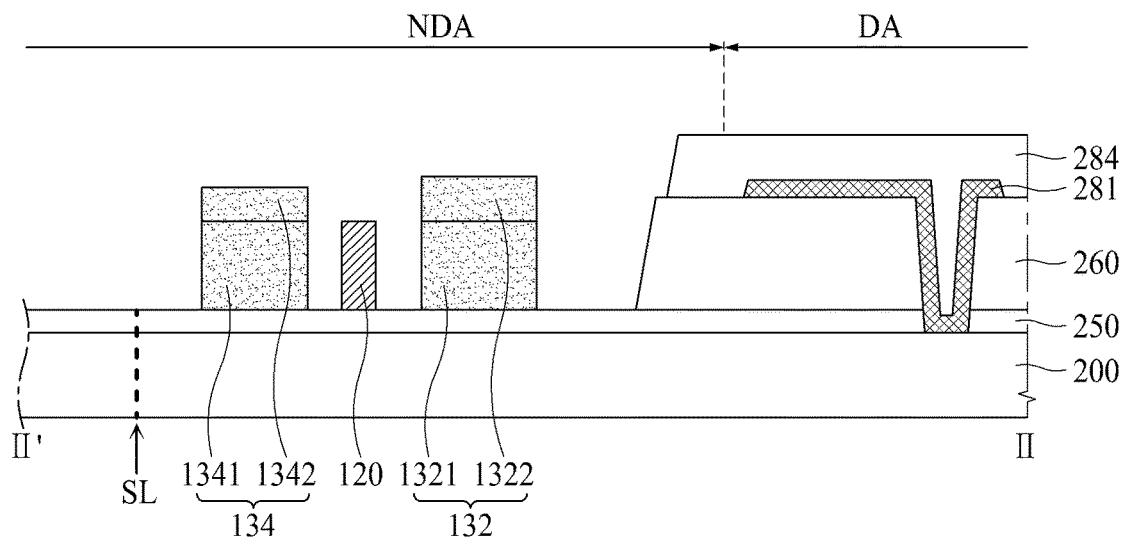

As in FIG. 28D, the bank 284, a first top buffer layer 1322, and a second top buffer layer 1342 can be formed. For example, the bank 284 can be formed on the planarization layer 260 to cover an edge of the second electrode 281, for dividing a plurality of emissive areas EA. Also, the first top buffer layer 1322 can be formed on the first bottom buffer layer 1322, and the second top buffer layer 1342 can be formed on the second bottom buffer layer 1342.

The bank 284, the first top buffer layer 1322, and the second top buffer layer 1342 can each be formed of an organic layer such as acryl resin, epoxy resin, phenolic resin, polyamide resin, or polyimide resin, but are not limited thereto.

Figure 28E:
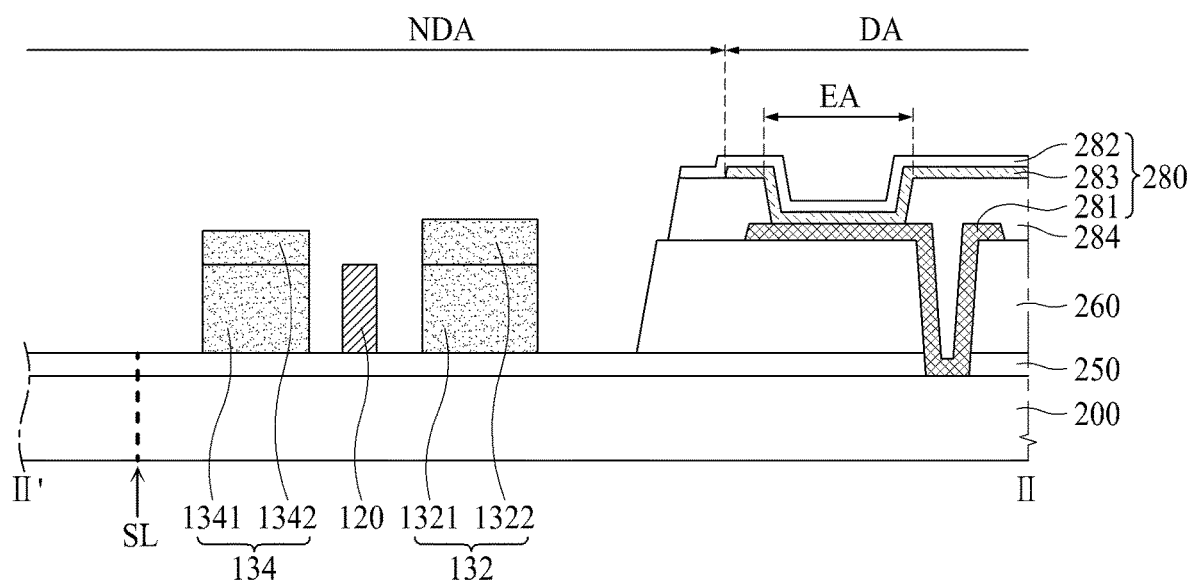
Figure 28F:
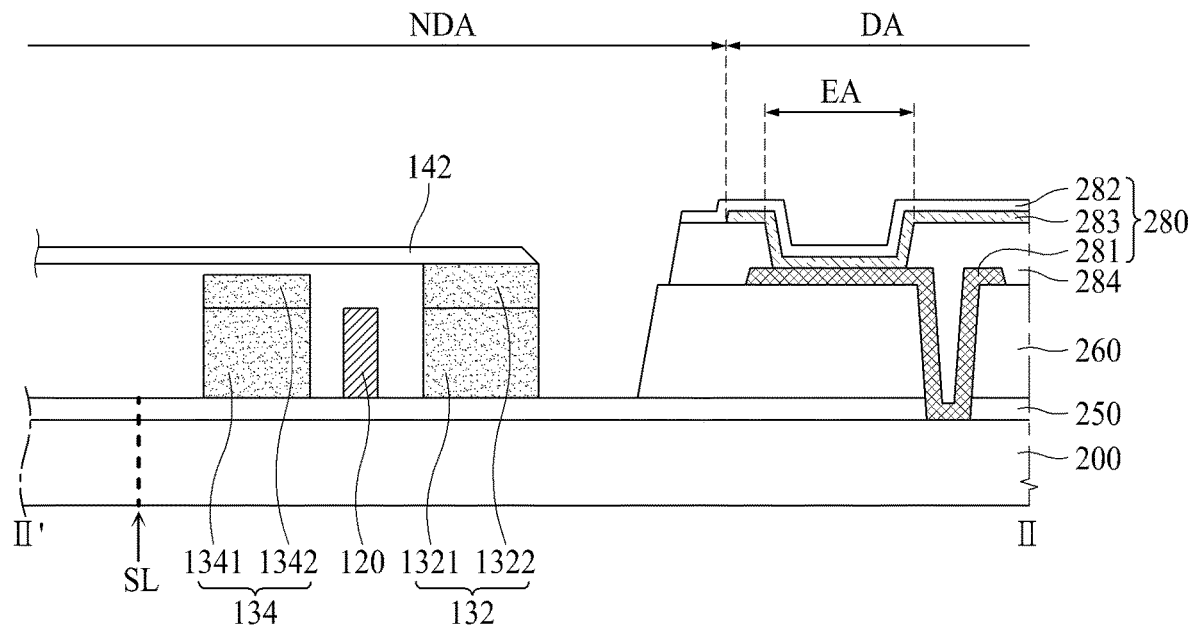

As in FIG. 28E, a light emitting layer 283 and a first electrode 282 can be formed. For example, the light emitting layer 283 can be formed on the second electrode 281 and the bank 284. Subsequently, the first electrode 282 can be formed on the light emitting layer 283. The first electrode 282 can be formed of a transparent conductive material (or TCO), such as ITO or IZO capable of transmitting light, or a semi-transmissive conductive material such as Mg, Ag, or an alloy of Mg and Ag. A capping layer can be formed on the first electrode 282.

Subsequently, a first mask 142 can be disposed on the first buffer layer 132 in operation S2802. For example, as in FIG. 28F, the first mask 142 can be disposed on the first top buffer layer 1322 to contact the first top buffer layer 1322.

Subsequently, a first inorganic layer 291 can be formed to cover the display area DA in operation S2803.

Figure 28G:
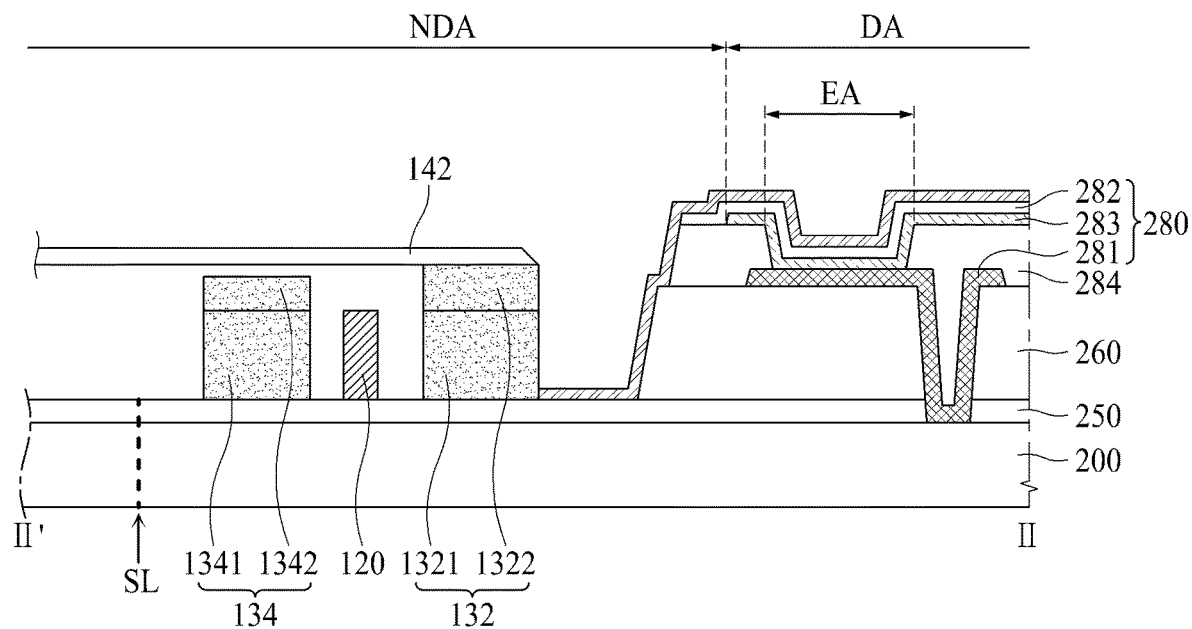
Figure 28H:
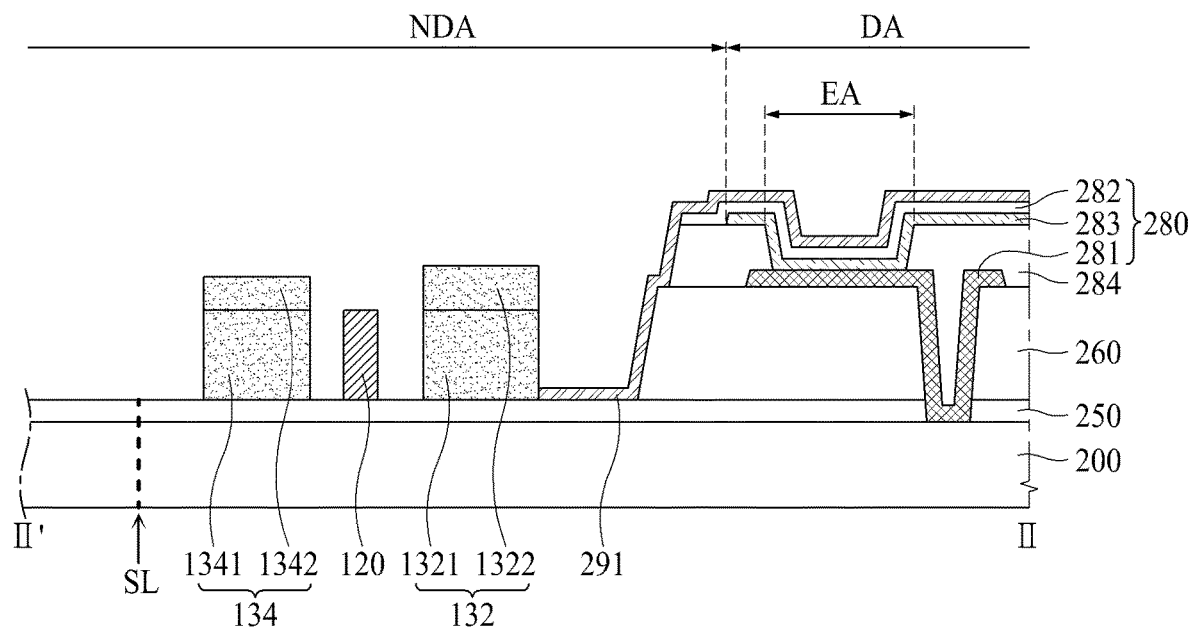

As in FIG. 28G, the first inorganic layer 291 can be formed. For example, the first inorganic layer 291 can be formed to cover the display area DA. Also, by using a CVD process or an ALD process, the first inorganic layer 291 can be formed in a region other than a region where the first mask 140 is disposed. The first inorganic layer 291 can be formed of silicon nitride, aluminum nitride, zirconium nitride, titanium nitride, hafnium nitride, tantalum nitride, silicon oxide, aluminum oxide, or titanium oxide, but are not limited thereto.

Subsequently, the first mask 142 can be removed in operation S2804. For example, as in FIG. 28H, the first mask 142 disposed on the first buffer layer 132 can be removed. Also, as in FIG. 28I, an organic layer 292 can be formed to cover the first inorganic layer 291 without covering the dam 120. The organic layer 292 can be formed of an organic material (for example, acryl resin, epoxy resin, phenolic resin, polyamide resin, or polyimide resin) capable of transmitting 99% or more of light emitted from a light emitting layer 283, but is not limited thereto.

Figure 28I:
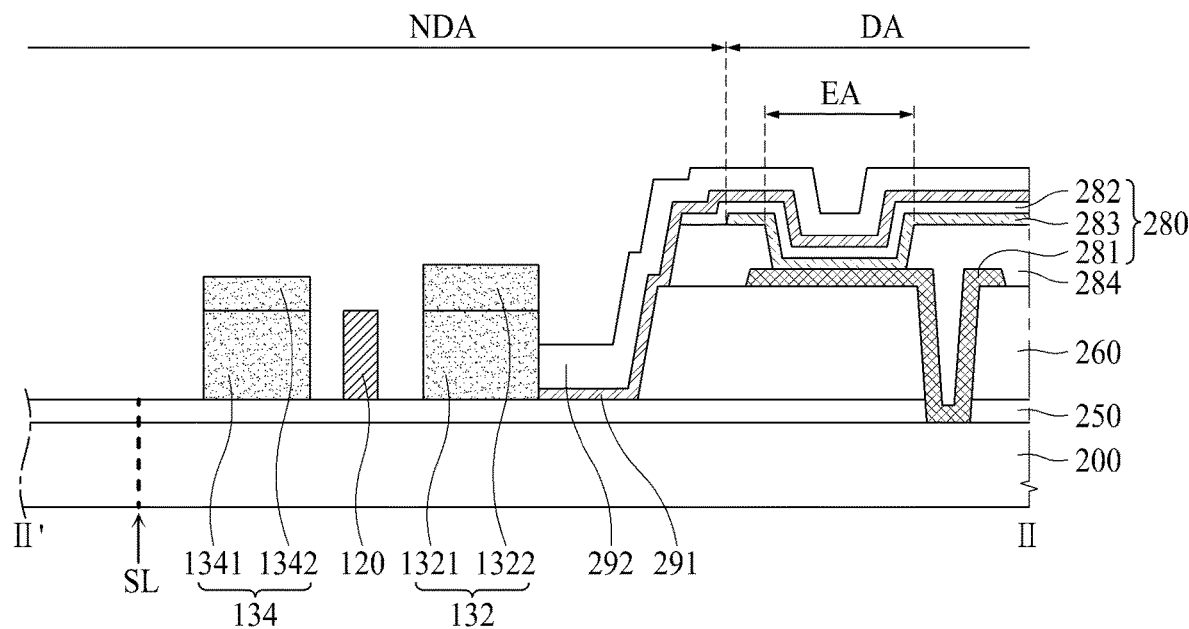
Figure 28J:
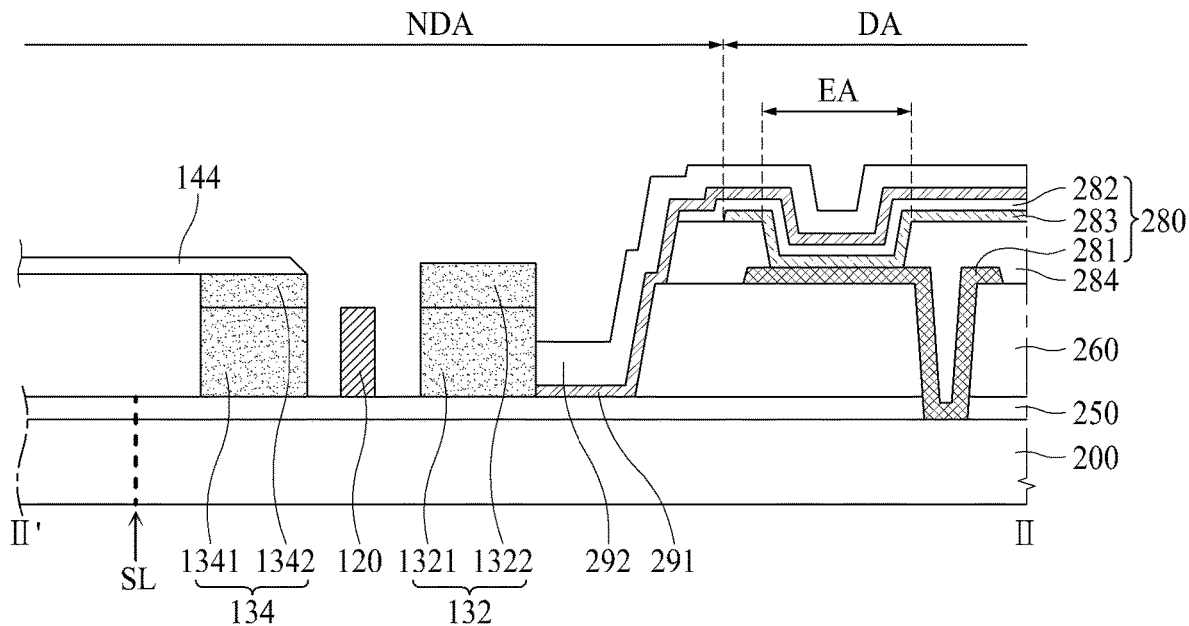
Figure 28K:
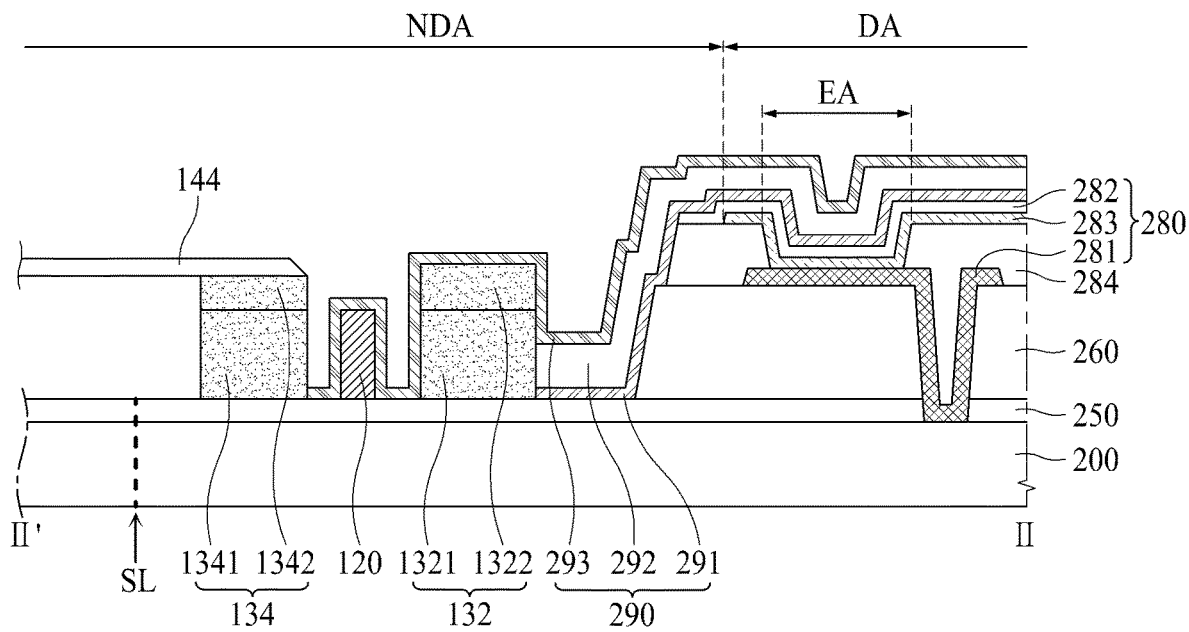
Figure 28L:
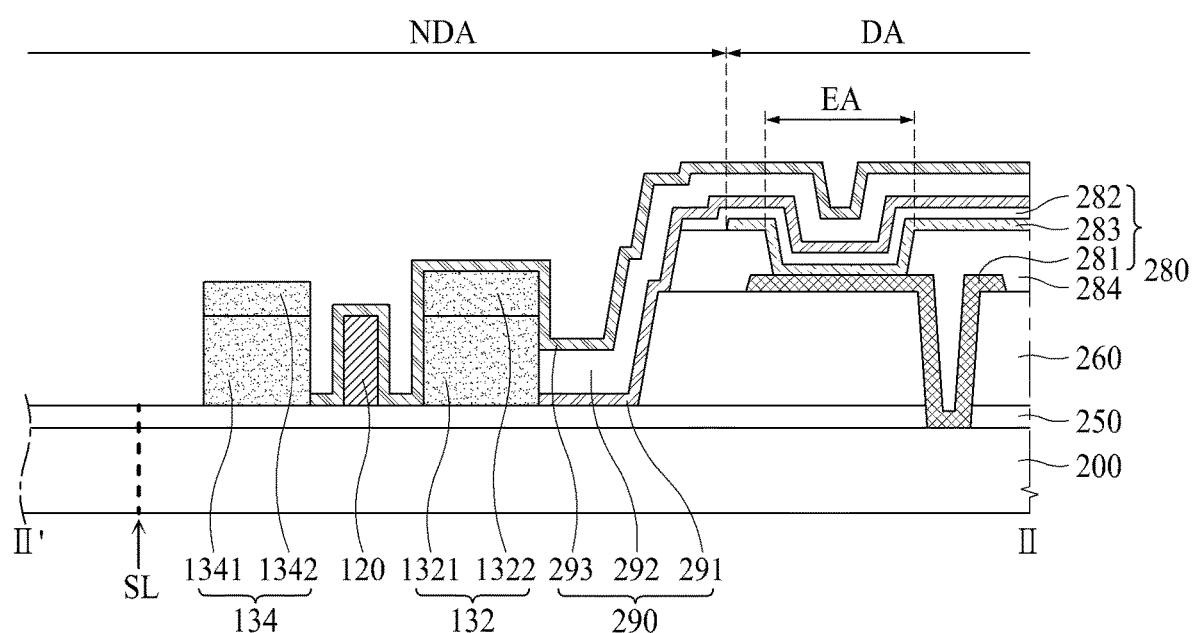

In FIG. 28I, the organic layer 292 is illustrated as being formed on the first inorganic layer 291, but is not limited thereto. In other embodiments, the organic layer 292 can not be formed.

Subsequently, a second mask 144 can be disposed on the second buffer layer 134 in operation S2805. For example, as in FIG. 28J, the second mask 144 can be disposed on the second top buffer layer 1342 to contact the second top buffer layer 1342. Also, the second mask 144 can be less in area than the first mask 142 so that the second inorganic layer 293 is formed wider than the first inorganic layer 291.

Subsequently, a second inorganic layer 293 can be formed on the first inorganic layer 291 in operation S2806. For example, as in FIG. 28K, the second inorganic layer 293 can be formed to cover the organic layer 292. Also, by using a CVD process or an ALD process, the second inorganic layer 293 can be formed in a region other than the region where the second mask 144 is disposed. The second inorganic layer 293 can be formed of silicon nitride, aluminum nitride, zirconium nitride, titanium nitride, hafnium nitride, tantalum nitride, silicon oxide, aluminum oxide, or titanium oxide, but are not limited thereto.

Subsequently, the second mask 144 can be removed in operation S2807. For example, as in FIG. 28L, the second mask 144 disposed on the second buffer layer 134 can be removed. Also, a first substrate 111 can be bonded to a second substrate 112. In a case where a plurality of display apparatuses are manufactured by using one mother substrate, a scribing process can be performed for isolating a plurality of display panels formed on the mother substrate into a plurality of display apparatuses. A scribing line SL can be formed between adjacent display panels, and by cutting the display panels along the scribing line SL, each of the display panels can be isolated into one display apparatus.

Eighth Embodiment

Figure 29:
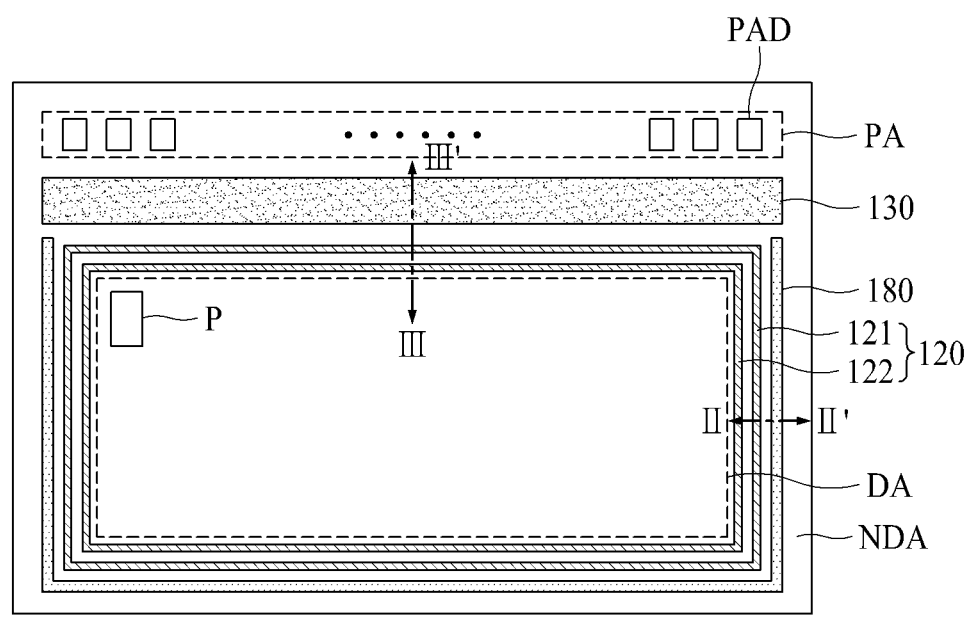
FIG. 29 is a plan view illustrating a first substrate of a display apparatus according to an eighth embodiment of the present disclosure.
Figure 30:
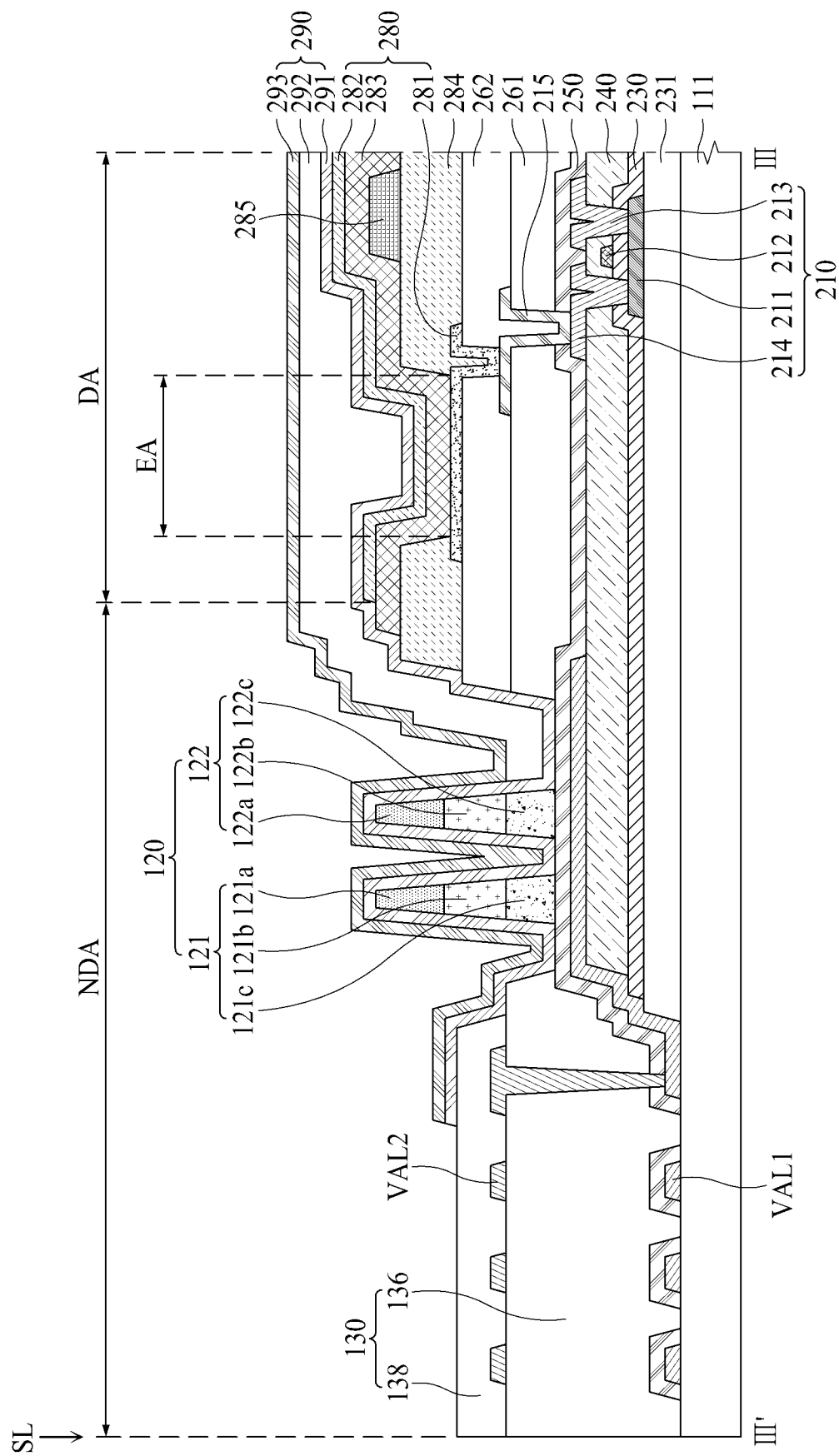
FIG. 30 is a cross-sectional view taken along line III-III' of FIG. 29.

FIG. 29 is a plan view illustrating a first substrate of a display apparatus according to an eighth embodiment of the present disclosure. FIG. 30 is a cross-sectional view taken along line III-III' of FIG. 29, and FIG. 31 is a cross-sectional view taken along line II-II' of FIG. 29.

Figure 31:
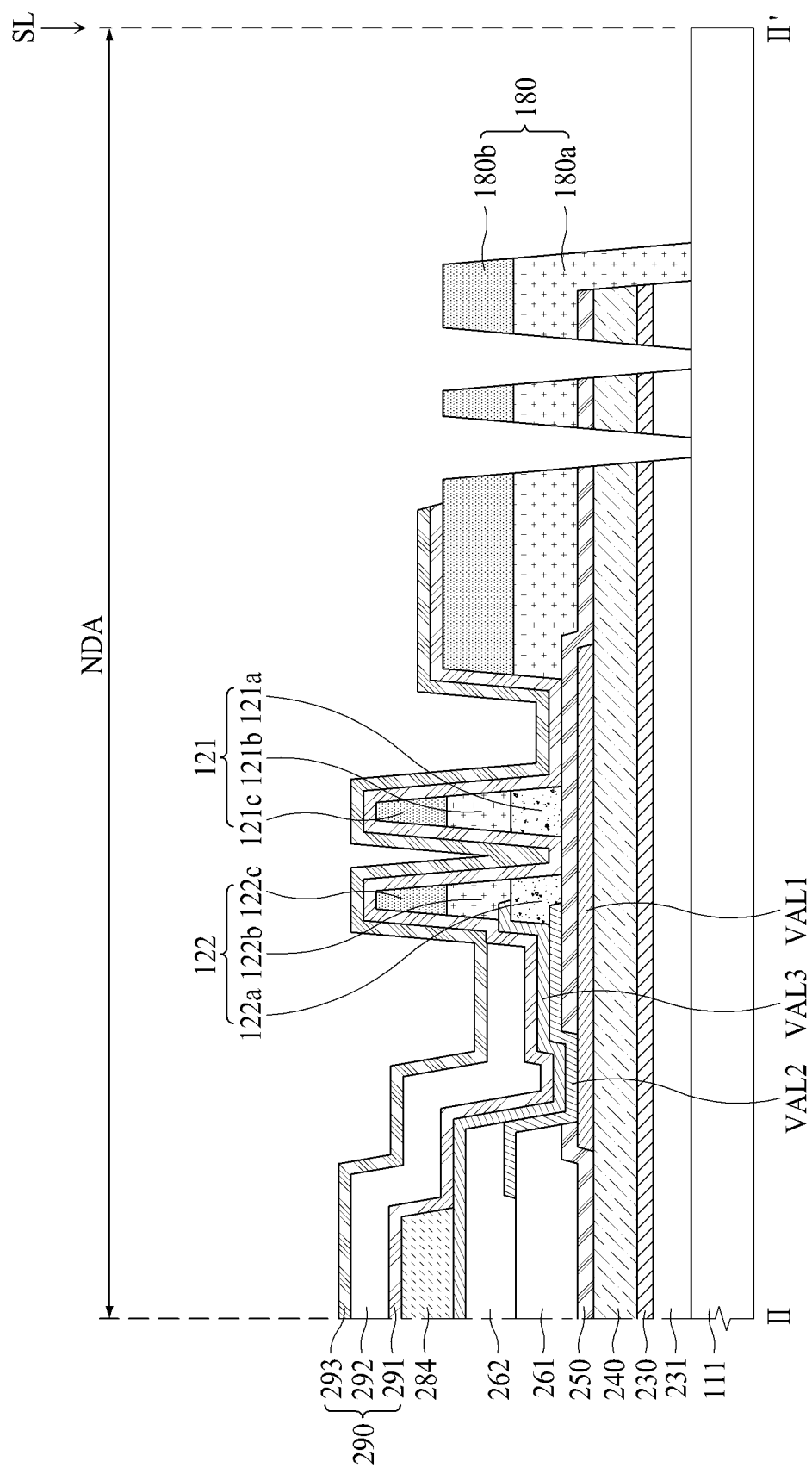
FIG. 31 is a cross-sectional view taken along line II-II' of FIG. 29.

Referring to FIGS. 29 to 31, the first substrate 111 can be divided into a display area DA and a non-display area NDA.

A plurality of pixels P for displaying an image can be provided in the display area DA. Each of the pixels P can include a TFT 210, a light emitting device 280, and an auxiliary electrode 215. The light emitting device 280 can include a second electrode 281, a light emitting layer 283, and a first electrode 282. When a gate signal is input through a corresponding gate line by using the TFT 210, each of the pixels P can supply a current to the light emitting device 280 with a data voltage of a corresponding data line. Therefore, the light emitting device 280 of each pixel P can emit light having certain brightness, based on the current.

A pad area PA where a plurality of pads are provided, a dam 120, a buffer layer 130, and an auxiliary buffer layer 180 can be provided in the non-display area NDA.

A pad area PA can be disposed in one edge of the first substrate 111. The pad area PA can include the plurality of pads, and the plurality of pads can be electrically connected to wirings of a flexible film by an anisotropic conductive film.

The dam 120 can include a first dam 122 and a second dam 121. The first dam 122 and the second dam 121 can be disposed to surround the display area DA, and at least one of the first dam 122 and the second dam 121 can block a flow of an organic layer 292. Also, the first dam 122 and the second dam 121 can be disposed between the display area DA and the pad area PA and can block a flow of the organic layer 292 so that the organic layer 292 configuring an encapsulation layer 290 of a pixel P does not penetrate into the pad area PA.

The buffer layer 130 can be disposed in the non-display area NDA and can be spaced apart from the display area DA. For example, the buffer layer 130 can be disposed between the display area DA and the pad area PA and can protect lines, connecting the pads PAD in the pad area PA and the pixels P in the display area DA, from static electricity. Also, the buffer layer 130 can support a mask device which is used to form a first inorganic layer 291 or a second inorganic layer 292 configuring the encapsulation layer 290.

The auxiliary buffer layer 180 can be disposed in the non-display area NDA and can be spaced apart from the display area DA. For example, the auxiliary buffer layer 180 can be spaced apart from the second dam 120 of the dam 120 in the non-display area NDA and can support the mask device which is used to form the first inorganic layer 291 or the second inorganic layer 292 configuring the encapsulation layer 290.

Hereinafter, a structure of the pixel P in the display area DA, the dam 120, the buffer layer 130, and the auxiliary buffer layer 180 according to the eighth embodiment of the present disclosure will be described in detail with reference to FIGS. 30 and 31.

FIG. 30 is a cross-sectional view illustrating an example of each of the dam 120 and the buffer layer in the non-display area NDA and the pixel P in the display area DA illustrated in FIG. 29.

Referring to FIG. 30, in a display area DA, a TFT 210 and a light emitting device 280 can be provided on one surface of a first substrate 111.

A buffer layer 231 can be provided on the first substrate 111, for protecting the TFT 210 from water penetrating through the first substrate 111 vulnerable to penetration of water.

The TFT 210 can include an active layer 211, a gate electrode 212, a source electrode 213, and a drain electrode 214. In FIG. 30, the TFT 210 are exemplarily illustrated as being provided as a top gate type where the gate electrode 212 is disposed on the active layer 211, but is not limited thereto. That is, the TFT 210 can be provided as a bottom gate type where the gate electrode 212 is disposed under the active layer 211 or a double gate type where the gate electrode 212 is disposed both on and under the active layer 211.

The active layer 211 can be formed on a buffer layer 231 of the first substrate 111. The active layer 211 can be formed of a silicon-based semiconductor material, an oxide-based semiconductor material, and/or the like. A light blocking layer for blocking external light incident on the active layer 211 can be formed on the first substrate 111.

A gate insulation layer 230 can be provided on the active layer 211. The gate insulation layer 230 can be formed of an inorganic layer, and for example, can be formed of SiOx, SiNx, or a multilayer thereof. However, the present embodiment is not limited thereto.

The gate electrode 212 can be provided on the gate insulation layer 230. The gate electrode 212 can be formed of a single layer or a multilayer which includes one of Mo, Al, Cr, (Au, Ti, Ni, Nd, and Cu, or an alloy thereof, but is not limited thereto.

An interlayer insulation layer 240 can be provided on the gate electrode 212. The interlayer insulation layer 240 can be formed of an inorganic layer, and for example, can be formed of SiOx, SiNx, or a multilayer thereof.

The source electrode 213 and the drain electrode 214 can be provided on the interlayer insulation layer 240. The source electrode 213 can be connected to the active layer 211 through a contact hole which passes through the gate insulation layer 220 and the interlayer insulation layer 230, and the drain electrode 214 can be connected to the active layer 211 through another contact hole which passes through the gate insulation layer 220 and the interlayer insulation layer 230. The source electrode 213 and the drain electrode 214 can each be formed of a single layer or a multilayer which includes one of Mo, Al, Cr, Au, Ti, Ni, Nd, and Cu, or an alloy thereof, but are not limited thereto.

A passivation layer 250 can be provided on the TFT 210. The passivation layer 250 can act as an insulation layer. The passivation layer 250 can be formed of an inorganic layer, and for example, can be formed of SiOx, SiNx, or a multilayer thereof.

A first planarization layer 261 for planarizing a step height caused by the TFT 210 can be provided on the passivation layer 250. The first planarization layer 261 can be formed of an organic layer such as acryl resin, epoxy resin, phenolic resin, polyamide resin, or polyimide resin, but is not limited thereto.

An auxiliary electrode 215 for electrically connecting the drain electrode 214 to the second electrode 281 can be provided on the first planarization layer 261. The auxiliary electrode 215 can be connected to the drain electrode 214 through a contact hole which passes through the first planarization layer 261 and the passivation layer 250. The auxiliary electrode 215 can be formed of a single layer or a multilayer which includes one of Mo, Al, Cr, Au, Ti, Ni, Nd, and Cu, or an alloy thereof, but is not limited thereto.

A second planarization layer 262 can be provided on the auxiliary electrode 215. The second planarization layer 262 can be formed of an organic layer such as acryl resin, epoxy resin, phenolic resin, polyamide resin, or polyimide resin, but is not limited thereto.

A light emitting device 280 and a bank 284 can be provided on the second planarization layer 262. The light emitting device 280 can include a first electrode 282, a light emitting layer 283, and a second electrode 281. The first electrode 282 can be a cathode electrode, and the second electrode 281 can be an anode electrode. An area where the first electrode 282, the light emitting layer 283, and the second electrode 281 are stacked can be defined as an emissive area EA.

The second electrode 281 can be provided on the second planarization layer 262. The second electrode 281 can be connected to the drain electrode 214 of the TFT 210 through a contact hole which passes through the second planarization layer 262. The second electrode 281 can be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy can be an alloy of silver (Ag), palladium (Pd), and copper (Cu).

The bank 284 can be provided on the second planarization layer 262 to cover an edge of the second electrode 281, for dividing a plurality of emissive areas EA. The bank 284 can be formed of an organic layer such as acryl resin, epoxy resin, phenolic resin, polyamide resin, or polyimide resin, but is not limited thereto.

A spacer 285 can be provided on the bank 284. The spacer 285 can be formed of the same material as that of the bank 284, or can be formed of a material which differs from that of the bank 284.

The light emitting layer 283 can be provided on the second electrode 281, the bank 284, and the spacer 285. The light emitting layer 283 can include a hole transporting layer, at least one light emitting layer, and an electron transporting layer. In this case, when a voltage is applied to the second electrode 281 and the first electrode 282, a hole and an electron can move to the light emitting layer through the hole transporting layer and the electron transporting layer and can be combined with each other in the light emitting layer to emit light.

The first electrode 282 can be provided on the light emitting layer 283. When an electroluminescence display apparatus is implemented in a top emission structure, the first electrode 282 can be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. A capping layer can be provided on the first electrode 282.

An encapsulation layer 290 can be provided on the light emitting device 280. The encapsulation layer 290 prevents oxygen or water from penetrating into the light emitting layer 283 and the first electrode 282. To this end, the encapsulation layer 290 can include at least one inorganic layer and at least one organic layer.

For example, the encapsulation layer 290 can include a first inorganic layer 291, an organic layer 292, and a second inorganic layer 293. In this case, the first inorganic layer 291 can be provided to cover the first electrode 282. The organic layer 292 can be provided on the first inorganic layer 291. The organic layer 292 can be provided to have a sufficient thickness, for preventing particles from penetrating into the light emitting layer 283 and the first electrode 282 via the first inorganic layer 291. The second inorganic layer 293 can be provided to cover the organic layer 292.

Referring to FIG. 30, the non-display area NDA can include the encapsulation layer 290, the dam 120, and the buffer layer 130 provided on one surface of the first substrate 111.

The encapsulation layer 290 can be provided to cover the light emitting device 280 provided in the display area DA and can prevent oxygen or water from penetrating into the light emitting device 280. The encapsulation layer 290 can include at least one inorganic layer and at least one organic layer. For example, the encapsulation layer 290 can include a first inorganic layer 291, an organic layer 292, and a second inorganic layer 293. In this case, the first inorganic layer 291 can be provided to cover the first electrode 282, the organic layer 292 can be provided on the first inorganic layer 291, and the second inorganic layer 293 can be provided to cover the organic layer 292.

The first and second inorganic layers 291 and 293 can each be formed of silicon nitride, aluminum nitride, zirconium nitride, titanium nitride, hafnium nitride, tantalum nitride, silicon oxide, aluminum oxide, or titanium oxide, but are not limited thereto. The first and second inorganic layers 291 and 293 can be deposited through a CVD process or an ALD process, but are not limited thereto.

The organic layer 292 can be formed of a transparent material, for transmitting light emitted from the light emitting layer 283. The organic layer 292 can be formed of an organic material (for example, acryl resin, epoxy resin, phenolic resin, polyamide resin, or polyimide resin) capable of transmitting 99% or more of the light emitted from the light emitting layer 283. The organic layer 292 can be formed through a vapor deposition process, a printing process, or a slit coating process, which uses an organic material, but is not limited thereto. In other embodiments, the organic layer 292 can be formed through an ink-jet process.

The dam 120 can be provided to surround an outer portion of the display area DA and can block a flow of the organic layer 292 configuring the encapsulation layer 290. The organic layer 292 configuring the encapsulation layer 290 is good in coverage performance, but is low in barrier performance. Therefore, the organic layer 292 can be encapsulated by the second inorganic layer 293. However, if the organic layer 292 flows into a region where the organic layer 292 is to be formed, water or oxygen penetrates into the inside through the organic layer 292 which is exposed without being encapsulated by the second inorganic layer 293. In order to solve such a problem, the dam 120 can block a flow of the organic layer 292, thereby preventing the organic layer 292 from being exposed at the outside of the display apparatus.

Moreover, the dam 120 can be disposed between the display area DA and the pad area PA and can block a flow of the organic layer 292 so that the organic layer 292 configuring the encapsulation layer 290 does not flow into the pad area PA. When the organic layer 292 configuring the encapsulation layer 290 penetrates into the pad area PA, an electrical contact is not normally made in a pad due to the organic layer 292, and for this reason, a driving error or a lighting test error occurs. In order to solve such a problem, the dam 120 can block a flow of the organic layer 292 configuring the encapsulation layer 290, thereby preventing the organic layer 292 from penetrating into the pad area PA.

As illustrated in FIG. 30, the dam 120 can include a first dam 122 and a second dam 121 spaced apart from the first dam 122. The first dam 122 can be provided in the non-display area NDA to surround an outer region of the display area DA, and the second dam 121 can be spaced apart from the first dam 122 and can be disposed to surround the first dam 122. The first dam 122 can block a flow of the organic layer 292 configuring the encapsulation layer 290. When the organic layer 292 flows out to an outer portion of the first dam 122, the second dam 121 spaced apart from the first dam 122 can block a flow of the organic layer 292.

The first dam 122 and the second dam 121 can each be formed of a single layer including the same material as that of at least one of the second planarization layer 262, the bank 284, and the spacer 285 of the pixel P. Also, the first dam 122 and the second dam 121 can each be formed of a multilayer including the same materials as those of two or more of the second planarization layer 262, the bank 284, and the spacer 285 of the pixel P. For example, as illustrated in FIG. 30, when each of the first dam 122 and the second dam 121 is formed of a triple layer including a plurality of lower layers 121c and 122c, a plurality of intermediate layers 121b and 122b, and a plurality of upper layers 121a and 122a, the first dam 122 and the second dam 121 can each be formed of the same materials as those of the second planarization layer 262, the bank 284, and the spacer 285 of the pixel P. The lower layers 121c and 122c of each of the first dam 122 and the second dam 121 can each be formed of the same material as that of the second planarization layer 262 of the pixel P. The intermediate layers 121b and 122b, disposed on the lower layers 121c and 122c, of each of the first dam 122 and the second dam 121 can each be formed of the same material as that of the bank 284 of the pixel P. Also, the upper layers 121a and 122a, disposed on the intermediate layers 121b and 122b, of each of the first dam 122 and the second dam 121 can each be formed of the same material as that of the spacer 285 of the pixel P. However, the present embodiment is not limited thereto. For example, the first dam 122 can be formed of the same materials as those of the bank 284 and the spacer 285 of the pixel P, and the second dam 121 can be formed of the same materials as those of the second planarization layer 262, the bank 284, and the spacer 285 of the pixel P. Alternatively, the first dam 122 can be formed of the same material as that of the bank 284 of the pixel P, and the second dam 121 can be formed of the same materials as those of the second planarization layer 262 and the bank 284 of the pixel P.

The buffer layer 130 can be disposed in the non-display area NDA and can be spaced apart from the dam 120. The buffer layer 130 can support a mask so as to maintain a certain distance between the mask and the first substrate 111 when performing a process of depositing the first inorganic layer 291 or the second inorganic layer 293. To this end, the mask can be disposed on the buffer layer 130 to contact the buffer layer 130.

As illustrated in FIGS. 29 and 30, the buffer layer 130 can be disposed between the pad area PA and the display area DA. For example, the buffer layer 130 can be formed between the second dam 121 of the dam 120 and the pad area PA to prevent the first inorganic layer 291 or the second inorganic layer 293 from being formed in the pad area PA. Also, a plurality of lines VAL1 and VAL2 which electrically connect the pad PAD in the pad area PA to the pixel P in the display area DA can be protected from static electricity by the buffer layer 130.

Referring to FIG. 30, the buffer layer 130 can include a first buffer layer 136 and a second buffer layer 138. The first buffer layer 136 and the second buffer layer 138 can be disposed between the pad area PA and the dam 120. Also, the first buffer layer 136 can be disposed on a first power auxiliary line VAL1, to which a source voltage is applied from the pad PAD in the pad area PA, and a first data link line to which a data signal is applied from the pad PAD.

Here, the first power auxiliary line VAL1 or the first data link line can be provided on the first substrate 111. Also, the first buffer layer 136 can be disposed on the first power auxiliary line VAL1 or the first data link line. The first power auxiliary line VAL1 and the first data link line can each be formed of the same material as that of the source electrode 213 and the drain electrode 214 of the pixel P. Also, the passivation layer 250 can be disposed between the first power auxiliary line VAL1, the first data link line, and the first buffer layer, and the passivation layer 250 can be provided to surround both side surfaces and a top of each of the first power auxiliary line VAL1 and the first data link line.

A second power auxiliary line VAL2 or a second data link line can be provided on the first buffer layer 136, and the second power auxiliary line VAL2 and the second data link line can each be formed of the same material as that of the auxiliary electrode 215 of the pixel P. The second power auxiliary line VAL2 can be connected to the second data link line through a contact hole passing through the first buffer layer 136.

The second buffer layer 138 can be disposed on the second power auxiliary line VAL2, to which the source voltage is applied from the pad PAD in the pad area PA, and the second data link line to which the data signal is applied from the pad PAD.

The first inorganic layer 291 and the second inorganic layer 292 configuring the encapsulation layer 290 can be provided to cover a portion of a top of the second buffer layer 138.

The first power auxiliary line VAL1, the second power auxiliary line VAL2, the first data link line, and the second data link line which electrically connect the pad PAD in the pad area PA to the pixel P in the display area DA can be protected from static electricity by the buffer layer 130. For example, the buffer layer 130 prevents arcing from occurring in a process of forming the encapsulation layer 290.

The auxiliary buffer layer 180 according to the eighth embodiment of the present disclosure will be described below in detail with reference to FIG. 31. FIG. 31 is a cross-sectional view taken along line II-II' of FIG. 29. FIG. 31 is a cross-sectional view illustrating an example of the dam 120 and the auxiliary buffer layer 180 in the display area DA of FIG. 29. Hereinafter, descriptions of the same elements as those of FIG. 30 are omitted or will be briefly given.

Referring to FIG. 31, a first dam 122 and a second dam 121 configuring a dam 120 can be disposed in a non-display area NDA. As illustrated in FIG. 29, the first dam 122 and the second dam 121 can be disposed in the non-display area NDA and can be spaced apart from a display area DA. The first dam 122 can be provided in the non-display area NDA to surround an outer region of the display area DA, and the second dam 121 can be spaced apart from the first dam 122 and can be provided to surround the first dam 122. The first dam 122 can block a flow of an organic layer 292 configuring an encapsulation layer 290. When the organic layer 292 flows out to an outer portion of the first dam 122, the second dam 121 spaced apart from the first dam 122 can block a flow of the organic layer 292.

A first power auxiliary line VAL1 can be provided on an interlayer insulation layer 240, on a side surface of the display area DA. A second power auxiliary line VAL2 can be connected to the first power auxiliary line VAL1, disposed under a passivation layer 250, through a contact hole passing through the passivation layer 250. The second power auxiliary line VAL2 can be provided to overlap a lower surface of a lower layer 122a of the first dam 122. A third power auxiliary line VAL3 provided on a second planarization layer 262 can be connected to the second power auxiliary line VAL2 through an opening which exposes the second power auxiliary line VAL2, in a region between the first dam 122 and an end of each of a first planarization layer 261 and the second planarization layer 262. The third power auxiliary line VAL3 can be provided to overlap an upper surface of the lower layer 122a of the first dam 122.

The first power auxiliary line VAL1 can be formed of the same material as that of a source electrode 213 and a drain electrode 214 of a pixel P. The second power auxiliary line VAL2 can be formed of the same material as that of an auxiliary electrode 215 of the pixel P. The third power auxiliary line VAL3 can be formed of the same material as that of a second electrode 291 of the pixel P.

An auxiliary buffer layer 180 can be disposed in the non-display area NDA and can be spaced apart from the second dam 121 of the dam 120. The auxiliary buffer layer 180 can support a mask so as to maintain a certain distance between the mask and a first substrate 111 when performing a process of depositing a first inorganic layer 291 or a second inorganic layer 293. To this end, the mask can be disposed on the auxiliary buffer layer 180 to contact the auxiliary buffer layer 180.

When the first inorganic layer 291 or the second inorganic layer 292 is deposited after the mask is disposed on the auxiliary buffer layer 180, the first inorganic layer 291 or the second inorganic layer 292 can be provided in a region other than a region where the mask is disposed. For example, since a space is not formed between the mask and the first substrate 111 by the auxiliary buffer layer 180, the first inorganic layer 291 or the second inorganic layer 293 is prevented from penetrating into the region where the mask is disposed. Therefore, in the present embodiment, since the auxiliary buffer layer 180 is disposed between the dam 120 and a scribing line SL and the mask is disposed on a second buffer layer 180b of the auxiliary buffer layer 180 to contact the second auxiliary buffer layer 180b, the first inorganic layer 291 or the second inorganic layer 293 is prevented from being formed in an outer portion (for example, the scribing line SL) of the auxiliary buffer layer 180. Therefore, the first inorganic layer 291 and the second inorganic layer 292 can be provided to partially overlap a top of the second auxiliary buffer layer 180b of the auxiliary buffer layer 180.

As illustrated in FIG. 29, the auxiliary buffer layer 180 can be disposed to surround at least three surfaces of the display area DA. For example, the auxiliary buffer layer 180 can be disposed to three surfaces of the display area DA except one surface, on which the buffer layer 130 is provided, of the display area DA. Therefore, the first dam 122 can be disposed in the non-display area NDA to surround the display area DA. Also, the second dam 121 can be spaced apart from the first dam 122 and can be disposed to surround the first dam 121. Also, the buffer layer 130 can be disposed between the second dam 121 and a pad area PA to face one of four surfaces of the display area DA. The auxiliary buffer layer 180 can be disposed to face three surfaces other than the one surface of the display area DA facing the buffer layer 130. Accordingly, three of four surfaces of the second dam 121 which is provided to surround the first dam 122 can be disposed between the display area DA and the auxiliary buffer layer 180. Also, the other one surface can be disposed between the display area DA and the buffer layer 130.

Referring to FIG. 31, the auxiliary buffer layer 180 can include a first auxiliary buffer layer 180a disposed on the passivation layer 250 and the second auxiliary buffer layer 180b disposed on the first auxiliary buffer layer 180a.

The first auxiliary buffer layer 180a can be formed of the same material as that of a bank 284 of the pixel P. Also, the second auxiliary buffer layer 180b can be formed of the same material as that of a spacer 285 of the pixel P.

Moreover, when both side surfaces of a display apparatus are bent, a crack occurs in the auxiliary buffer layer 180. In order to prevent the crack from propagating to the display area DA, a groove can be formed by patterning the first auxiliary buffer layer 180a and the second auxiliary buffer layer 180b. For example, the groove which exposes the first substrate 111 can be formed by removing the second auxiliary buffer layer 180b, the first auxiliary buffer layer 180a, the passivation layer 250, an interlayer insulation layer 240, a gate insulation layer 230, and a buffer layer 231. The groove can be referred to as a crack prevention groove.

Ninth Embodiment

Figure 32:
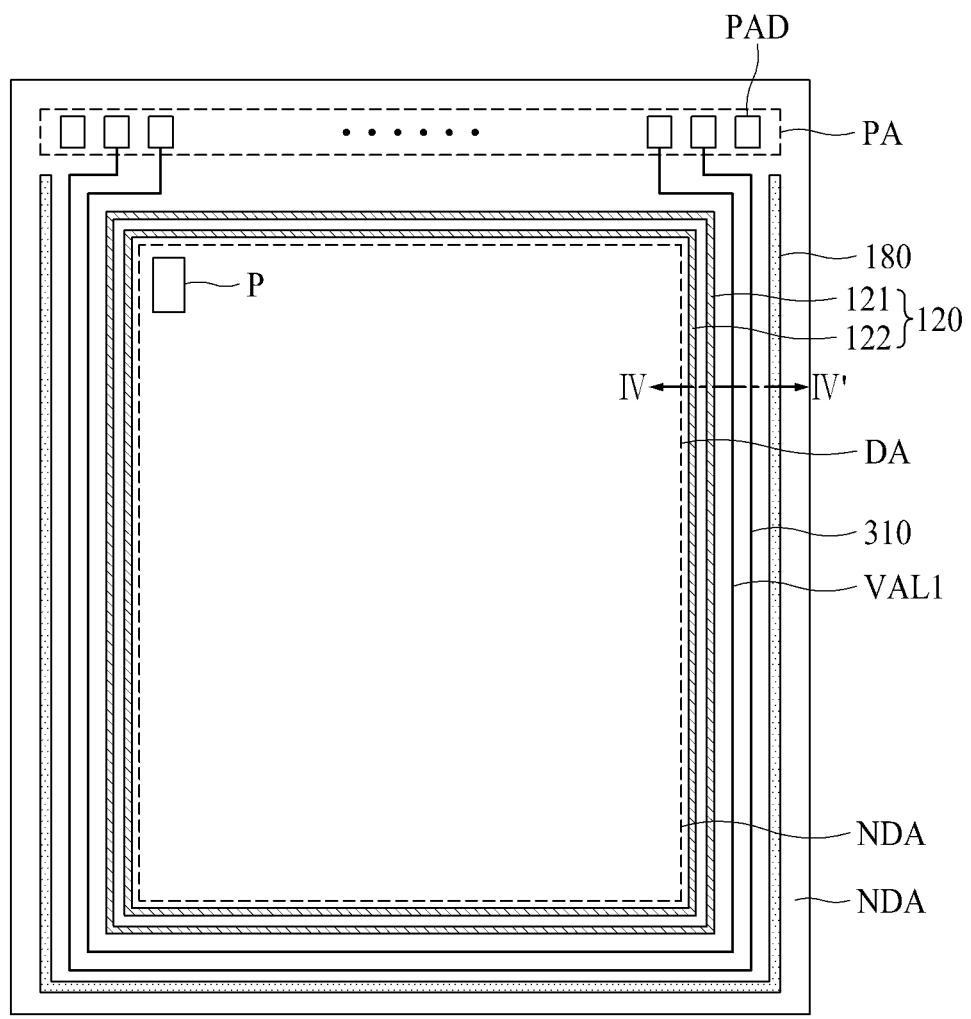
FIG. 32 is a plan view illustrating a first substrate of a display apparatus according to a ninth embodiment of the present disclosure.
Figure 33:
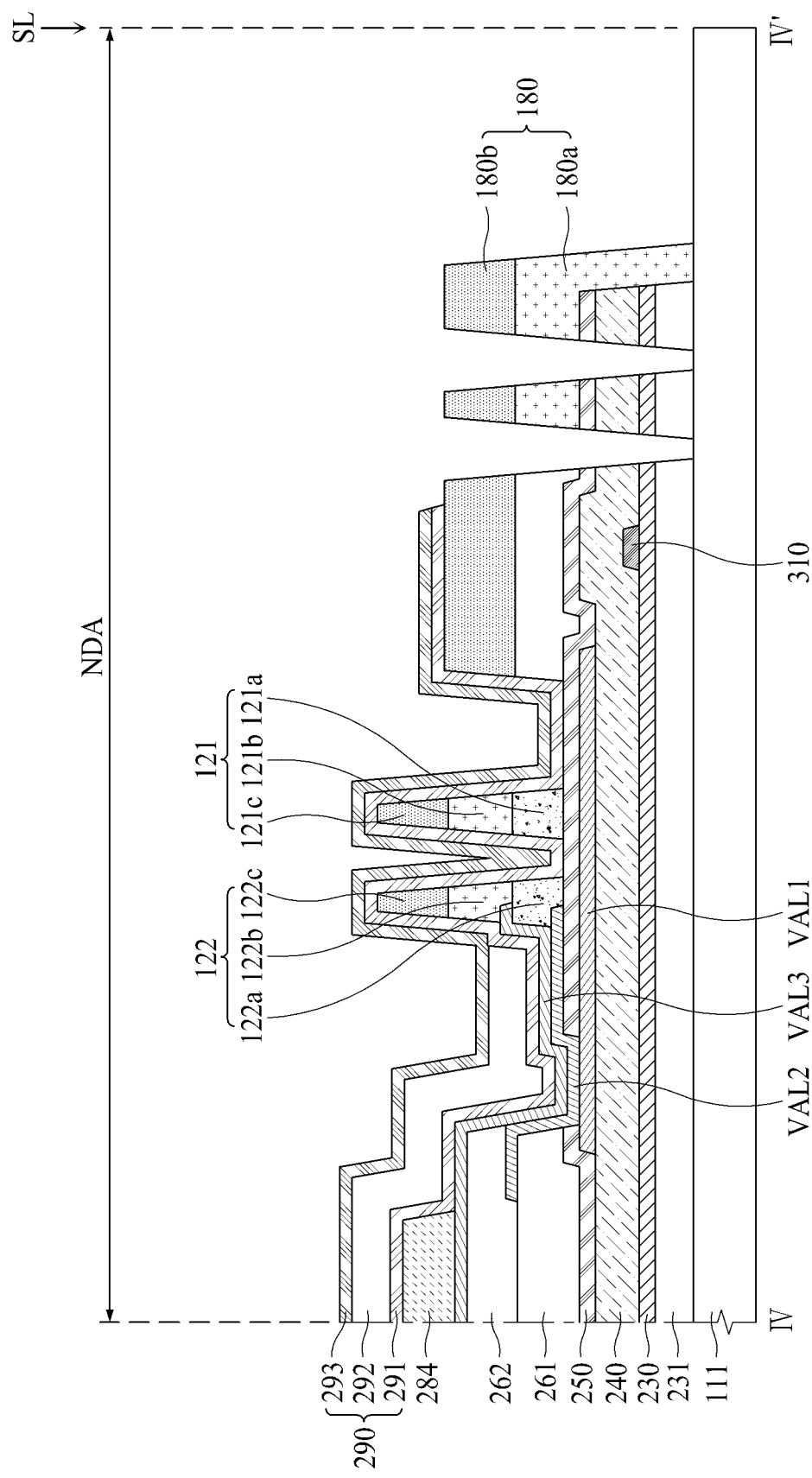
FIG. 33 is a cross-sectional view taken along line IV-IV' of FIG. 32.

FIG. 32 is a plan view illustrating a first substrate of a display apparatus according to a ninth embodiment of the present disclosure. FIG. 33 is a cross-sectional view taken along line IV-IV' of FIG. 32.

Referring to FIGS. 32 to 33, the first substrate 111 can be divided into a display area DA and a non-display area NDA.

A plurality of pixels P for displaying an image can be provided in the display area DA. Each of the pixels P can include a TFT and a light emitting device. When a gate signal is input through a corresponding gate line by using the TFT, each of the pixels P can supply a current to the light emitting device with a data voltage of a corresponding data line. Therefore, the light emitting device of each pixel P can emit light having certain brightness, based on the current.

A pad area PA where a plurality of pads PAD are provided, a dam 120, an auxiliary buffer layer 180, a first power auxiliary line VAL1, and a crack detection line 310 can be provided in the non-display area NDA.

A pad area PA can be disposed in one edge of the first substrate 111. The pad area PA can include the plurality of pads PAD, and the plurality of pads PAD can be electrically connected to a flexible film by an anisotropic conductive film.

The dam 120 can include a first dam 122 and a second dam 121. The first dam 122 and the second dam 121 can be disposed to surround the display area DA, and at least one of the first dam 122 and the second dam 121 can block a flow of an organic layer 292. Also, the first dam 122 and the second dam 121 can be disposed between the display area DA and the pad area PA and can block a flow of the organic layer 292 so that the organic layer 292 configuring an encapsulation layer 290 of a pixel P does not penetrate into the pad area PA.

The auxiliary buffer layer 180 can be disposed in the non-display area NDA and can be spaced apart from the display area DA. For example, the auxiliary buffer layer 180 can be spaced apart from the second dam 120 of the dam 120 in the non-display area NDA and can support a mask device which is used to form a first inorganic layer 291 or a second inorganic layer 292 configuring the encapsulation layer 290.

The first power auxiliary line VAL1 can be provided in the non-display area NDA and can be disposed between the display area DA and the auxiliary buffer layer 180. For example, the first power auxiliary line VAL1 can be disposed between the dam 120 and the auxiliary buffer layer 180 in the non-display area NDA. Also, the first power auxiliary line VAL1 can be electrically connected to the pad PAD in the pad area PA and can stably supply power to a display panel PNL. Also, the first power auxiliary line VAL1 provided between the dam 120 and the auxiliary buffer layer 180 can be provided to extend to a lower region of the dam 120.

The crack detection line 310 can be disposed in the non-display area NDA and can be spaced apart from the first power auxiliary line VAL1. For example, the crack detection line 310 can be disposed between the first power auxiliary line VAL1 and the auxiliary buffer layer 180 in the non-display area NDA. Also, the crack detection line 310 can be electrically connected to the pad PAD in the pad area PA. Also, when a crack occurs in the non-display area NDA, the crack detection line 310 is damaged. A resistance of the damaged crack detection line 310 can increase, and thus, the occurrence of the crack can be sensed.

Hereinafter, the dam 120, the auxiliary buffer layer 180, the first power auxiliary line VAL1, and the crack detection line 310 according to the ninth embodiment of the present disclosure will be described in detail with reference to FIG. 33.

Referring to FIG. 33, an encapsulation layer 290, a dam 120, an auxiliary buffer layer 180, a first power auxiliary line VAL1, and a crack detection line 310 provided on a first substrate 111 can be provided in a non-display area NDA.

The encapsulation layer 290 can be provided to cover the light emitting device 280 provided in the display area DA and can prevent oxygen or water from penetrating into the light emitting device 280. The encapsulation layer 290 can include at least one inorganic layer and at least one organic layer. For example, the encapsulation layer 290 can include a first inorganic layer 291, an organic layer 292, and a second inorganic layer 293. In this case, the first inorganic layer 291 can be provided to cover the first electrode 282, the organic layer 292 can be provided on the first inorganic layer 291, and the second inorganic layer 293 can be provided to cover the organic layer 292.

The first and second inorganic layers 291 and 293 can each be formed of silicon nitride, aluminum nitride, zirconium nitride, titanium nitride, hafnium nitride, tantalum nitride, silicon oxide, aluminum oxide, or titanium oxide, but are not limited thereto.

The organic layer 292 can be formed of acryl resin, epoxy resin, phenolic resin, polyamide resin, or polyimide resin, but is not limited thereto.

The dam 120 can be provided to surround an outer portion of the display area DA and can block a flow of the organic layer 292 configuring the encapsulation layer 290. The organic layer 292 configuring the encapsulation layer 290 is good in coverage performance, but is low in barrier performance. Therefore, the organic layer 292 can be encapsulated by the second inorganic layer 293. However, if the organic layer 292 flows into a region where the organic layer 292 is to be formed, water or oxygen penetrates into the inside through the organic layer 292 which is exposed without being encapsulated by the second inorganic layer 293. In order to solve such a problem, the dam 120 can block a flow of the organic layer 292, thereby preventing the organic layer 292 from being exposed at the outside of the display apparatus.

Moreover, the dam 120 can be disposed between the display area DA and the pad area PA and can block a flow of the organic layer 292 so that the organic layer 292 configuring the encapsulation layer 290 does not flow into the pad area PA. When the organic layer 292 configuring the encapsulation layer 290 penetrates into the pad area PA, an electrical contact is not normally made in a pad due to the organic layer 292, and for this reason, a driving error or a lighting test error occurs. In order to solve such a problem, the dam 120 can block a flow of the organic layer 292 configuring the encapsulation layer 290, thereby preventing the organic layer 292 from penetrating into the pad area PA.

As illustrated in FIG. 33, the dam 120 can include a first dam 122 and a second dam 121 spaced apart from the first dam 122. The first dam 122 can be provided in the non-display area NDA to surround an outer region of the display area DA, and the second dam 121 can be spaced apart from the first dam 122 and can be disposed to surround the first dam 122. The first dam 122 can block a flow of the organic layer 292 configuring the encapsulation layer 290. When the organic layer 292 flows out to an outer portion of the first dam 122, the second dam 121 spaced apart from the first dam 122 can block a flow of the organic layer 292.

The first dam 122 and the second dam 121 can each be formed of a single layer including the same material as that of at least one of a second planarization layer 262, a bank 284, and a spacer 285 of a pixel P. Also, the first dam 122 and the second dam 121 can each be formed of a multilayer including the same materials as those of two or more of the second planarization layer 262, the bank 284, and the spacer 285 of the pixel P. For example, as illustrated in FIG. 33, when each of the first dam 122 and the second dam 121 is formed of a triple layer including a plurality of lower layers 121c and 122c, a plurality of intermediate layers 121b and 122b, and a plurality of upper layers 121a and 122a, the first dam 122 and the second dam 121 can each be formed of the same materials as those of the second planarization layer 262, the bank 284, and the spacer 285 of the pixel P. The lower layers 121c and 122c of each of the first dam 122 and the second dam 121 can each be formed of the same material as that of the second planarization layer 262 of the pixel P. The intermediate layers 121b and 122b, disposed on the lower layers 121c and 122c, of each of the first dam 122 and the second dam 121 can each be formed of the same material as that of the bank 284 of the pixel P. Also, the upper layers 121a and 122a, disposed on the intermediate layers 121b and 122b, of each of the first dam 122 and the second dam 121 can each be formed of the same material as that of the spacer 285 of the pixel P. However, the present embodiment is not limited thereto. For example, the first dam 122 can be formed of the same materials as those of the bank 284 and the spacer 285 of the pixel P, and the second dam 121 can be formed of the same materials as those of the second planarization layer 262, the bank 284, and the spacer 285 of the pixel P. Alternatively, the first dam 122 can be formed of the same material as that of the bank 284 of the pixel P, and the second dam 121 can be formed of the same materials as those of the second planarization layer 262 and the bank 284 of the pixel P.

The first power auxiliary line VAL1 can be disposed between the display area DA and the auxiliary buffer layer 180. The first power auxiliary line VAL1 can be electrically connected to a pad PAD in the pad area PA and can stably supply power to a display panel PNL. Also, the first power auxiliary line VAL1 can be provided on an interlayer insulation layer 240. Also, the first power auxiliary line VAL1 can be provided under a passivation layer 250. Also, the first power auxiliary line VAL1 can be formed of the same material as that of a source electrode and a drain electrode of a TFT. Therefore, the first power auxiliary line VAL1 can be disposed under the dam 120 provided on the passivation layer 250. For example, as illustrated in FIG. 33, the first power auxiliary line VAL1 provided between the dam 120 and the auxiliary buffer layer 180 can be provided to extend to a lower region of the dam 120 provided on the passivation layer 250.

A second power auxiliary line VAL2 can be further provided on the first power auxiliary line VAL1 with the passivation layer 250 therebetween. The second power auxiliary line VAL2 can be connected to the first power auxiliary line VAL1, disposed under the passivation layer 250, through a contact hole passing through the passivation layer 250. The second power auxiliary line VAL2 can be provided to overlap a lower surface of the lower layer 122a of the first dam 122.

A third power auxiliary line VAL3 can be further provided on a second planarization layer 262. The third power auxiliary line VAL3 provided on the second planarization layer 262 can be connected to the second power auxiliary line VAL2 through an opening which exposes the second power auxiliary line VAL2, in a region between the first dam 122 and an end of each of a first planarization layer 261 and the second planarization layer 262. The third power auxiliary line VAL3 can be provided to overlap an upper surface of the lower layer 122a of the first dam 122.

The first power auxiliary line VAL1 can be formed of the same material as that of an electrode provided on the interlayer insulation layer 240 in the pixel P. The second power auxiliary line VAL2 can be formed of the same material as that of an electrode provided on the first planarization layer 261 in the pixel P. The third power auxiliary line VAL3 can be formed of the same material as that of an electrode provided on the second planarization layer 262 in the pixel P.

The auxiliary buffer layer 180 can be disposed in the non-display area NDA and can be spaced apart from the first power auxiliary line VAL1. The auxiliary buffer layer 180 can support a mask so as to maintain a certain distance between the mask and the first substrate 111 when performing a process of depositing the first inorganic layer 291 or the second inorganic layer 293. To this end, the mask can be disposed on the auxiliary buffer layer 180 to contact the auxiliary buffer layer 180.

When the first inorganic layer 291 or the second inorganic layer 292 is deposited after the mask is disposed on the auxiliary buffer layer 180, the first inorganic layer 291 or the second inorganic layer 292 can be provided in a region other than a region where the mask is disposed. For example, since a space is not formed between the mask and the first substrate 111 by the auxiliary buffer layer 180, the first inorganic layer 291 or the second inorganic layer 293 is prevented from penetrating into the region where the mask is disposed. Therefore, in the present embodiment, since the auxiliary buffer layer 180 is disposed between the dam 120 and a scribing line SL and the mask is disposed on a second buffer layer 180b of the auxiliary buffer layer 180 to contact the second auxiliary buffer layer 180b, the first inorganic layer 291 or the second inorganic layer 293 is prevented from being formed in an outer portion (for example, the scribing line SL) of the auxiliary buffer layer 180. Therefore, the first inorganic layer 291 and the second inorganic layer 292 can be provided to partially overlap a top of the second auxiliary buffer layer 180b of the auxiliary buffer layer 180.

Referring to FIG. 33, the auxiliary buffer layer 180 can include a first auxiliary buffer layer 180a disposed on the passivation layer 250 and the second auxiliary buffer layer 180b disposed on the first auxiliary buffer layer 180a.

The first auxiliary buffer layer 180a can be formed of the same material as that of the bank 284 of the pixel P. Also, the second auxiliary buffer layer 180b can be formed of the same material as that of the spacer 285 of the pixel P.

Moreover, when both side surfaces of a display apparatus are bent, a crack occurs in the auxiliary buffer layer 180. In order to prevent the crack from propagating to the display area DA, a groove can be formed by patterning the first auxiliary buffer layer 180a and the second auxiliary buffer layer 180b. For example, the groove which exposes the first substrate 111 can be formed by removing the second auxiliary buffer layer 180b, the first auxiliary buffer layer 180a, the passivation layer 250, the interlayer insulation layer 240, a gate insulation layer 230, and a buffer layer 231. The groove can be referred to as a crack prevention groove.

The crack detection line 310 can be disposed in the non-display area NDA and can be spaced apart from the first power auxiliary line VAL1. For example, the crack detection line 310 can be disposed between the first power auxiliary line VAL1 and the auxiliary buffer layer 180 in the non-display area NDA. Also, the crack detection line 310 can be electrically connected to the pad PAD in the pad area PA. Also, when both side surfaces of a display apparatus are bent, a crack occurs in the non-display area NDA. In this manner when the crack occurs in the non-display area NDA, the crack detection line 310 is damaged. A resistance of the damaged crack detection line 310 can increase, and thus, the occurrence of the crack can be sensed.

The crack detection line 310 can be provided on the gate insulation layer 230. Also, the crack detection line 310 can be formed of the same material as that of an electrode provided on the gate insulation layer 230 in the pixel P. For example, the crack detection line 310 can be formed of the same material as that of a gate electrode of a TFT. A current based on a reference voltage can flow through the crack detection line 210, and then, an output voltage can be detected. Subsequently, whether the detected output voltage is within a reference voltage range can be determined based on a detection result signal, thereby determining whether the display panel is damaged or not.

The auxiliary buffer layer 180 can be provided to overlap the crack detection line 310. Static electricity can occur in a process of depositing the first inorganic layer 291 or the second inorganic layer 293 configuring the encapsulation layer 290. Therefore, the damage of the crack detection line 310 caused by the static electricity occurring in the process of depositing the first inorganic layer 291 or the second inorganic layer 293 is reduced.

One or more embodiments of the present disclosure will be described below.

A display apparatus according to an embodiment of the present disclosure includes a substrate including a display area where a plurality of pixels are provided and a non-display area surrounding the display area, an encapsulation layer including an inorganic layer and an organic layer and covering the display area, a dam disposed in the non-display area to surround the display area and to block a flow of the organic layer, a pad disposed in one edge of the non-display area and spaced apart from the dam in the non-display area, an auxiliary buffer layer spaced apart from the dam and disposed in the non-display area to overlap an end of the inorganic layer, a power auxiliary line disposed between the dam and the auxiliary buffer layer and electrically connected to the pad to receive a voltage from the pad, and a crack detection line spaced apart from the power auxiliary line and electrically connected to the pad.

According to an embodiment of the present disclosure, the encapsulation layer can include a first inorganic layer covering the display area, an organic layer provided on the first inorganic layer, and a second inorganic layer covering the organic layer, and the auxiliary buffer layer can contact an end of at least one of the first inorganic layer and the second inorganic layer.

According to an embodiment of the present disclosure, the first inorganic layer and the second inorganic layer can cover a portion of a top of the auxiliary buffer layer.

According to an embodiment of the present disclosure, the auxiliary buffer layer can be disposed to overlap the crack detection line.

According to an embodiment of the present disclosure, the auxiliary buffer layer can further include a crack prevention groove.

According to an embodiment of the present disclosure, the auxiliary buffer layer can include an organic material.

According to an embodiment of the present disclosure, the auxiliary buffer layer can include a first auxiliary buffer layer and a second auxiliary buffer layer on the first auxiliary buffer layer.

According to an embodiment of the present disclosure, the first auxiliary buffer layer can include the same material as a material of a bank of a pixel, and the second auxiliary buffer layer can include the same material as a material of a spacer of the pixel.

According to an embodiment of the present disclosure, the crack detection line can include the same material as a material of a gate electrode of a pixel.

According to an embodiment of the present disclosure, the power auxiliary line can include the same material as a material of each of a source electrode and a drain electrode of a pixel.

According to an embodiment of the present disclosure, the power auxiliary line can be disposed to extend to a lower region of the dam.

A display apparatus according to an embodiment of the present disclosure, includes a substrate including a display area where a plurality of pixels are provided and a non-display area adjacent to the display area, a pad disposed in one edge of the non-display area, a dam disposed in the non-display area to surround the display area and disposed between the display area and the pad in the non-display area where the pad is disposed, an auxiliary buffer layer disposed in the non-display area and spaced apart from the dam, a power auxiliary line disposed between the display area and the auxiliary buffer layer and electrically connected to the pad, and a crack detection line provided to overlap a bottom of the auxiliary buffer layer and electrically connected to the pad.

According to an embodiment of the present disclosure, the power auxiliary line can extend to overlap the dam.

According to an embodiment of the present disclosure, the auxiliary buffer layer can be disposed on the crack detection line.

According to an embodiment of the present disclosure, the crack detection line can be spaced apart from the power auxiliary line.

According to an embodiment of the present disclosure, the crack detection line can be disposed to surround at least three surfaces of the display area.

According to an embodiment of the present disclosure, the power auxiliary line can be disposed between the display area and the crack detection line.

As described above, according to the embodiments of the present disclosure, since the buffer layer is provided between the non-display area and the scribing line and the mask is disposed on the buffer layer when depositing an inorganic layer, the inorganic layer is not provided on the scribing line. Thus, a crack is prevented from occurring in the inorganic layer in the scribing process, thereby enhancing a yield rate and reliability of the display apparatus.

Moreover, according to the embodiments of the present disclosure, since the buffer layer is provided in the non-display area, penetration of water, oxygen, and other materials via the side surface of the display apparatus is minimized, thereby enhancing the lifetime and reliability of the display apparatus.

Moreover, according to the embodiments of the present disclosure, since the buffer layer is provided higher in height than the dam, the damage of the dam is minimized when disposing the mask on the buffer layer. Accordingly, water, oxygen and other materials are prevented from being propagated to an organic layer via the damaged dam.

Moreover, according to the embodiments of the present disclosure, since the buffer layer is provided in a plurality of island type patterns, an increase in stress caused by forming of the buffer layer is minimized in the non-display area.

Moreover, according to the embodiments of the present disclosure, since the buffer layer is provided not to overlap an electrode, the damage of the electrode is minimized when disposing the mask on the buffer layer. Accordingly, any occurrence of a defect caused by the damaged electrode can be prevented.

Moreover, according to the embodiments of the present disclosure, since the first buffer layer and the second buffer layer are provided, the first inorganic layer and the second inorganic layer can be provided to have different areas, and thus, the second inorganic layer can fully cover the first inorganic layer and the organic layer, thereby preventing penetration of oxygen and water.

Moreover, according to the embodiments of the present disclosure, since the buffer layer is formed of the same material as that of at least one of the planarization layer and the bank, it is not required to add a separate manufacturing process, which simplifies the process with reduced cost.

Moreover, according to the embodiments of the present disclosure, the buffer layer can be provided on the power auxiliary line through which the source voltage is supplied to the power line, and thus, even when a lot of electric charges instantaneously concentrate on the edge of the mask in the process of depositing the first inorganic layer or the second inorganic layer, the buffer layer prevents static electricity from occurring between the mask and the power auxiliary line.

Moreover, according to the embodiments of the present disclosure, since the at least one groove exposing the passivation layer is provided on the buffer layer, water and oxygen which can flow in from the outside are prevented from being propagated to the inside.

Moreover, according to the embodiments of the present disclosure, since the second power auxiliary line is additionally provided on the first power auxiliary line by using the buffer layer, a cross-sectional area of the power auxiliary line increases, and thus, a resistance is reduced, thereby enabling the source voltage to be stably supplied.

Moreover, according to the embodiments of the present disclosure, the crack detection line can be provided in the outer region of the display panel to detect a crack which may occur in the outer region of the display panel, thereby decreasing an error rate of the display apparatus.

Moreover, according to the embodiments of the present disclosure, the organic layer can be provided to overlap the crack detection line provided in the outer region of the display panel, thereby reducing the damage of the crack detection line, which can be caused by static electricity that can be generated in the process of depositing the encapsulation layer.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
   a substrate including a display area where a plurality of pixels are provided and a non-display area surrounding the display area;
   an encapsulation layer including an inorganic layer and an organic layer and covering the display area;
   a dam disposed in the non-display area to surround the display area;
   a pad disposed in one edge of the non-display area and spaced apart from the dam in the non-display area;
   an auxiliary buffer layer spaced apart from the dam and disposed in the non-display area to overlap an end of the inorganic layer;
   a power auxiliary line disposed between the dam and the auxiliary buffer layer and electrically connected to the pad to receive a voltage from the pad; and
   a crack detection line spaced apart from the power auxiliary line and electrically connected to the pad,
   wherein the crack detection line is provided in the non-display area to detect a crack which occurs in the non-display area,
   wherein the crack detection line is configured to have a current based on a reference voltage flow through the crack detection line, an output voltage based on the current is detectable through the pad connected to crack detection line, and the crack which occurs in the non-display area is detectable based on the output voltage, and
   wherein a groove which exposes the substrate is disposed between the crack detection line and the auxiliary buffer layer, and the crack detection line is disposed between the power auxiliary line and the auxiliary buffer layer.

2. The display apparatus of claim 1, wherein the encapsulation layer comprises:
   a first inorganic layer covering the display area;
   an organic layer provided on the first inorganic layer; and
   a second inorganic layer covering the organic layer, and
   wherein the auxiliary buffer layer contacts an end of at least one of the first inorganic layer and the second inorganic layer.

3. The display apparatus of claim 2, wherein the first inorganic layer and the second inorganic layer cover a portion of a top of the auxiliary buffer layer.

4. The display apparatus of claim 1, wherein the auxiliary buffer layer is disposed to overlap the crack detection line.

5. The display apparatus of claim 1, wherein the auxiliary buffer layer further comprises the groove as a crack prevention groove.

6. The display apparatus of claim 1, wherein the auxiliary buffer layer comprises an organic material.

7. The display apparatus of claim 1, wherein the auxiliary buffer layer comprises a first auxiliary buffer layer and a second auxiliary buffer layer on the first auxiliary buffer layer.

8. The display apparatus of claim 7, wherein the first auxiliary buffer layer comprises a material that is same as a material of a bank of a pixel, and the second auxiliary buffer layer comprises a material that is same as a material of a spacer of the pixel.

9. The display apparatus of claim 1, wherein the crack detection line comprises a material that is same as a material of a gate electrode of a pixel.

10. The display apparatus of claim 1, wherein the power auxiliary line comprises a material that is same as a material of each of a source electrode and a drain electrode of a pixel.

11. The display apparatus of claim 1, wherein the power auxiliary line is disposed to extend to a lower region of the dam.

12. The display apparatus of claim 1, wherein the crack detection line is provided only in the non-display area.

13. The display apparatus of claim 1, wherein the crack detection line is not connected to a data line in the display area.

14. The display apparatus of claim 1, wherein the crack detection line is not connected to a line in the display area.

* * * * *